United States Patent
Nosho et al.

(10) Patent No.: US 10,319,635 B2
(45) Date of Patent: Jun. 11, 2019

(54) INTERCONNECT STRUCTURE CONTAINING A METAL SLILICIDE HYDROGEN DIFFUSION BARRIER AND METHOD OF MAKING THEREOF

(71) Applicant: SANDISK TECHNOLOGIES LLC, Plano, TX (US)

(72) Inventors: Yosuke Nosho, Yokkaichi (JP); Han-Min Kim, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/605,204

(22) Filed: May 25, 2017

(65) Prior Publication Data
US 2018/0342455 A1 Nov. 29, 2018

(51) Int. Cl.
*H01L 21/768* (2006.01)
*H01L 23/522* (2006.01)
(Continued)

(52) U.S. Cl.
CPC .. *H01L 21/76877* (2013.01); *H01L 21/76829* (2013.01); *H01L 21/76843* (2013.01);
(Continued)

(58) Field of Classification Search
CPC ......... H01L 28/57; H01L 28/65; H01L 29/76; H01L 27/11502; H01L 27/11507; H01L 23/528; H01L 23/5226; H01L 23/53257; H01L 27/11556; H01L 21/28518; H01L 27/11524; H01L 27/1157; H01L 21/76802; H01L 21/76877; H01L 27/11582; H01L 27/11575; H01L 23/53209; H01L 21/768; H01L 21/76829; H01L 27/11565; H01L 27/11573; H01L 23/53295; H01L 23/522; H01L 23/532; H01L 21/285
(Continued)

(56) References Cited

U.S. PATENT DOCUMENTS

| 5,747,830 A * | 5/1998 | Okita ................ G02F 1/136209 |
| | | 249/110 |
| 6,214,731 B1 | 4/2001 | Nogami et al. |

(Continued)

OTHER PUBLICATIONS

U.S. Appl. No. 15/291,640, filed Oct. 15, 2016, SanDisk Technologies LLC.

(Continued)

*Primary Examiner* — Alexander O Williams
(74) *Attorney, Agent, or Firm* — The Marbury Law Group PLLC

(57) ABSTRACT

A semiconductor structure includes a semiconductor device located over a substrate, a dielectric layer stack of at least one first dielectric material layer, a silicon nitride layer, and at least one second dielectric material layer overlying the semiconductor device, and interconnect structures including metallic lines and metallic vias and embedded within the dielectric layer stack. The interconnect structures also include a metal silicide portion that directly contacts the silicon nitride layer. A combination of the silicon nitride layer and the metal silicide portion provides a continuous hydrogen barrier structure that is vertically spaced from the top surface of the semiconductor device.

2 Claims, 49 Drawing Sheets

(51) Int. Cl.
  *H01L 23/532* (2006.01)
  *H01L 27/1157* (2017.01)
  *H01L 27/11524* (2017.01)
  *H01L 27/11556* (2017.01)
  *H01L 27/11573* (2017.01)
  *H01L 27/11575* (2017.01)
  *H01L 27/11582* (2017.01)
  *H01L 27/11565* (2017.01)

(52) U.S. Cl.
  CPC .. *H01L 21/76855* (2013.01); *H01L 21/76889* (2013.01); *H01L 23/5226* (2013.01); *H01L 23/53238* (2013.01); *H01L 23/53266* (2013.01); *H01L 23/53271* (2013.01); *H01L 27/1157* (2013.01); *H01L 27/11524* (2013.01); *H01L 27/11556* (2013.01); *H01L 27/11565* (2013.01); *H01L 27/11573* (2013.01); *H01L 27/11575* (2013.01); *H01L 27/11582* (2013.01); *H01L 23/53295* (2013.01)

(58) Field of Classification Search
  USPC ............ 257/72, 59, 296, 303, 306, 309, 757
  See application file for complete search history.

(56) References Cited

U.S. PATENT DOCUMENTS

| | | | |
|---|---|---|---|
| 6,548,844 B1* | 4/2003 | Fukuzumi | H01L 27/10894 257/296 |
| 8,822,236 B2* | 9/2014 | Lin | H01L 27/11507 257/295 |
| 8,847,302 B2 | 9/2014 | Alsmeier et al. | |
| 9,559,117 B2 | 1/2017 | Pachamuthu et al. | |
| 2004/0099893 A1* | 5/2004 | Martin | H01L 27/11502 257/295 |
| 2004/0235259 A1* | 11/2004 | Celii | H01L 27/11502 438/396 |
| 2006/0002170 A1* | 1/2006 | Kumura | G11C 11/22 257/295 |
| 2006/0284231 A1 | 12/2006 | Natsume et al. | |
| 2007/0108489 A1* | 5/2007 | Nagai | H01L 27/11502 257/295 |
| 2008/0081380 A1* | 4/2008 | Celii | H01L 27/11507 438/3 |
| 2009/0315144 A1* | 12/2009 | Wang | H01L 27/11507 257/532 |
| 2013/0308363 A1 | 11/2013 | Scheuerlein et al. | |
| 2016/0379878 A1 | 12/2016 | Anderson et al. | |

OTHER PUBLICATIONS

U.S. Appl. No. 15/418,989, filed Jan. 30, 2017, SanDisk Technologies LLC.
U.S. Appl. No. 15/434,544, filed Feb. 16, 2017, SanDisk Technologies LLC.
U.S. Appl. No. 15/458,200, filed Mar. 14, 2017, SanDisk Technologies LLC.
U.S. Appl. No. 15/458,269, filed Mar. 14, 2017, SanDisk Technologies LLC.
U.S. Appl. No. 15/458,272, filed Mar. 14, 2017, SanDisk Technologies LLC.
U.S. Appl. No. 15/483,862, filed Apr. 10, 2017, SanDisk Technologies LLC.
U.S. Appl. No. 15/581,575, filed Apr. 28, 2017, SanDisk Technologies LLC.
U.S. Appl. No. 15/593,916, filed May 12, 2017, SanDisk Technologies LLC.
International Search Report and Written Opinion of the International Searching Authority for International Patent Application No. PCT/US2018/019320, dated May 25, 2018, 13 pages.

* cited by examiner

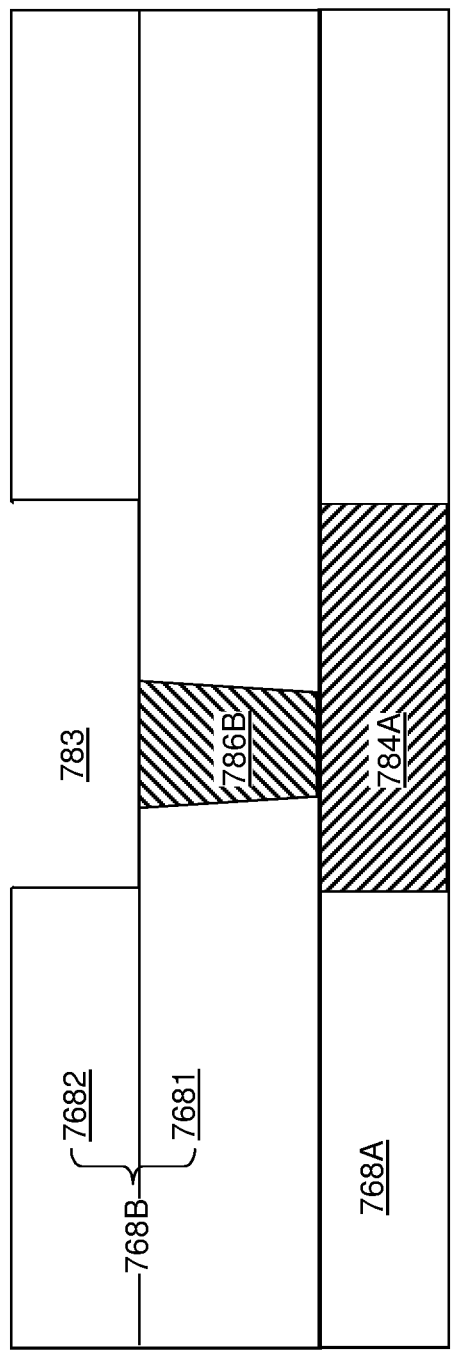

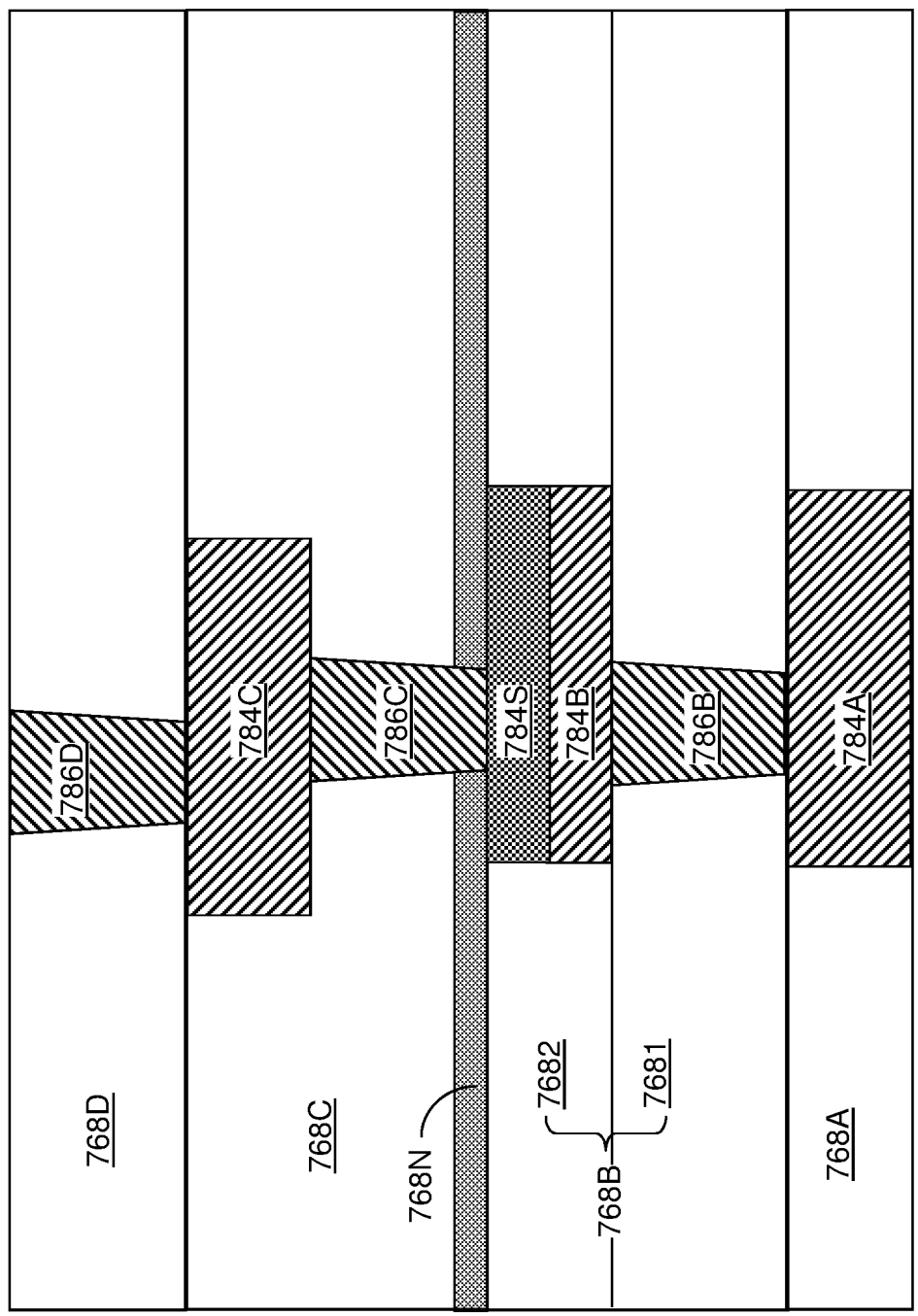

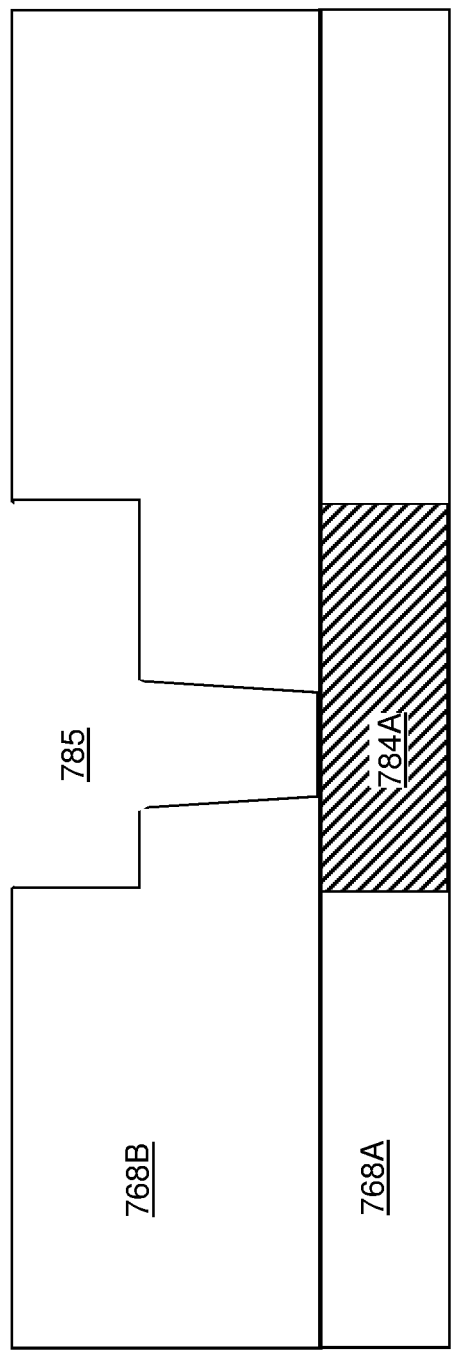

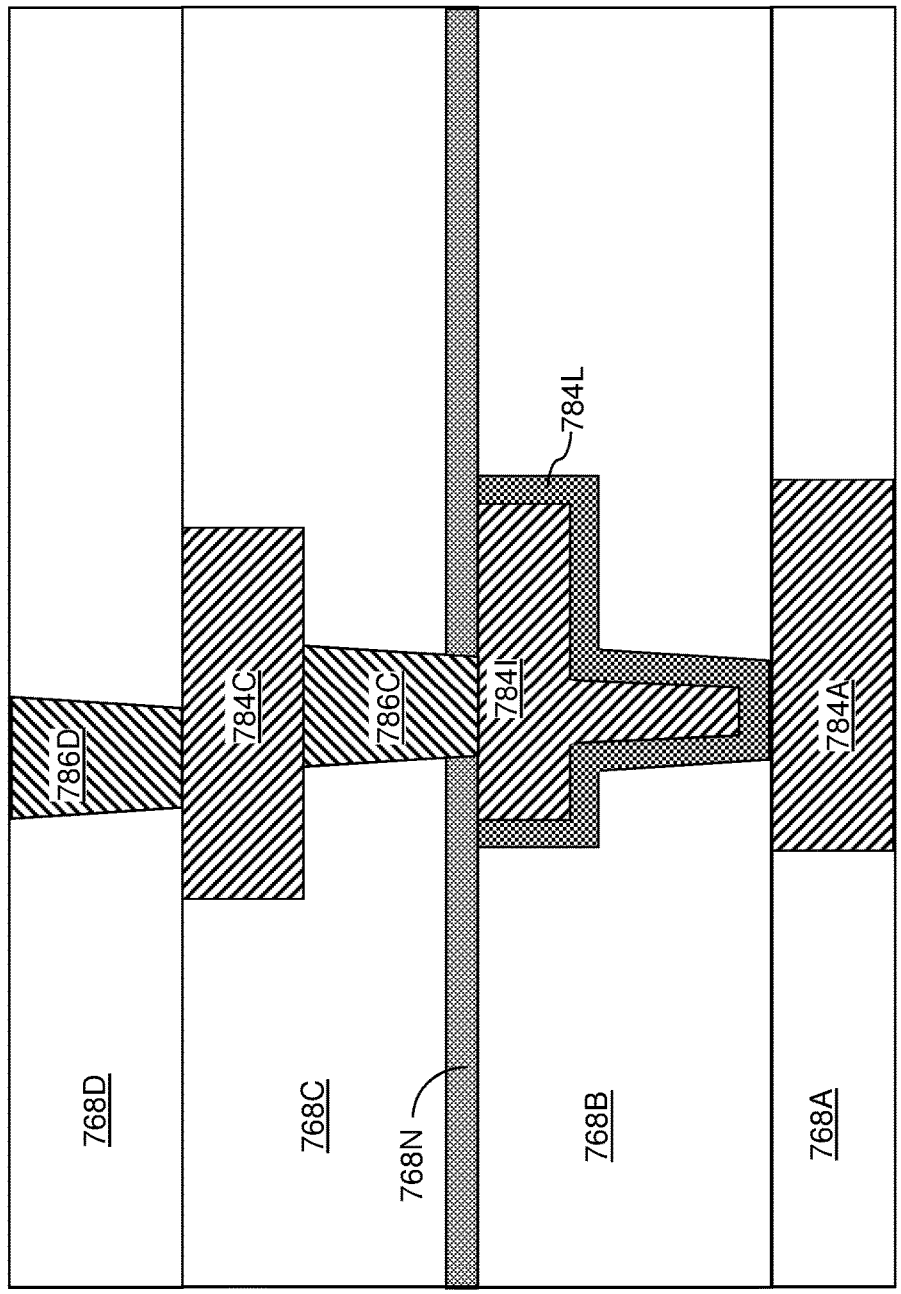

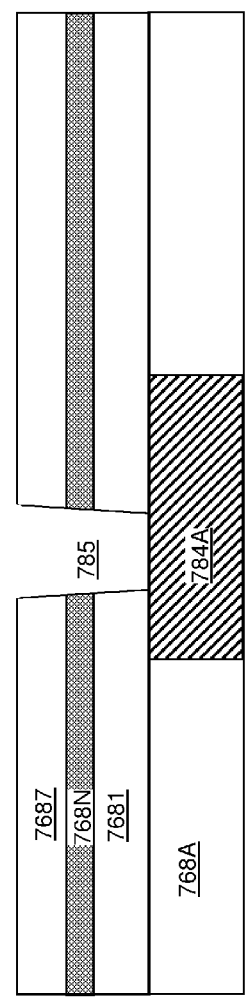

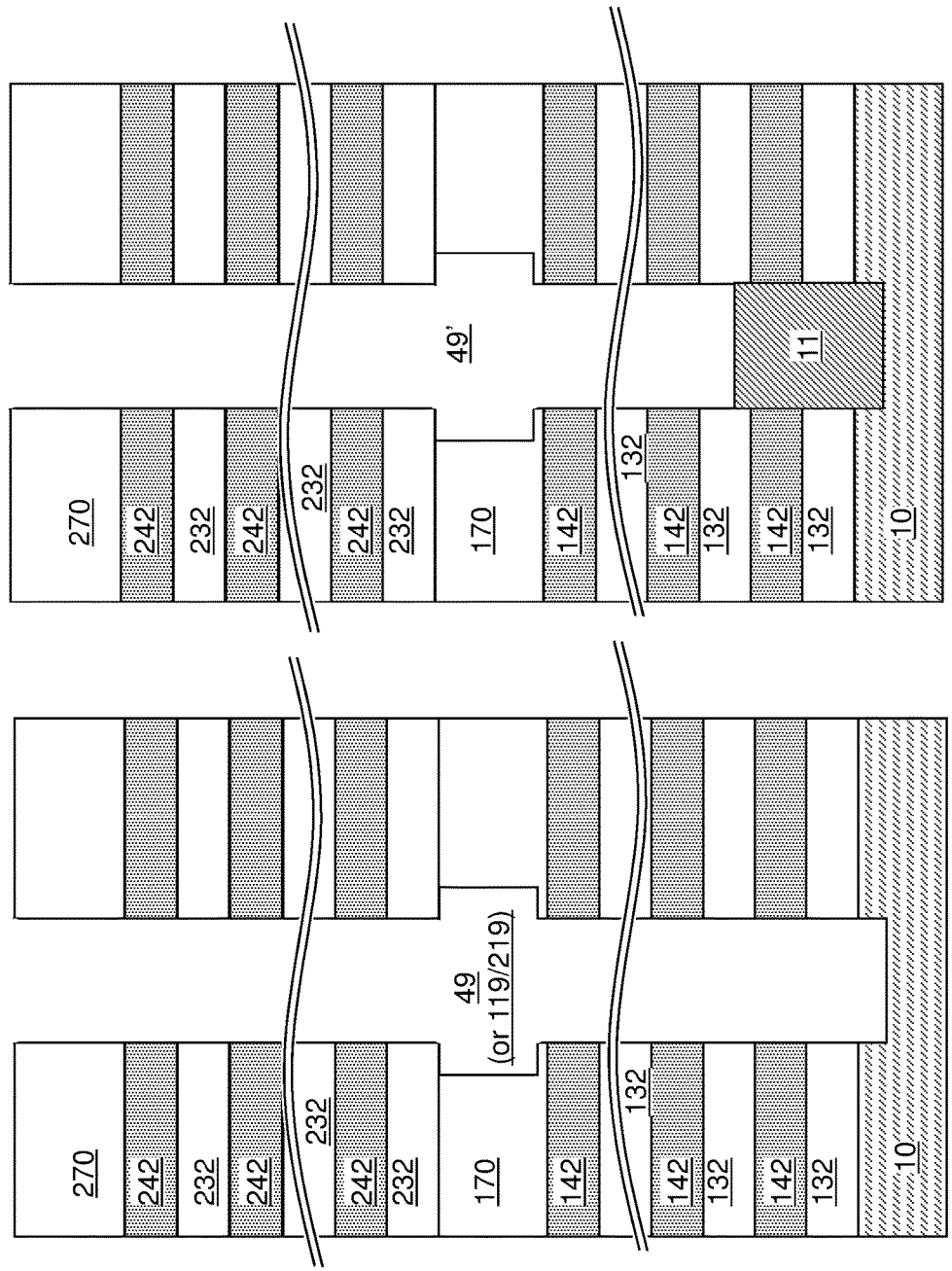

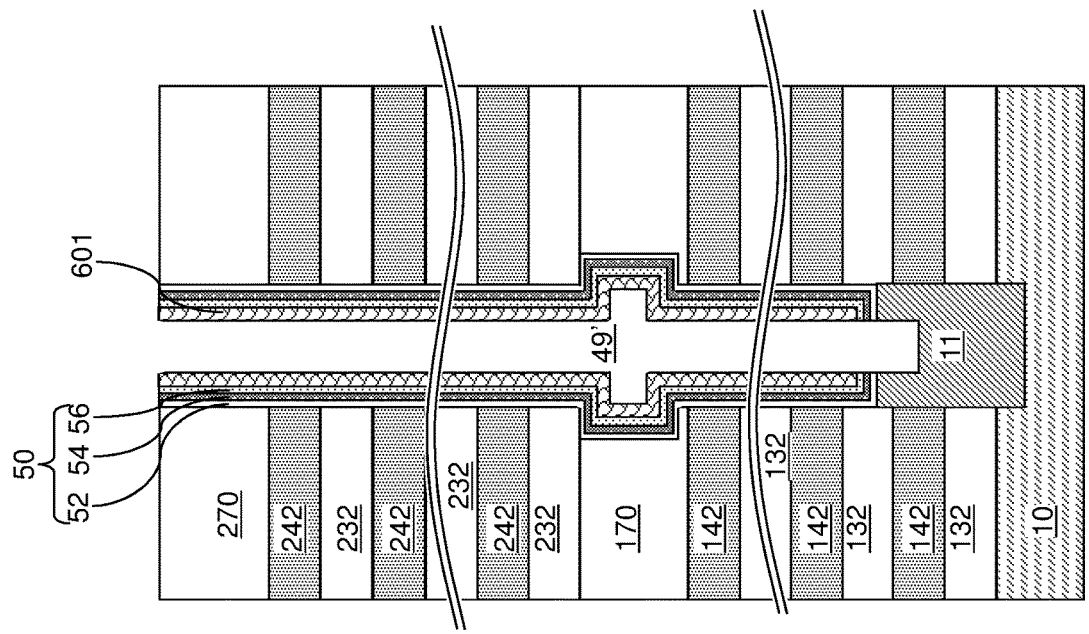
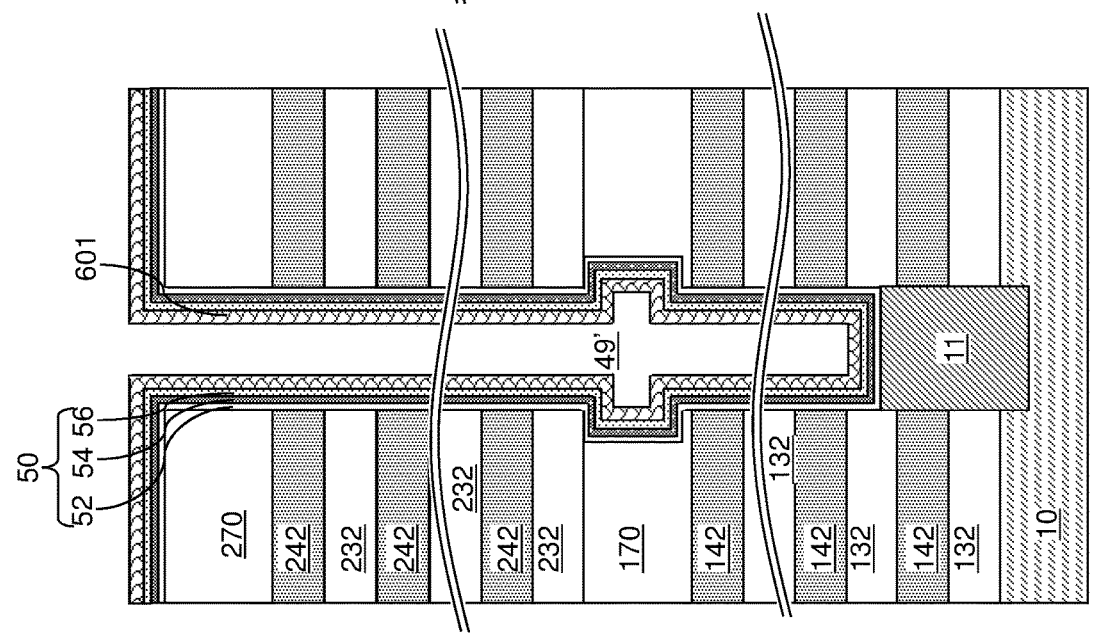

INTERCONNECT STRUCTURE CONTAINING A METAL SLILICIDE HYDROGEN DIFFUSION BARRIER AND METHOD OF MAKING THEREOF

FIELD

The present disclosure relates generally to the field of semiconductor devices and specifically to a semiconductor device employing a metal silicide hydrogen diffusion barrier and methods of making the same.

BACKGROUND

Recently, ultra high density storage devices have been proposed using a three-dimensional (3D) stacked memory stack structure sometimes referred to as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel. A memory-level assembly including the alternating stack and the memory stack structures is formed over a substrate. The electrically conductive layers can function as word lines of a 3D NAND stacked memory device, and bit lines overlying an array of memory stack structures can be connected to drain-side ends of the vertical semiconductor channels.

SUMMARY

According to an aspect of the present disclosure, a semiconductor structure includes a semiconductor device located over a substrate, a dielectric layer stack of at least one first dielectric material layer, a silicon nitride layer, and at least one second dielectric material layer overlying the semiconductor device, and interconnect structures including metallic lines and metallic vias and embedded within the dielectric layer stack. The interconnect structures also include a metal silicide portion that directly contacts the silicon nitride layer. A combination of the silicon nitride layer and the metal silicide portion provides a continuous hydrogen barrier structure that is vertically spaced from the top surface of the semiconductor device.

According to another aspect of the present disclosure a method of forming a semiconductor structure comprises forming a semiconductor device over a substrate, and forming a dielectric layer stack and interconnect structures embedded therein over the semiconductor device. The dielectric layer stack comprises at least one first dielectric material layer, a silicon nitride layer, and at least one second dielectric material layer. The interconnect structures comprise a metal silicide portion that directly contacts the silicon nitride layer. A combination of the silicon nitride layer and the metal silicide portion provides a continuous hydrogen barrier structure that is vertically spaced from the top surface of the semiconductor device.

BRIEF DESCRIPTION OF THE DRAWINGS

FIG. 2A-2D are sequential vertical cross-sectional view of a region of the exemplary structure during formation of a first exemplary hydrogen diffusion barrier structure according to an embodiment of the present disclosure.

FIGS. 4A-4D are vertical cross-sectional view of a region of the exemplary structure during formation of a third exemplary hydrogen diffusion barrier structure according to an embodiment of the present disclosure.

FIGS. 6A-6D are vertical cross-sectional view of a region of the exemplary structure during formation of a fifth exemplary hydrogen diffusion barrier structure according to an embodiment of the present disclosure.

FIGS. 7A-7C are vertical cross-sectional view of a region of the exemplary structure during formation of a sixth exemplary hydrogen diffusion barrier structure according to an embodiment of the present disclosure.

FIGS. 15A-15H are sequential vertical cross-sectional views of an inter-tier memory opening during formation of a pillar channel portion, a memory stack structure, a dielectric core, and a drain region according to an embodiment of the present disclosure.

DETAILED DESCRIPTION

Figure 1:
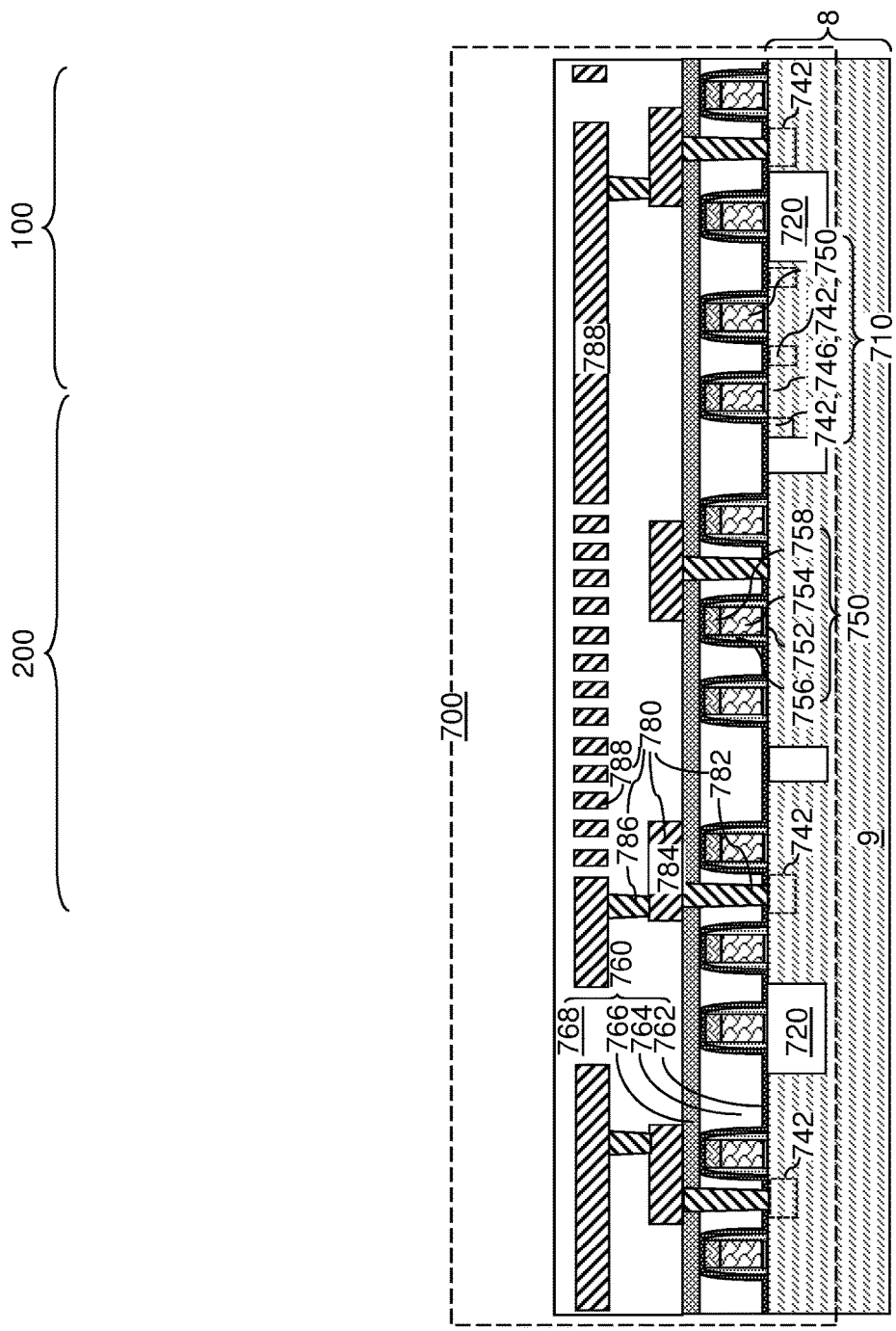
FIG. 1 is a vertical cross-sectional view of an exemplary structure after formation of semiconductor devices, at least one lower level dielectric layer, and lower level interconnect structures on a semiconductor substrate according to a first embodiment of the present disclosure.

As three-dimensional memory devices scale to smaller device dimensions, the device area for peripheral devices can take up a significant portion of the total chip area. CMOS under array architecture has been proposed to stack a three-dimensional array of memory devices over underlying peripheral devices on a substrate. Hydrogen originating from various components of the three-dimensional array (such an alternating stack of hydrogen containing silicon oxide and silicon nitride layers) can diffuse to the CMOS transistors during the high temperature annealing of the device and deleteriously affect the device performance (e.g., increase in leakage current during the off-state) of the peripheral devices underlying the three-dimensional array of memory devices. The present inventors realized that while silicon nitride layers within the dielectric materials layers between the peripheral devices and the three-dimensional array of memory devices block diffusion of hydrogen, continuous conductive paths formed by the interconnect structures between the peripheral devices and the three-dimensional array of memory devices can function as conduits for diffusion hydrogen into the peripheral devices.

Thus, embodiments of the present disclosure provide a structure and a method for blocking diffusion of hydrogen between the three-dimensional array of memory devices and the peripheral devices without disrupting the electrical continuity of the interconnect structures. The embodiments of the present disclosure is directed to a semiconductor device employing a metal silicide hydrogen diffusion barrier and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-memory-level" element refers to an element that vertically extends through a memory level.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Referring to FIG. 1, an exemplary structure according to an embodiment of the present disclosure is illustrated. The exemplary structure includes a semiconductor substrate 8, and semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746 and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

At least one dielectric layer is formed over the semiconductor devices, which is herein referred to as at least one lower level dielectric layer 760. The at least one lower level dielectric layer 760 can include, for example, a dielectric liner 762 such as a silicon nitride liner that blocks diffusion of mobile ions and/or apply appropriate stress to underlying structures, a planarization dielectric layer 764 that is employed to provide a planar surface that is coplanar with the topmost surface of the dielectric liner 762 or the topmost surfaces of the gate structures 750, an optional planar liner 766, and at least one lower level interconnect dielectric layer 768 that collectively functions as a matrix for lower level interconnect structures 780 that provide electrical wiring among the various nodes of the semiconductor devices and landing pads for through-memory-level via structures to be subsequently formed. The lower level interconnect structures 780 can include various device contact via structures 782 (e.g., source and drain electrodes which contact the respective source and drain nodes of the device or gate electrode contacts), lower level metal lines 784, lower level via structures 786, and lower level topmost metal structures 788 that are configured to function as landing pads for through-memory-level via structures to be subsequently formed. The region of the semiconductor devices and the combination of the at least one lower level dielectric layer 760 and the lower level interconnect structures 780 is herein referred to an underlying peripheral device region 700, which is located underneath a memory-level assembly to be subsequently formed and includes peripheral devices for the memory-level assembly. The lower level interconnect structures 780 are embedded in the at least one lower level dielectric layer 760. In one embodiment, the topmost surfaces of the lower level topmost metal structures 788 may be located at or below a horizontal plane including the topmost surface of the at least one lower level dielectric layer 760.

The lower level interconnect structures 780 can be electrically shorted to active nodes (e.g., transistor active regions 742 or gate electrodes 750) of the semiconductor devices 710 (e.g., CMOS devices), and are located at the level of the at least one lower level dielectric layer 760. Only a subset of the active nodes is illustrated in FIG. 1 for clarity. Through-memory-level via structures (not shown in FIG. 1) can be subsequently formed directly on the lower level interconnect structures 780 to provide electrical connection to memory devices to be subsequently formed. In one embodiment, the pattern of the lower level interconnect structures 780 can be selected such that the lower level topmost metal structures 788 (which are a subset of the lower level interconnect structures 780 located at the topmost portion of the lower level interconnect structures 780) can provide landing pad structures for the through-memory-level via structures to be subsequently formed.

In one embodiment, the at least one lower level dielectric layer 760 can include multiple dielectric layers that embed the lower level interconnect structures 780. In this case, the at least one lower level dielectric layer 760 can be a dielectric layer stack overlying the semiconductor devices 710.

FIGS. 2A-2D illustrate a region of the exemplary structure during formation of a first exemplary hydrogen diffusion barrier structure according to an embodiment of the present disclosure. The illustrated region is a portion of the combination of the dielectric layer stack 760 and the lower level interconnect structures 780 in FIG. 1. The lower level interconnect structures 780 can include line structures (which can be metallic lines) and via structures (which can be metallic vias). The various layers in the dielectric layer stack 760 can generally include any dielectric material that can be employed as an interlayer dielectric (ILD) material unless otherwise specified.

Figure 2A:
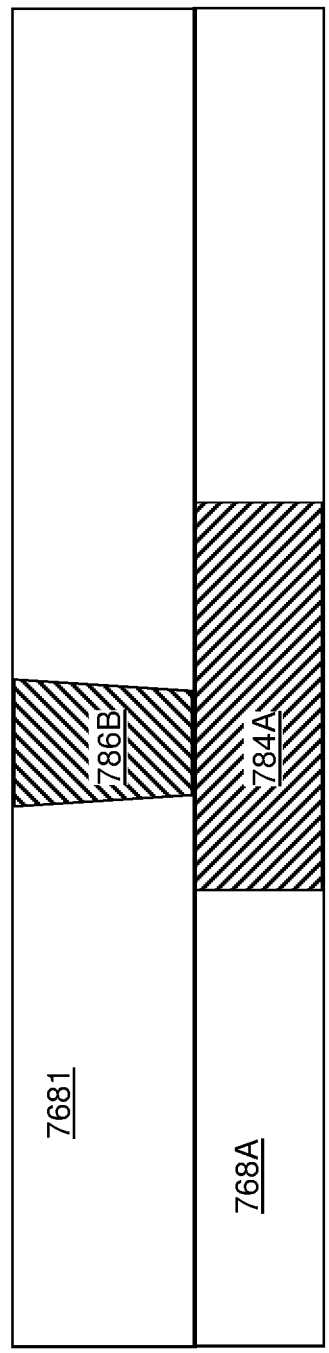

Referring to FIG. 2A, the dielectric layer stack 760 of FIG. 1 can include an optional underlying dielectric material layer 768A embedding an underlying line structure 784A. A first via level dielectric material layer 7681 can be formed over the underlying dielectric material layer 768A, and a first via structure 786B consisting essentially of at least one metallic material can be formed through the first via level dielectric material layer 7681. The first via structure 786B can be formed, for example, by forming a via cavity through the first via level dielectric material layer 7681 to expose a top surface of the underlying line structure 784A, depositing at least one metallic material (such as a combination of a metallic liner layer and a metallic fill material layer) in the via cavity, and removing portions of the deposited at least one metallic material from above the top surface of the first via level dielectric material layer 7681 by a planarization process (such as chemical mechanical planarization).

Referring to FIG. 2B, a first line level dielectric material layer 7682 can be deposited over the first via level dielectric material layer 7681. The combination of the first via level dielectric material layer 7681 and the first line level dielectric material layer 7682 is herein referred to as at least one first dielectric material layer 768B. A line cavity 783 can be formed through the first line level dielectric material layer 7682 over the first via structure 786B. The line cavity 783 can be formed, for example, by applying and patterning a photoresist layer above the first line level dielectric material layer 7682 to form an opening in the photoresist layer, and by transferring the pattern of the opening through the first line level dielectric material layer 7682 by an anisotropic etch. The photoresist layer can be removed, for example, by ashing. A top surface of the first via structure 786B can be physically exposed at the bottom of the line cavity 783. The line cavity 783 is formed in the topmost insulating layer (i.e., the first line level dielectric material layer 7682) among the at least one first dielectric material layer 768B.

Figure 2C:
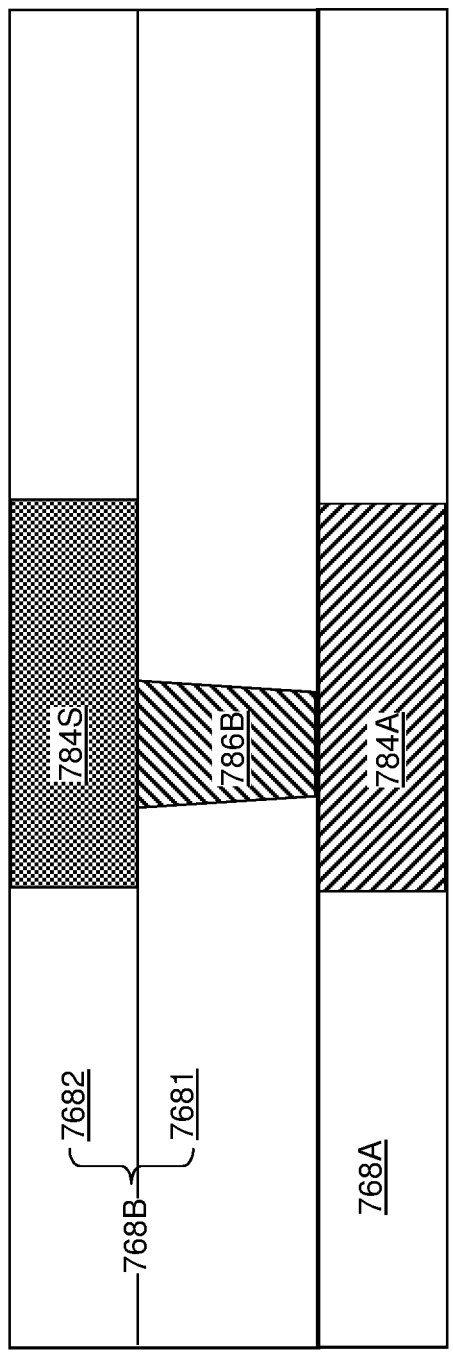

Referring to FIG. 2C, a metal silicide portion 784S can be formed in the line cavity 783. The metal silicide material can be deposited, for example, by physical vapor deposition, or can be formed by sequential deposition of a first material and a second material that can form a metal silicide material upon an anneal at an elevated temperature. In one embodiment, the first material can be a silicon-containing semiconductor material (such as amorphous silicon, polysilicon, or a silicon-germanium alloy) and the second material can be a metal. In another embodiment, the first material can be a metal and the second material can be a silicon-containing semiconductor material. In one embodiment, the metal semiconductor material in the line cavity 783 can be formed by deposition of the metal silicide material into the line cavity 783. In another embodiment, the metal semiconductor material in the line cavity 783 can be formed by a combination of deposition of a semiconductor material into the cavity, deposition of a metal on the semiconductor material, and an anneal process that induces reaction between the semiconductor material and the metal and formation of the metal silicide material. In yet another embodiment, the metal semiconductor material in the line cavity 783 can be formed by a combination of deposition of a metal into the cavity, deposition of a semiconductor material on the metal material, and an anneal process that induces reaction between the semiconductor material and the metal and formation of the metal silicide material. In one embodiment, the metal semiconductor material can be tungsten silicide.

Subsequently, the metal silicide material is planarized to remove portions of the metal silicide material from the horizontal plane including the top surface of the topmost insulating layer (i.e., the first line level dielectric material layer 7682) among the at least one first dielectric material layer 768B. A planarization process such as chemical mechanical planarization (CMP) can be employed. The remaining portion of the metal silicide material in the line cavity 783 constitutes a metal silicide portion 784S, which is a line structure. In this case, the metal silicide portion 784S can be formed as a first line structure that contacts a top surface of a via structure, i.e., the first via structure 786B.

The metal silicide portion 784S can include a metal silicide material that blocks diffusion of hydrogen (e.g., a hydrogen blocking silicide material). The metal silicide portion 784S can include titanium silicide, tantalum silicide, tungsten silicide, or a doped derivative therefrom in which the dopant material can be selected from germanium, carbon, or at least another metal. In one embodiment, the metal silicide portion 784S can include a silicide of a metal having a high melting temperature, e.g., a melting temperature greater than 1,600 degrees Celsius. In one embodiment, the metal silicide portion 784S can include a silicide of a metal having a high melting temperature, e.g., a melting temperature greater than 3,000 degrees Celsius. In this case, the metal silicide portion 784S can be resistant to decomposition or segregation of the metal silicide material therein during thermal processing, which does not exceed the melting temperature of silicon, i.e., 1,414 degrees Celsius. In one embodiment, the metal silicide portion 784S can consist essentially of tungsten silicide.

Figure 2D:
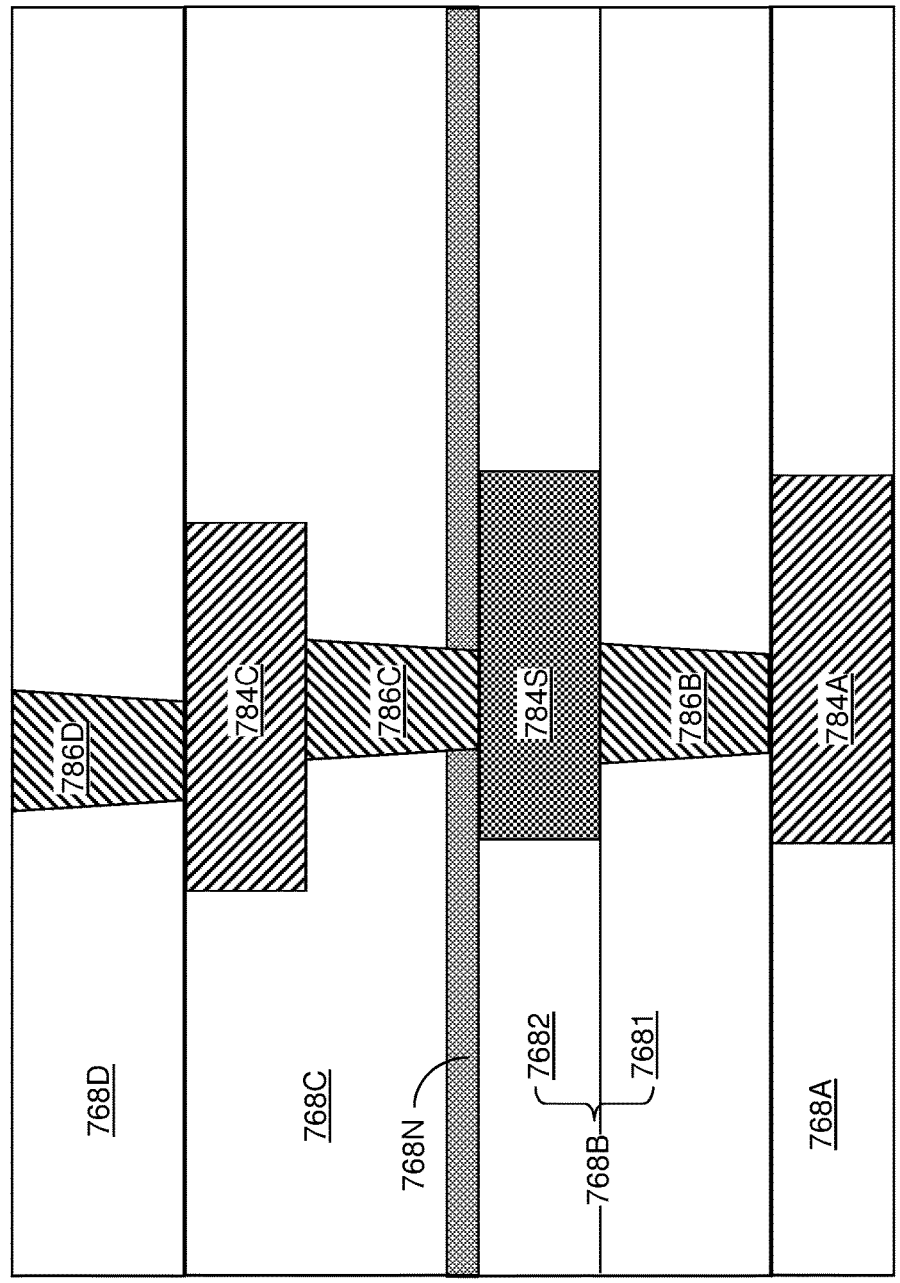

Referring to FIG. 2D, a hydrogen blocking dielectric material layer, such as a silicon nitride layer 768N is deposited on the top surfaces of the topmost insulating layer among the at least one first dielectric material layer 768B (i.e., the first line level dielectric material layer 7682) and the metal silicide portion 784S. The silicon nitride layer 768N can be formed as a continuous blanket (unpatterned) material layer without any opening therein after formation of the metal silicide portion 784S. The silicon nitride layer 768N can be deposited by a conformal or non-conformal deposition process. In one embodiment, the silicon nitride layer 768N can be deposited by low pressure chemical vapor deposition (LPCVD) or plasma enhanced chemical vapor deposition (PECVD). The thickness of the silicon nitride layer 768N can be selected to be thick enough to block diffusion of hydrogen atoms therethrough. For example, the thickness of the silicon nitride layer 768N can be in a range from 3 nm to 60 nm, although lesser and greater thicknesses can also be employed.

At least one second dielectric material layer 768C can be deposited over the silicon nitride layer 768N. The at least one second dielectric material layer 768C can be formed as a single dielectric material layer (e.g., silicon oxide) or as multiple dielectric material layers. A via cavity and a line cavity can be formed through the at least one second dielectric material layer 768C, and can be filled with at least one metallic material to form a second via structure 786C and a second line structure 784C. An opening can be formed through the silicon nitride layer 768N during formation of the via cavity through the at least one second dielectric material layer 768C, and the second via structure 786C can be formed directly on the top surface of the metal silicide portion 784S, which is the first line structure. If the at least one second dielectric material layer 768C includes a second via level dielectric material layer and a second line level dielectric material layer, the second via structure 786C can be formed within the second via level dielectric material layer prior to formation of the second line level dielectric material layer, and the second line structure 784C can be formed within the second line level dielectric material layer. If the at least one second dielectric material layer 768C includes a dielectric material layer that vertically extends over the levels of the second via structure 786C and the second line structure 784C, the second via structure 786C and the second line structure 784C can be formed as an integrated line and via structure employing a dual damascene process in which a combination of a via cavity and a line cavity is simultaneously filled and planarized. Subsequently, an optional overlying dielectric material layer 768D and an optional via structure 786D and/or an integrated line and via structure can be formed through the overlying dielectric material layer 768D.

Each of the via structures (786B, 786C, 786D) can be one of the lower level via structures 786 of the exemplary structure of FIG. 1, and each of the line structures (784A, 784S, 784C) can be one of the lower level metal lines 784 of the exemplary structure of FIG. 1. Thus, a metal portion, such as the second via structure 786C, can be formed as one of the lower level interconnect structures 780 through the opening in the silicon nitride layer 768N and directly on the metal silicide portion 784S. Each of the underlying dielectric material layer 768A, the at least one first dielectric material layer 768B, the hydrogen blocking dielectric material layer (e.g., the silicon nitride layer) 768N, the at least one second dielectric material layer 768C, and the overlying dielectric material layer 768D can be a component layer within the at least one lower level interconnect dielectric layer 768 of FIG. 1. The combination of the silicon nitride layer 768N and the metal silicide portion 784S constitutes a first exemplary hydrogen diffusion barrier structure that is embedded within the dielectric layer stack 760.

The metal silicide portion 784S is effective for preventing diffusion of hydrogen therethrough. A metal silicide portion 784S can be provided underneath each opening through the silicon nitride layer 768N in the exemplary structure of FIG. 1. The combination of the silicon nitride layer 768N and the metal silicide portions 784S constitutes a continuous hydrogen diffusion barrier structure without any opening therein. The combination of the silicon nitride layer 768N and the metal silicide portions 784S can continuously extend to the outermost sidewalls of the exemplary structure of FIG. 1 (e.g., a continuous straight or curved line can be drawn through layer 768N and portion 784S without any breaks in the line which would permit hydrogen diffusion). After formation of additional structures, another hydrogen diffusion blocking layer (such as a continuous silicon nitride layer) can be deposited directly on the outermost sidewalls of the exemplary structure, thereby extending the continuous hydrogen diffusion barrier structure to prevent diffusion of hydrogen through the sidewalls of the exemplary structure.

Figure 3A:
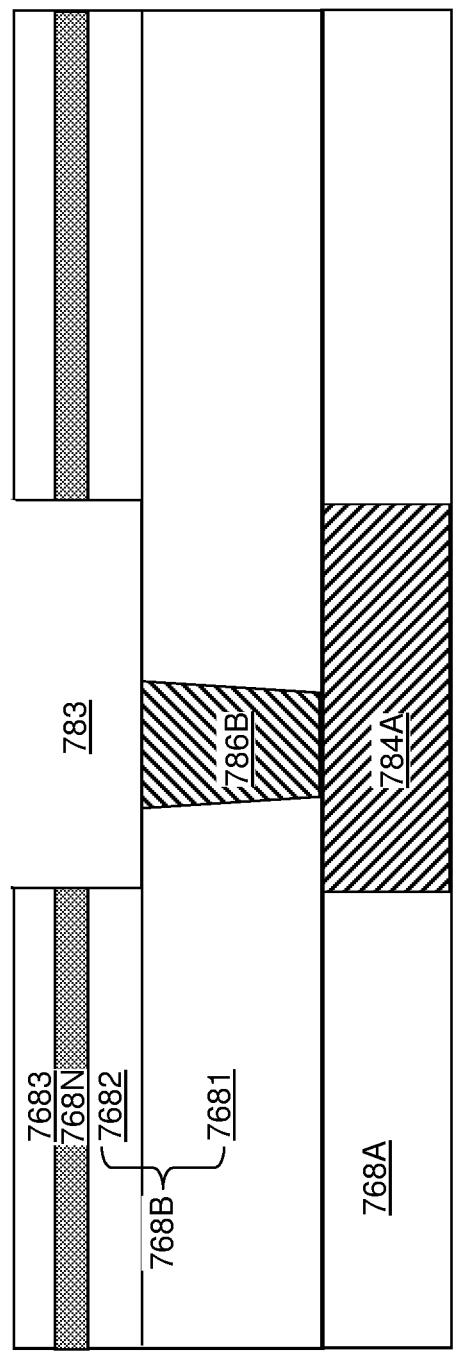
FIGS. 3A-3C are vertical cross-sectional view of a region of the exemplary structure during formation of a second exemplary hydrogen diffusion barrier structure according to an embodiment of the present disclosure.
Figure 3B:
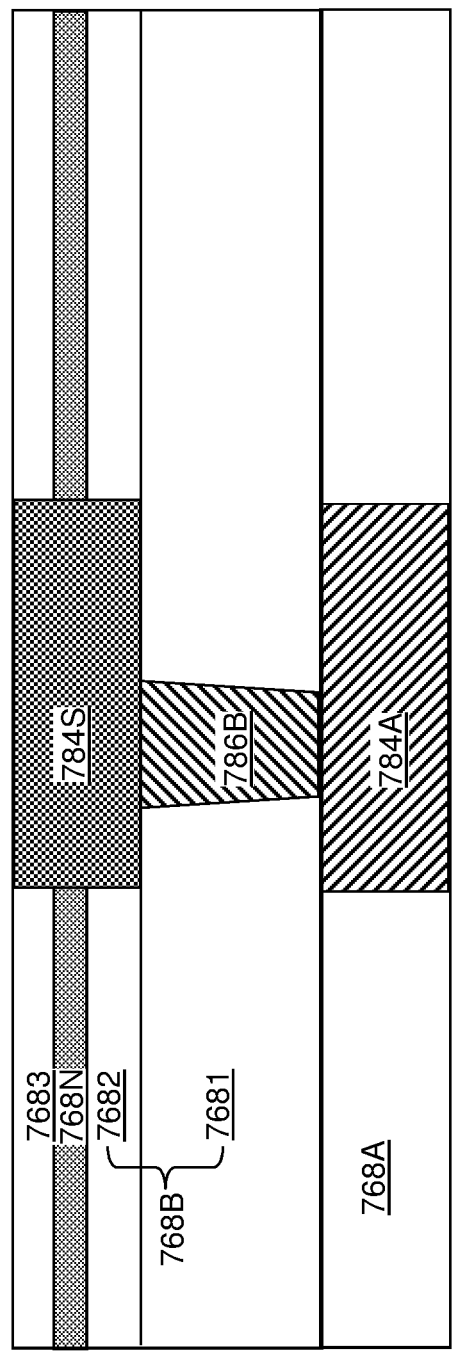
Figure 3C:
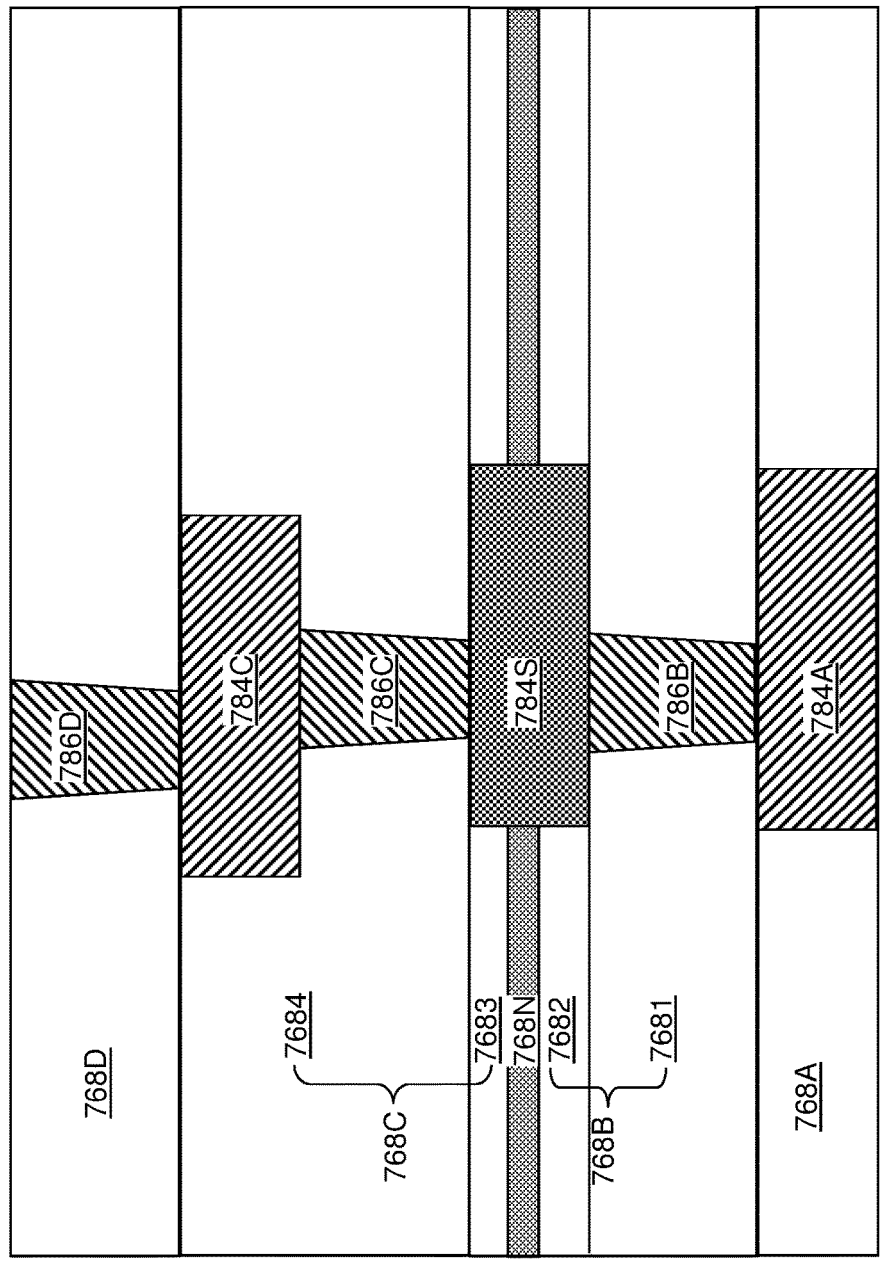

FIGS. 3A-3C illustrate a region of the exemplary structure during formation of a second exemplary hydrogen diffusion barrier structure according to an embodiment of the present disclosure in which the hydrogen blocking dielectric material layer contacts the sidewall of the hydrogen blocking silicide material. The illustrated region is a portion of the combination of the dielectric layer stack 760 and the lower level interconnect structures 780 in FIG. 1.

Referring to FIG. 3A, the structure of FIG. 2A can be employed to form the second exemplary hydrogen diffusion barrier structure. The structure of FIG. 2A includes an optional underlying dielectric material layer 768A embedding an underlying line structure 784A, and a first via level dielectric material layer 7681 embedding a first via structure 786B. A first line level dielectric material layer 7682, a silicon nitride layer 768N, and a cap dielectric material layer 7683 (e.g., silicon oxide) can be sequentially deposited over the first via level dielectric material layer 7681. The combination of the first via level dielectric material layer 7681 and the first line level dielectric material layer 7682 is herein referred to as at least one first dielectric material layer 768B. The silicon nitride layer 768N can be deposited by a conformal or non-conformal deposition process. In one embodiment, the silicon nitride layer 768N can be deposited by low pressure chemical vapor deposition (LPCVD) or plasma enhanced chemical vapor deposition (PECVD). The thickness of the silicon nitride layer 768N can be selected to be thick enough to block diffusion of hydrogen atoms therethrough. For example, the thickness of the silicon nitride layer 768N can be in a range from 3 nm to 60 nm, although lesser and greater thicknesses can also be employed. The cap dielectric material layer 7683 is deposited over the silicon nitride layer 768N.

A line cavity 783 can be formed through the cap dielectric material layer 7683, the silicon nitride layer 768N, and the first line level dielectric material layer 7682 over the first via structure 786B. The line cavity 783 can be formed, for example, by applying and patterning a photoresist layer above the cap dielectric material layer 7683 to form an opening in the photoresist layer, and by transferring the pattern of the opening through the first line level dielectric material layer 7682 by an anisotropic etch. The photoresist layer can be removed, for example, by ashing. A top surface of the first via structure 786B can be physically exposed at the bottom of the line cavity 783. The line cavity 783 is formed in, and through, the topmost insulating layer (i.e., the first line level dielectric material layer 7682) among the at least one first dielectric material layer 768B. An opening can be formed through the silicon nitride layer 768N during formation of the line cavity 783. The line cavity 783 extends through the cap dielectric material layer 7683, the silicon nitride layer 768N, and a topmost insulating layer (i.e., the first line level dielectric material layer 7682) among the at least one first dielectric material layer 768B.

Referring to FIG. 3B, a metal silicide portion 784S can be formed in the line cavity 783. The metal silicide material can be formed by any of the processing steps that can be employed to form the metal silicide portion 784S of FIG. 2C. A planarization process can be performed to remove portions of the metal silicide material located above the horizontal plane including the top surface of the cap dielectric material layer 7683. Thus, the top surface of the metal silicide 784S can be coplanar with the top surface of the cap dielectric material layer 7683. The metal silicide portion 784S is formed after formation of the silicon nitride layer 768N. The metal silicide portion 784S is formed inside the line cavity 783 in a configuration that provides a continuous closed periphery that adjoins an entire periphery of an opening in the silicon nitride layer 768N. As used herein, a closed periphery is a periphery that is homeomorphic to a circle, i.e., a periphery that can be continuously stretched into a circle without a cut or a joining of two points.

The metal silicide portion 784S can include the same hydrogen blocking metal silicide material as described above.

Referring to FIG. 3C, at least one line and via level dielectric material layer 7684 can be deposited over the cap dielectric material layer 7683. The cap dielectric material layer 7683 and the at least one line and via level dielectric material layer 7684 collectively constitutes at least one second dielectric material layer 768C, which is formed over the silicon nitride layer 768N. Thus, the metal silicide material can be planarized employing the top surface of a bottommost layer (i.e., the cap dielectric material layer 7683) among the at least one second dielectric material layer 768C as a stopping surface at the processing step of FIG. 3B.

Referring back to FIG. 3C, a via cavity and a line cavity can be formed through the at least one line and via level dielectric material layer 7684 (which is a component of the at least one second dielectric material layer 768C), and can be filled with at least one metallic material to form a second via structure 786C and a second line structure 784C. The second via structure 786C can be formed directly on the top surface of the metal silicide portion 784S, which is the first line structure.

If at least one line and via level dielectric material layer 7684 includes a second via level dielectric material layer and a second line level dielectric material layer, the second via structure 786C can be formed within the second via level dielectric material layer prior to formation of the second line level dielectric material layer, and the second line structure 784C can be formed within the second line level dielectric material layer. If at least one line and via level dielectric material layer 7684 includes a continuous dielectric material layer that vertically extends over the levels of the second via structure 786C and the second line structure 784C, the second via structure 786C and the second line structure 784C can be formed as an integrated line and via structure employing a dual damascene process in which a combination of a via cavity and a line cavity is simultaneously filled and planarized. Subsequently, an optional overlying dielectric material layer 768D and an optional via structure 786D and/or an integrated line and via structure can be formed through the overlying dielectric material layer 768D.

Each of the via structures (786B, 786C, 786D) can be one of the lower level via structures 786 of the exemplary structure of FIG. 1, and each of the line structures (784A, 784S, 784C) can be one of the lower level metal lines 784 of the exemplary structure of FIG. 1. Thus, the metal silicide portion 784S can be formed as one of the lower level interconnect structures 780 through the opening in the silicon nitride layer 768N. Each of the underlying dielectric material layer 768A, the at least one first dielectric material layer 768B, the silicon nitride layer 768N, the at least one second dielectric material layer 768C, and the overlying dielectric material layer 768D can be a component layer within the at least one lower level interconnect dielectric layer 768 of FIG. 1. The combination of the silicon nitride layer 768N and the metal silicide portion 784S constitutes a second exemplary hydrogen diffusion barrier structure that is embedded within the dielectric layer stack 760.

The metal silicide portion 784S is effective for preventing diffusion of hydrogen therethrough. A metal silicide portion 784S can be provided within each opening through the silicon nitride layer 768N in the exemplary structure of FIG. 1. The combination of the silicon nitride layer 768N and the metal silicide portions 784S constitutes a continuous hydrogen diffusion barrier structure without any opening therein. The combination of the silicon nitride layer 768N and the metal silicide portions 784S can continuously extend to the outermost sidewalls of the exemplary structure of FIG. 1. After formation of additional structures, another hydrogen diffusion blocking layer (such as a continuous silicon nitride layer) can be deposited directly on the outermost sidewalls of the exemplary structure, thereby extending the continuous hydrogen diffusion barrier structure to prevent diffusion of hydrogen through the sidewalls of the exemplary structure.

FIGS. 4A-4D illustrate a region of the exemplary structure during formation of a third exemplary hydrogen diffusion barrier structure according to an embodiment of the present disclosure which contains a bi-layer line structure containing the hydrogen blocking silicide material and another metallic material. The illustrated region is a portion of the combination of the dielectric layer stack 760 and the lower level interconnect structures 780 in FIG. 1.

Figure 4A:
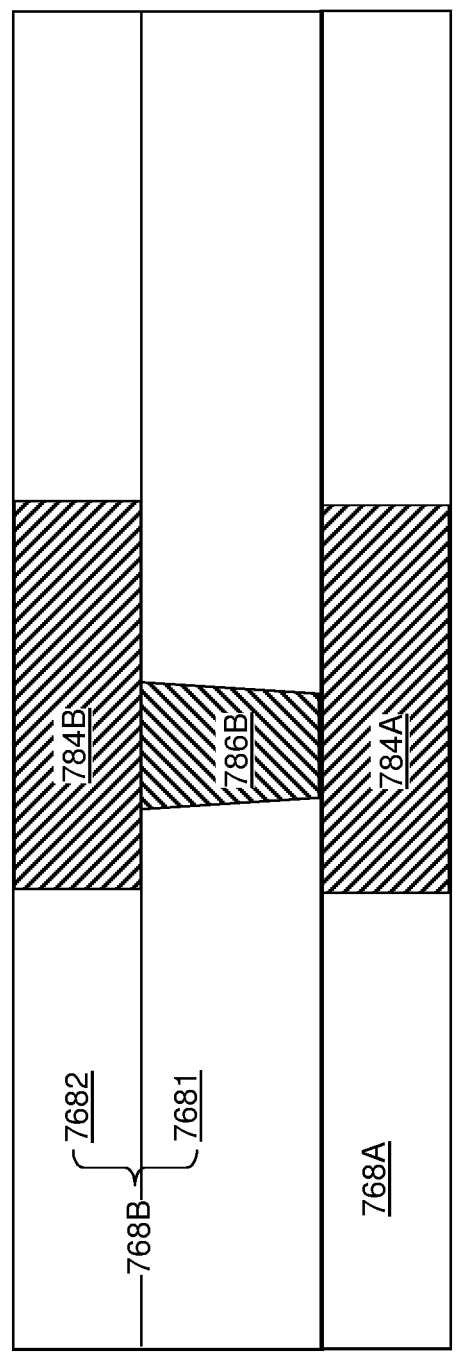

Referring to FIG. 4A, the structure of FIG. 2A can be employed to form the second exemplary hydrogen diffusion barrier structure. The structure of FIG. 2A includes an optional underlying dielectric material layer 768A embedding an underlying line structure 784A, and a first via level dielectric material layer 7681 embedding a first via structure 786B. A first line level dielectric material layer 7682 can be deposited over the first via level dielectric material layer 7681. The combination of the first via level dielectric material layer 7681 and the first line level dielectric material layer 7682 is herein referred to as at least one first dielectric material layer 768B. A line cavity 783 can be formed through the first line level dielectric material layer 7682 over the first via structure 786B in the same manner as illustrated in FIG. 2B. A top surface of the first via structure 786B can be physically exposed at the bottom of the line cavity 783. The line cavity 783 is formed in the topmost insulating layer (i.e., the first line level dielectric material layer 7682) among the at least one first dielectric material layer 768B.

At least one metallic material can be deposited in the line cavity 783. The at least one metallic material can include a metal nitride liner consisting essentially of a conductive metal nitride and a metal fill material consisting essentially of an elemental metal or an intermetallic alloy. For example, the at least one metallic material can include a TiN liner and W or Cu. The conductive metal nitride can be deposited by physical vapor deposition or chemical vapor deposition. The metal fill material can be deposited, for example, by physical vapor deposition, chemical vapor deposition, electroplating, or electroless plating. The at least one metallic material (such as the combination of the metal fill material and the conductive metal nitride) can be planarized to remove portions of the at least one metallic material from the horizontal plane including the top surface of the topmost insulating layer (i.e., the first line level dielectric material layer 7682) among the at least one first dielectric material layer 768B. A planarization process such as chemical mechanical planarization (CMP) can be employed. The remaining portion of the metal silicide material in the line cavity 783 constitutes a metal line portion 784B, which is a line structure contacting a top surface of a via structure, i.e., the first via structure 786B.

Figure 4B:
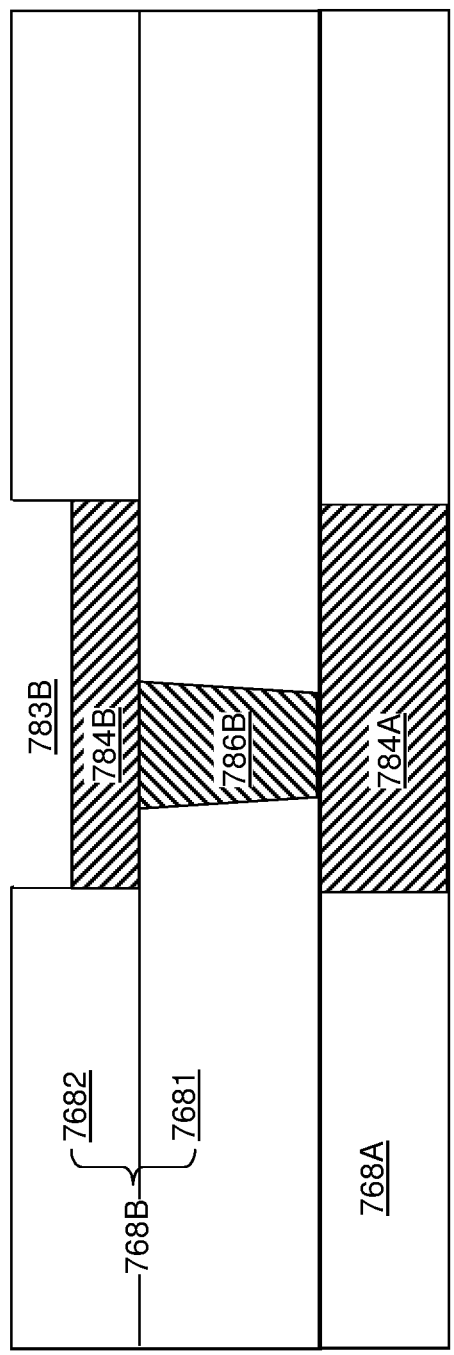

Referring to FIG. 4B, the metal line portion 784B is vertically recessed with respect to the first line level dielectric material layer 7682 by an etch process. The etch process can be a wet etch process or a dry etch process that etches the material(s) of the metal line portion 784B selective to the material of the first line level dielectric material layer 7682. A line cavity 783B is formed above the remaining portion of the metal line portion 784B. The recess depth for the metal line portion 784B, i.e., the height of the line cavity that is formed above the remaining portion of the metal line portion 784B, can be in a range from 10 nm to 300 nm, although lesser and greater recess depths can also be employed.

Figure 4C:
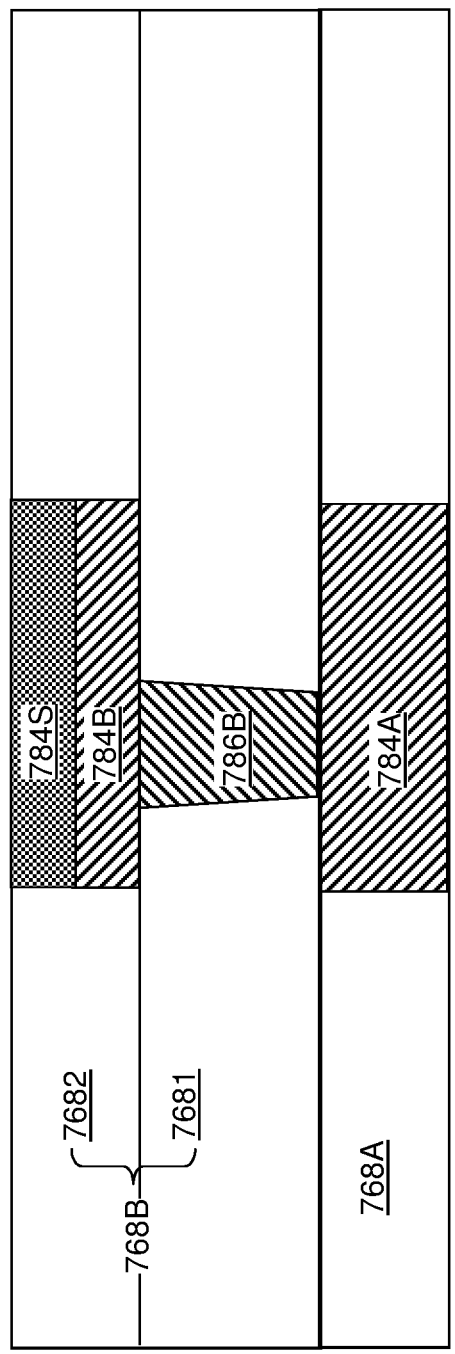

Referring to FIG. 4C, a metal silicide portion 784S can be formed in the line cavity 783B that overlies the metal line portion 784B. A metal silicide material can be formed in the line cavity 783B overlying the metal line portion 784B by any of the methods that can be employed to form the metal silicide material of the metal line portion 784B illustrated in FIG. 2C.

Subsequently, the metal silicide material is planarized to remove portions of the metal silicide material from the horizontal plane including the top surface of the topmost insulating layer (i.e., the first line level dielectric material layer 7682) among the at least one first dielectric material layer 768B. A planarization process such as chemical mechanical planarization (CMP) can be employed. The remaining portion of the metal silicide material in the line cavity 783B constitutes a metal silicide portion 784S, which is an upper portion of a line structure (784S, 784B). The line structure (784S, 784B) includes the metal silicide portion 784S as an upper portion and the metal line portion 784B as a lower portion. Thus, the metal silicide portion 784S can be formed as the upper portion of the line structure that includes the metal line portion 784B underneath the upper portion.

The metal silicide portion 784S can include the same hydrogen blocking silicide material as described above. In one embodiment, the metal silicide portion 784S can consist essentially of tungsten silicide.

Referring to FIG. 4D, a silicon nitride layer 768N is deposited on the top surfaces of the topmost insulating layer among the at least one first dielectric material layer 768B (i.e., the first line level dielectric material layer 7682) and the metal silicide portion 784S. The silicon nitride layer 768N can be formed as a continuous blanket (unpatterned) material layer without any opening therein after formation of the metal silicide portion 784S. The silicon nitride layer 768N can be deposited by a conformal or non-conformal deposition process. In one embodiment, the silicon nitride layer 768N can be deposited by low pressure chemical vapor deposition (LPCVD) or plasma enhanced chemical vapor deposition (PECVD). The thickness of the silicon nitride layer 768N can be selected to be thick enough to block diffusion of hydrogen atoms therethrough. For example, the thickness of the silicon nitride layer 768N can be in a range from 3 nm to 60 nm, although lesser and greater thicknesses can also be employed.

At least one second dielectric material layer 768C can be deposited over the silicon nitride layer 768N. The at least one second dielectric material layer 768C can be formed as a single dielectric material layer or as multiple dielectric material layers. A via cavity and a line cavity can be formed through the at least one second dielectric material layer 768C, and can be filled with at least one metallic material to form a second via structure 786C and a second line structure 784C. An opening can be formed through the silicon nitride layer 768N during formation of the via cavity through the at least one second dielectric material layer 768C, and the second via structure 786C can be formed directly on the top surface of the metal silicide portion 784S, which is the first line structure. If the at least one second dielectric material layer 768C includes a second via level dielectric material layer and a second line level dielectric material layer, the second via structure 786C can be formed within the second via level dielectric material layer prior to formation of the second line level dielectric material layer, and the second line structure 784C can be formed within the second line level dielectric material layer. If the at least one second dielectric material layer 768C includes a dielectric material layer that vertically extends over the levels of the second via structure 786C and the second line structure 784C, the second via structure 786C and the second line structure 784C can be formed as an integrated line and via structure employing a dual damascene process in which a combination of a via cavity and a line cavity is simultaneously filled and planarized. Subsequently, an optional overlying dielectric material layer 768D and an optional via structure 786D and/or an integrated line and via structure can be formed through the overlying dielectric material layer 768D.

Each of the via structures (786B, 786C, 786D) can be one of the lower level via structures 786 of the exemplary structure of FIG. 1, and each of the line structures (784A, (784S, 784B), 784C) can be one of the lower level metal lines 784 of the exemplary structure of FIG. 1. Thus, a metal portion such as the second via structure 786C can be formed as one of the lower level interconnect structures 780 through the opening in the silicon nitride layer 768N and directly on the metal silicide portion 784S. Each of the underlying dielectric material layer 768A, the at least one first dielectric material layer 768B, the silicon nitride layer 768N, the at least one second dielectric material layer 768C, and the overlying dielectric material layer 768D can be a component layer within the at least one lower level interconnect dielectric layer 768 of FIG. 1. The combination of the silicon nitride layer 768N and the metal silicide portion 784S constitutes a third exemplary hydrogen diffusion barrier structure that is embedded within the dielectric layer stack 760.

The metal silicide portion 784S is effective for preventing diffusion of hydrogen therethrough. A metal silicide portion 784S can be provided underneath each opening through the silicon nitride layer 768N in the exemplary structure of FIG. 1. The combination of the silicon nitride layer 768N and the metal silicide portions 784S constitutes a continuous hydrogen diffusion barrier structure without any opening therein. The combination of the silicon nitride layer 768N and the metal silicide portions 784S can continuously extend to the outermost sidewalls of the exemplary structure of FIG. 1. After formation of additional structures, another hydrogen diffusion blocking layer (such as a continuous silicon nitride layer) can be deposited directly on the outermost sidewalls of the exemplary structure, thereby extending the continuous hydrogen diffusion barrier structure to prevent diffusion of hydrogen through the sidewalls of the exemplary structure.

Figure 4E:
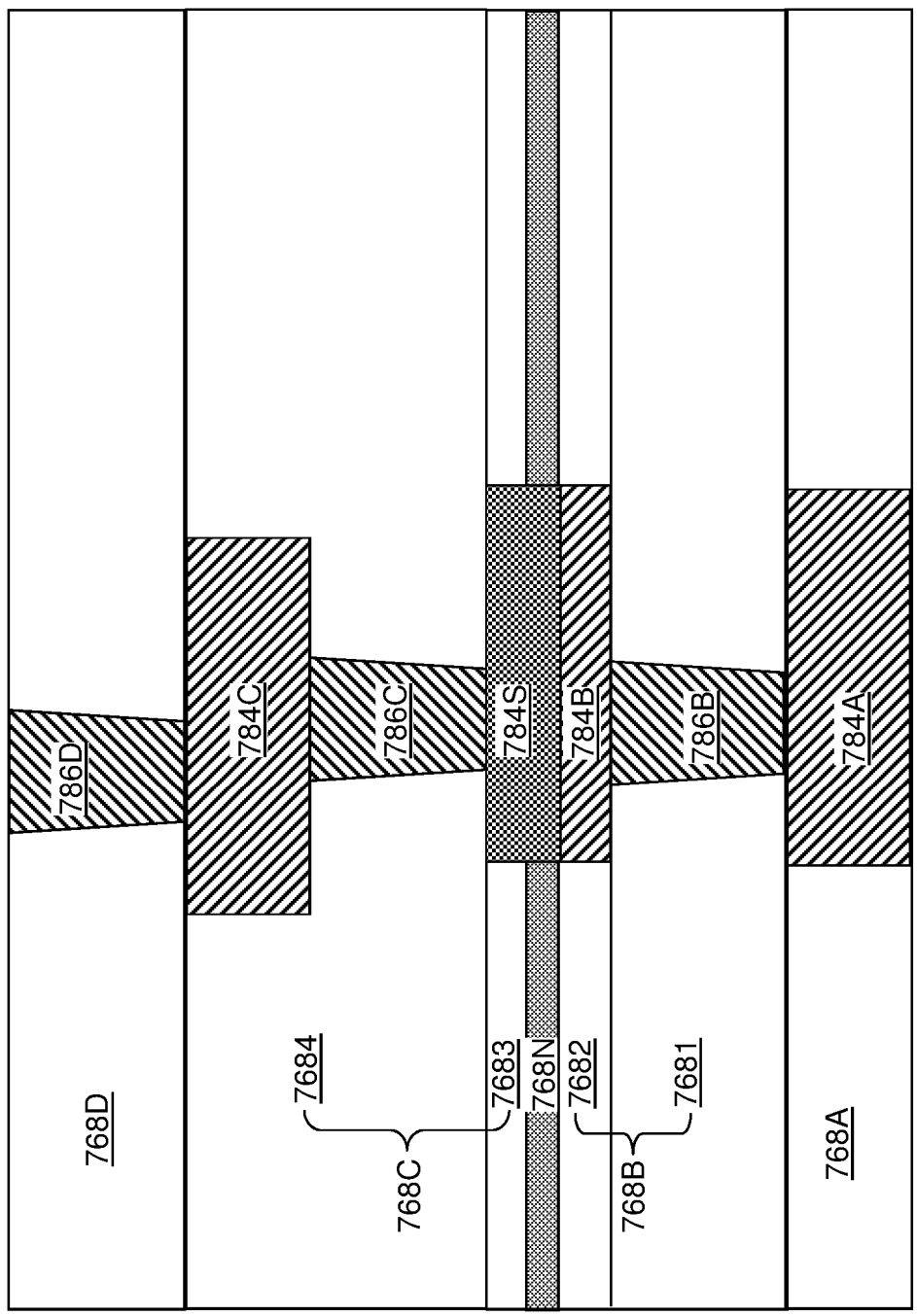
FIG. 4E is a vertical cross-sectional view of a region of the exemplary structure including an alternative configuration for the third exemplary hydrogen diffusion barrier structure according to an embodiment of the present disclosure.

FIG. 4E is a vertical cross-sectional view of a region of the exemplary structure including an alternative configuration for the third exemplary hydrogen diffusion barrier structure according to an embodiment of the present disclosure. The alternative configuration can be derived by employing the structure of FIG. 3A instead of the structure of FIG. 2B prior to formation of the metal line portion 784B. Subsequently, the processing steps of FIGS. 4B-4D can be sequentially performed. In this case, the metal line portion 784B is vertically recessed from the top surface of the cap dielectric material layer 7683 such that a sidewall of the silicon nitride layer 768N contacts the metal silicide portion 784S. In one embodiment, the top surface of the metal line portion 784B can be vertically recessed down to, or below, the horizontal plane including the bottom surface of the silicon nitride layer 768N. Thus, the metal silicide portion 784S physically contacts sidewalls of the silicon nitride layer 768N. After formation of the metal silicide portion 784, the processing steps of FIG. 3C can be performed.

In this case, a bottommost layer (i.e., the cap dielectric material layer 7683) among the at least one second dielectric material layer 786C can be formed on the silicon nitride layer 768N. The line cavity formed at the processing step of FIG. 4A can extend through the silicon nitride layer 768N and a topmost insulating layer (i.e., the first line level dielectric material layer 7682) among the at least one first dielectric material layer 768B. After formation of the metal line portion 784B at a bottom portion of the line cavity, an upper portion of the line cavity can be filled with a metal silicide material to form a metal silicide portion 784S. The metal silicide material is planarized employing the top surface of the bottommost layer (i.e., the cap dielectric material layer 7683) among the at least one second dielectric material layer 768C as a stopping surface. A remaining portion of the metal silicide material in the line cavity constitutes the metal silicide portion 784S. The metal silicide portion 784S is formed inside the line cavity in a configuration that provides a continuous closed periphery that adjoins an entire periphery of an opening in the silicon nitride layer 784S. Thus, the metal silicide portion 784S is formed after formation of the silicon nitride layer 768N. The metal silicide portion 784S is formed as an upper portion of a line structure (784S, 784B) that includes a metal line portion 784B underneath the upper portion.

FIGS. 5A-5D illustrate a region of the exemplary structure during formation of a fourth exemplary hydrogen diffusion barrier structure according to an embodiment of the present disclosure. The illustrated region is a portion of the combination of the dielectric layer stack 760 and the lower level interconnect structures 780 in FIG. 1.

Figure 5A:
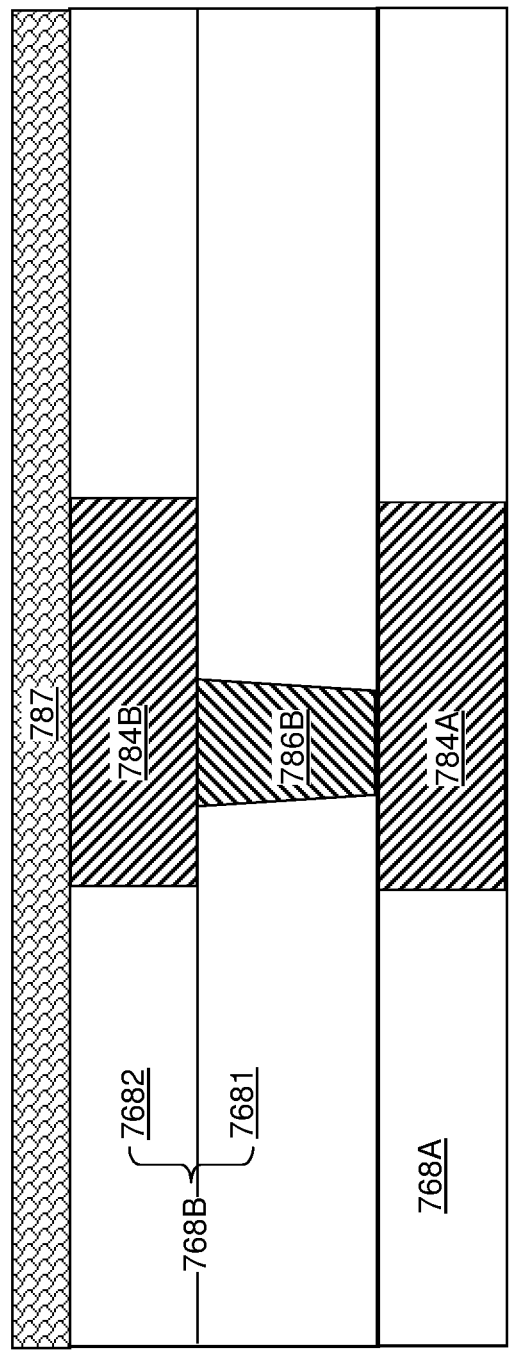
FIGS. 5A-5D are vertical cross-sectional view of a region of the exemplary structure during formation of a fourth exemplary hydrogen diffusion barrier structure according to an embodiment of the present disclosure.

Referring to FIG. 5A, the structure of FIG. 4A can be employed to form the fourth exemplary hydrogen diffusion barrier structure. The structure of FIG. 4A includes an optional underlying dielectric material layer 768A embedding an underlying line structure 784A, a first via level dielectric material layer 7681 embedding a first via structure 786B, and a first line level dielectric material layer 7682 embedding a metal line portion 784B, which is a line structure. The combination of the first via level dielectric material layer 7681 and the first line level dielectric material layer 7682 constitutes at least one first dielectric material layer 768B. The metal line portion 784B of FIG. 5A includes, and may consist essentially of, an elemental metal that can form a metal silicide or an intermetallic alloy that can form a metal silicide. For example, the metal line portion 784B can include titanium, tantalum, or tungsten. In one embodiment, the metal line portion 784B can consist essentially of tungsten.

Instead of recessing the metal line portion 784B as in FIG. 4B, a silicon-containing semiconductor layer 787 can be deposited on the top surface of the first line level dielectric material layer 7682 and in contact with a top surface of the metal line portion 784B. The silicon-containing semiconductor layer 787 includes silicon at an atomic concentration of at least 50%. The silicon-containing semiconductor layer 787 can include, for example, amorphous silicon, polysilicon, or a silicon-germanium alloy including silicon at an atomic concentration greater than 50%. The silicon-containing semiconductor layer 787 can be deposited by chemical vapor deposition or physical vapor deposition. The thickness of the silicon-containing semiconductor layer 787 can be in a range from 10 nm to 300 nm, although lesser and greater thicknesses can also be employed.

Figure 5B:
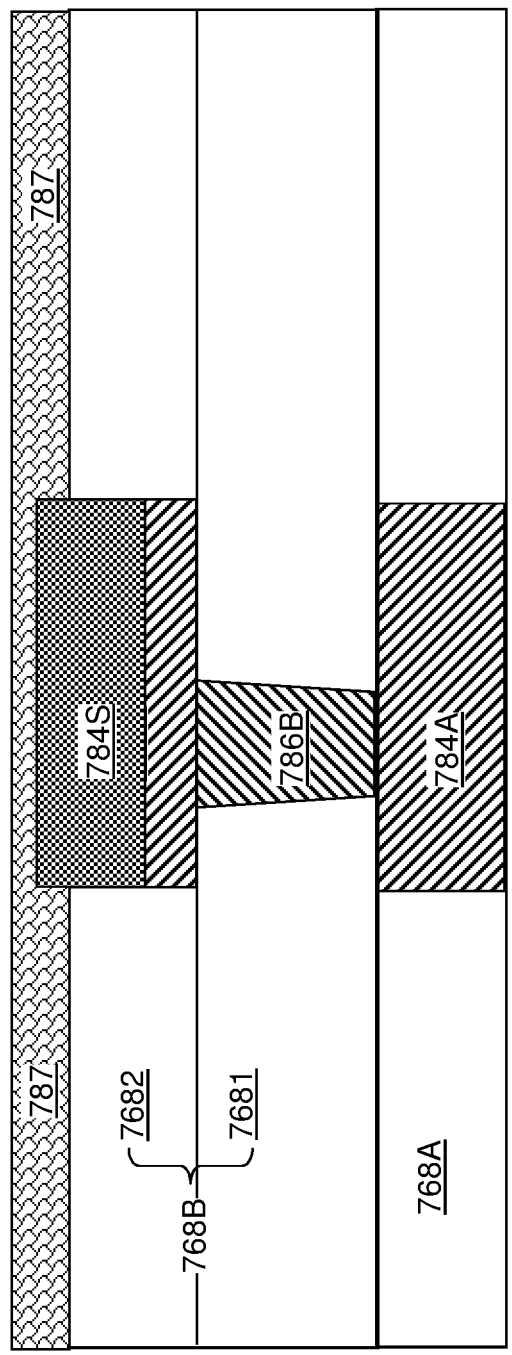

Referring to FIG. 5B, an anneal at an elevated temperature is performed to induce reaction between the semiconductor material of the silicon-containing semiconductor layer 787 and the metal of the metal line portion 784B. The anneal can include multiple steps in which the anneal temperature is sequentially increased to induce formation of a low resistance phase of a metal silicide material, which is an alloy of the semiconductor material of the silicon-containing semiconductor layer 787 and the metal of the metal line portion 784B. A metal silicide portion 784S is formed in a region in which the semiconductor material of the silicon-containing semiconductor layer 787 and the metal of the metal line portion 784B react during the anneal process. The temperature of the anneal depends on the composition of the metal in the metal line portion 784B, and may be in a range from 600 degrees to 1,000 degrees. The metal silicide portion 784S can include titanium silicide, tantalum silicide, or tungsten silicide. In one embodiment, the metal silicide portion 784S can include tungsten silicide.

Figure 5C:
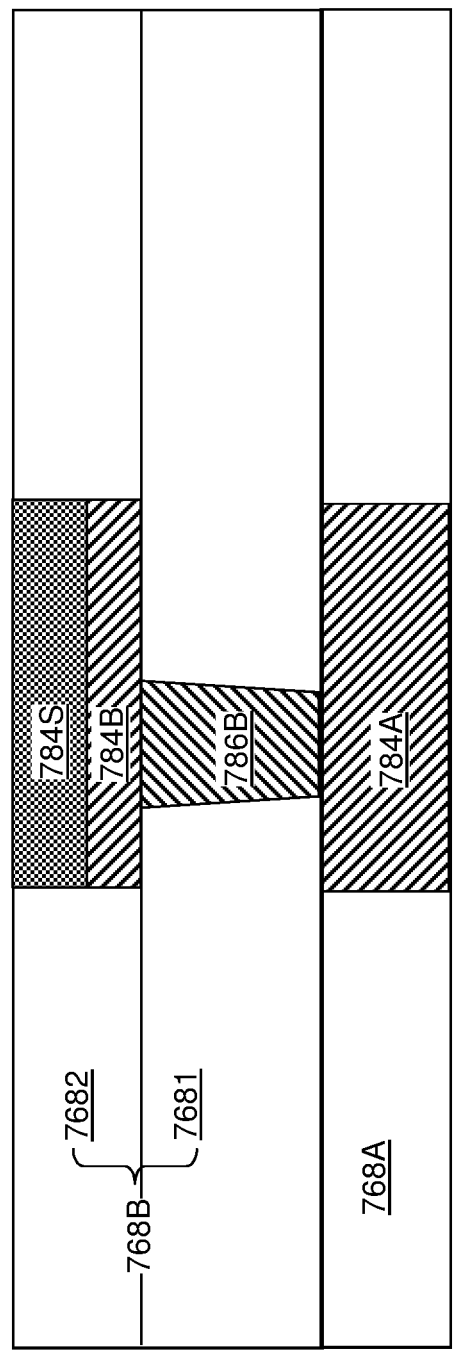

Referring to FIG. 5C, unreacted portions of the silicon-containing semiconductor layer 787 can be removed by an etch process that etches the material of the silicon-containing semiconductor layer 787 selective to the material of the metal silicide portion 784S. For example, a wet etch that etches silicon selective to metal silicide materials can be employed to remove the silicon-containing semiconductor layer 787. Optionally, a region of the metal silicide portion 784S that protrudes above a horizontal plane including the top surface of the first line level dielectric material layer 7682 can be removed by a planarization process such as an etch back process or a chemical mechanical planarization process. The top surface of the metal silicide portion 784S may be coplanar with, raised above, or recessed below, the top surface of the first line level dielectric material layer 7682. The metal silicide portion 784S and the metal line portion 784B collectively constitutes a line structure (784S, 784B). The metal silicide portion 784S is an upper portion of the line structure (784S, 784B), and the metal line portion 784B is a lower portion of the line structure (784S, 784B).

Figure 5D:
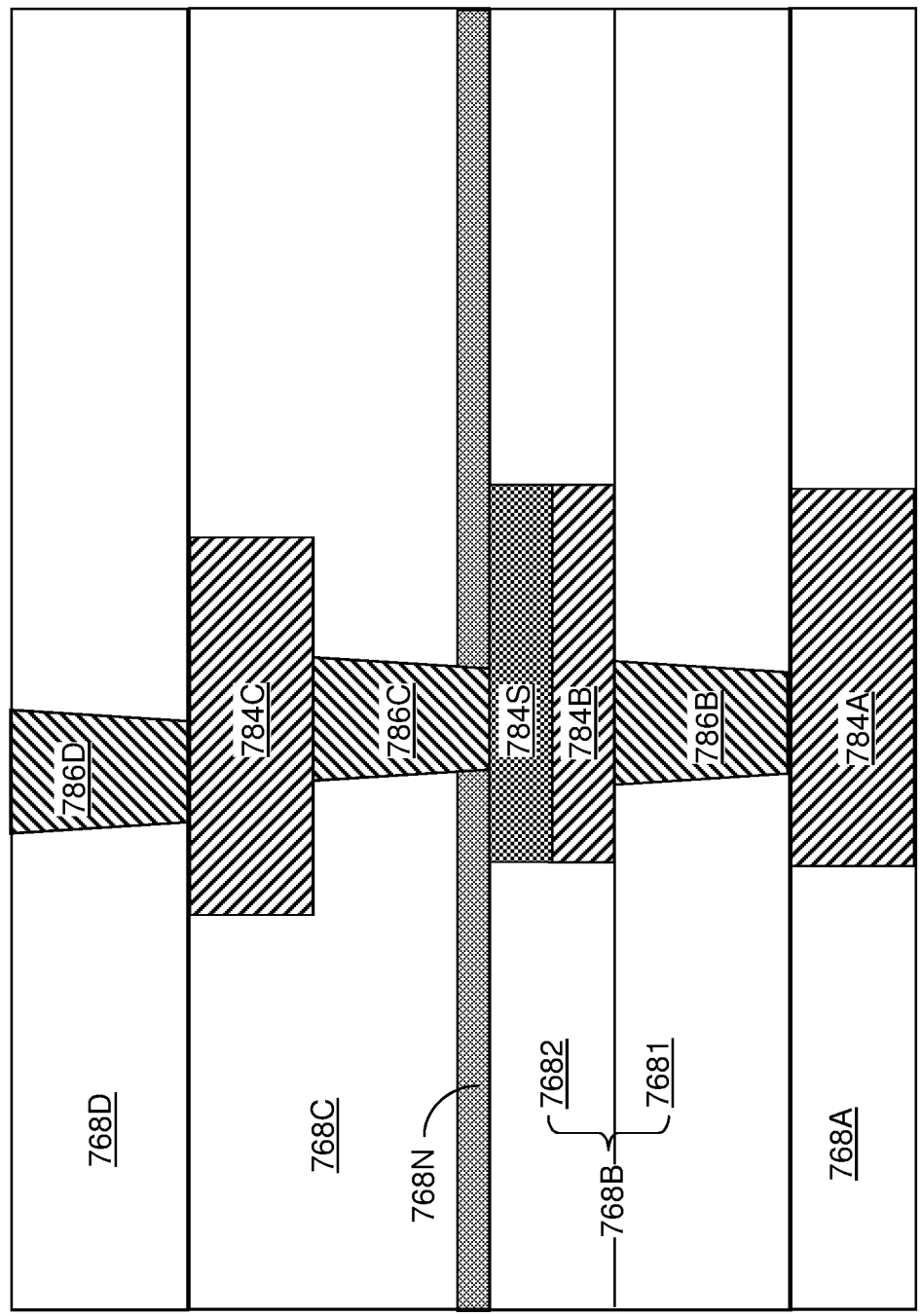

Referring to FIG. 5D, a silicon nitride layer 768N is deposited on the top surfaces of the topmost insulating layer among the at least one first dielectric material layer 768B (i.e., the first line level dielectric material layer 7682) and the metal silicide portion 784S. The silicon nitride layer 768N can be formed as a continuous blanket (unpatterned) material layer without any opening therein after formation of the metal silicide portion 784S. The silicon nitride layer 768N can have the same composition as, and can be formed employing the same methods as, the silicon nitride layer 768N of FIG. 2D. In this configuration, the metal silicide portion 784S is formed in an upper portion of a line cavity, and the metal silicide portion 784S is formed prior to formation of the silicon nitride layer 768N. In one embodiment, the processing steps of FIG. 4D can be performed to form the silicon nitride layer 768N and additional structures (768C, 786C, 784C, 768D, 786D).

Each of the via structures (786B, 786C, 786D) can be one of the lower level via structures 786 of the exemplary structure of FIG. 1, and each of the line structures (784A, (784S, 784B), 784C) can be one of the lower level metal lines 784 of the exemplary structure of FIG. 1. Thus, a metal portion such as the second via structure 786C can be formed as one of the lower level interconnect structures 780 through the opening in the silicon nitride layer 768N and directly on the metal silicide portion 784S. Each of the underlying dielectric material layer 768A, the at least one first dielectric material layer 768B, the silicon nitride layer 768N, the at least one second dielectric material layer 768C, and the overlying dielectric material layer 768D can be a component layer within the at least one lower level interconnect dielectric layer 768 of FIG. 1. The combination of the silicon nitride layer 768N and the metal silicide portion 784S constitutes a third exemplary hydrogen diffusion barrier structure that is embedded within the dielectric layer stack 760.

The metal silicide portion 784S is effective for preventing diffusion of hydrogen therethrough. A metal silicide portion 784S can be provided underneath each opening through the silicon nitride layer 768N in the exemplary structure of FIG. 1. The combination of the silicon nitride layer 768N and the metal silicide portions 784S constitutes a continuous hydrogen diffusion barrier structure without any opening therein. The combination of the silicon nitride layer 768N and the metal silicide portions 784S can continuously extend to the outermost sidewalls of the exemplary structure of FIG. 1. After formation of additional structures, another hydrogen diffusion blocking layer (such as a continuous silicon nitride layer) can be deposited directly on the outermost sidewalls of the exemplary structure, thereby extending the continuous hydrogen diffusion barrier structure to prevent diffusion of hydrogen through the sidewalls of the exemplary structure.

Figure 5E:
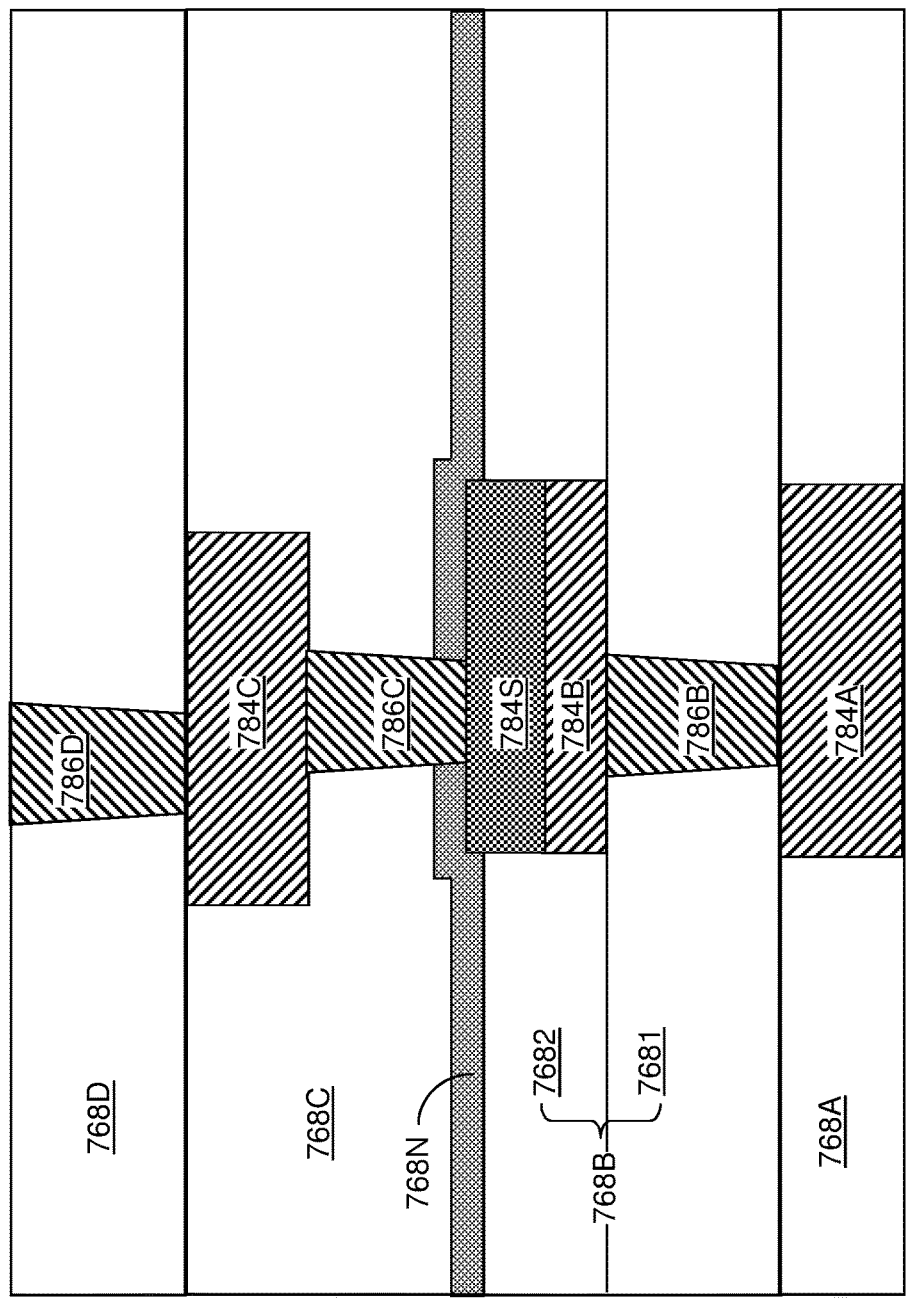
FIG. 5E is a vertical cross-sectional view of a region of the exemplary structure including a first alternative configuration for the fourth exemplary hydrogen diffusion barrier structure according to an embodiment of the present disclosure.

FIG. 5E illustrates a first alternative configuration for the fourth exemplary hydrogen diffusion barrier structure, which can be derived from the fourth exemplary hydrogen diffusion barrier structure by omitting planarization of the metal silicide portion 784S after removal of the silicon-containing semiconductor layer 787. In this case, the top surface of the silicon-containing semiconductor layer 787 can protrude above the horizontal plane including the top surface of the at least one first dielectric material layer 768B.

Figure 5F:
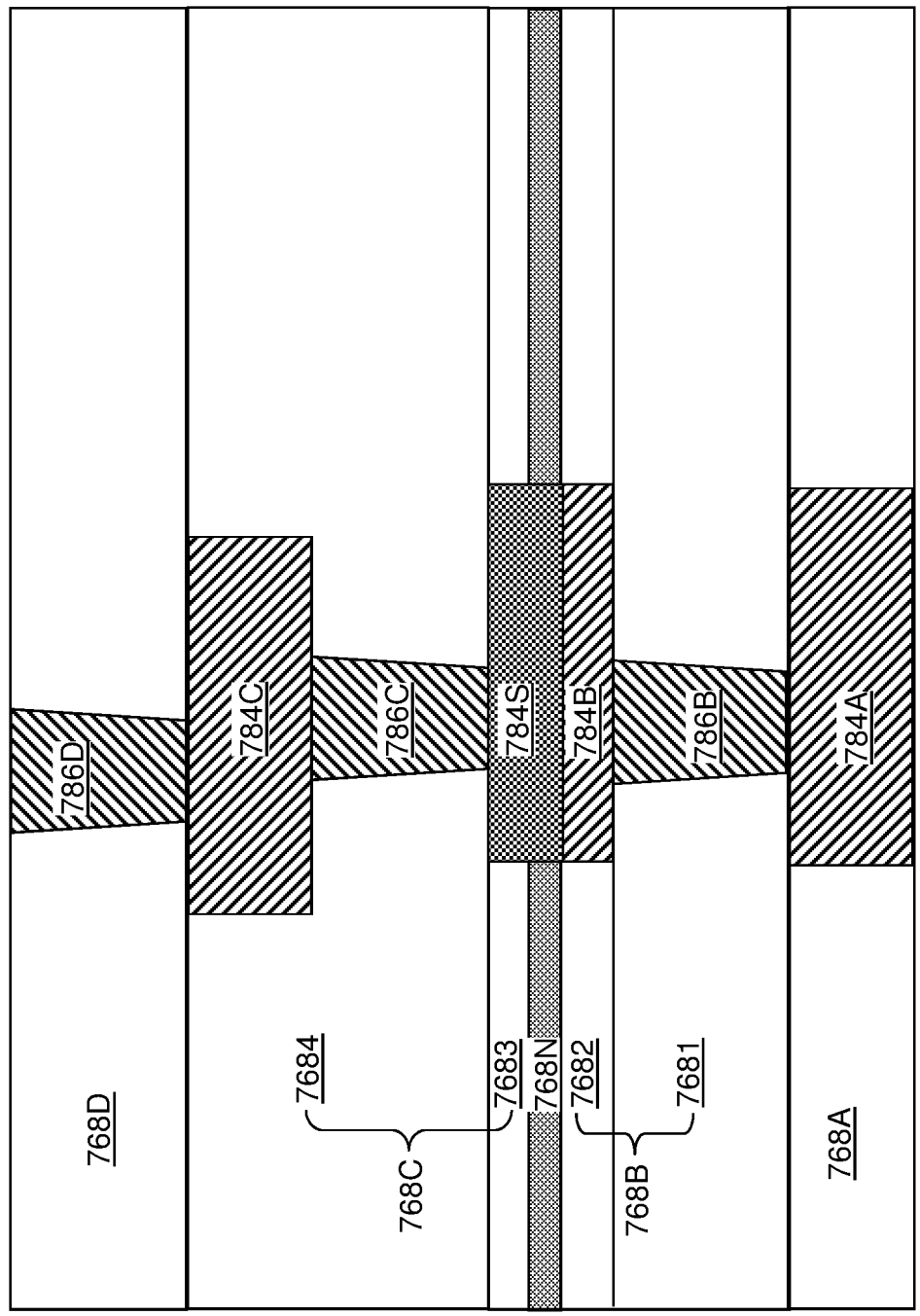
FIG. 5F is a vertical cross-sectional view of a region of the exemplary structure including a second alternative configuration for the fourth exemplary hydrogen diffusion barrier structure according to an embodiment of the present disclosure.

FIG. 5F illustrates a second alternative configuration for the fourth exemplary hydrogen diffusion barrier structure, which can be derived from the fourth exemplary hydrogen diffusion barrier structure by employing the structure of FIG. 3A instead of the structure of FIG. 2B to form a metal line portion 784B in a line cavity 783. After formation of the metal line portion 784 having a top surface that is coplanar with the top surface of the first line level dielectric material layer 7682, the processing steps of FIGS. 5A-5C and 3C can be performed to provide the structure of FIG. 5F.

FIGS. 6A-6D illustrate a region of the exemplary structure during formation of a fifth exemplary hydrogen diffusion barrier structure according to an embodiment of the present disclosure containing a hydrogen blocking silicide material liner. The illustrated region is a portion of the combination of the dielectric layer stack 760 and the lower level interconnect structures 780 in FIG. 1.

Referring to FIG. 6A, an optional underlying dielectric material layer 768A can be formed embedding an underlying line structure 784A. At least one first dielectric material layer 768B can be deposited over the combination of the underlying dielectric material layer 768A and the underlying line structure 784A. The target thickness for the at least one first dielectric material layer 768B can be the sum of the target height of a first via structure to be formed therein and the target height of a first line structure to be formed on the first via structure. Two lithographic processes and two anisotropic etch processes can be employed to form an integrated line and via cavity 785 in the at least one first dielectric material layer 768B, which includes a via cavity at a lower portion and a line cavity at an upper portion. The pattern of the via cavity or the pattern of the line cavity may be formed first in the at least one first dielectric material layer 768B depending on the integration scheme employed to pattern the line and via cavity 785. The via cavity and the line cavity are connected to each other to form the integrated line and via cavity 785.

Figure 6B:
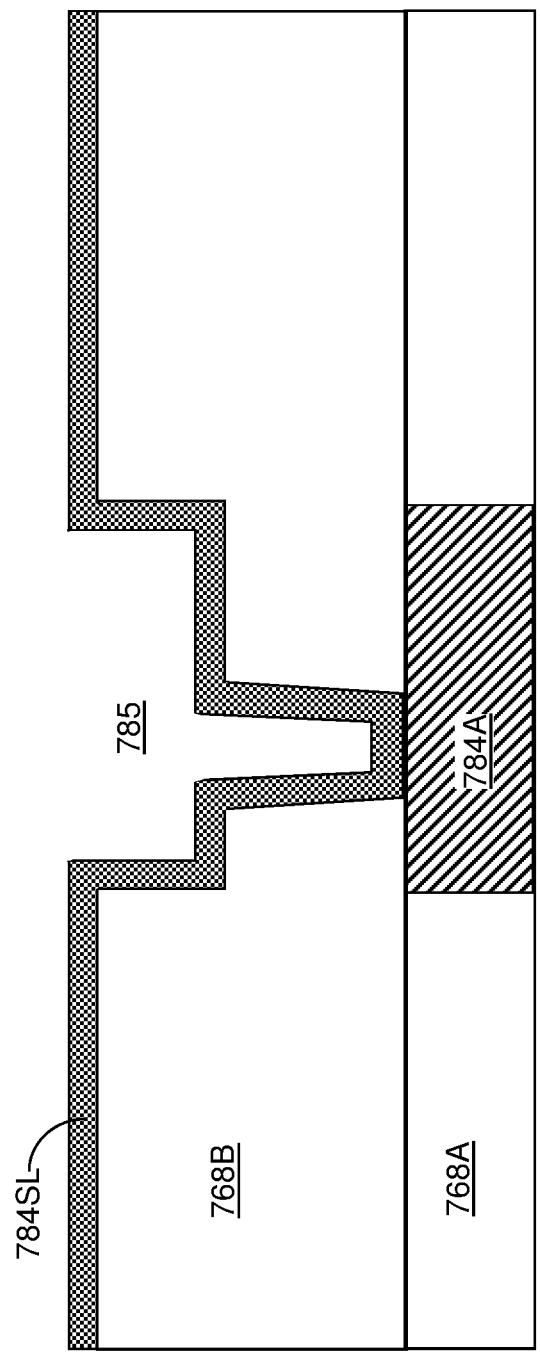

Referring to FIG. 6B, a metal silicide layer 784SL can be deposited in the line and via cavity 785 and over the top surface of the at least one first dielectric material layer 768B as a continuous material layer. The metal silicide layer 784SL can be deposited, for example, by physical vapor deposition, or can be formed by sequential deposition of a first material and a second material that can form a metal silicide material upon an anneal at an elevated temperature. In one embodiment, the first material can be a silicon-containing semiconductor material (such as amorphous silicon, polysilicon, or a silicon-germanium alloy) and the second material can be a metal. In another embodiment, the first material can be a metal and the second material can be a silicon-containing semiconductor material. In one embodiment, the metal semiconductor material can be formed by deposition of the metal silicide material. In another embodiment, the metal semiconductor material can be formed by a combination of deposition of a semiconductor material, deposition of a metal on the semiconductor material, and an anneal process that induces reaction between the semiconductor material and the metal and formation of the metal silicide material. In yet another embodiment, the metal semiconductor material can be formed by a combination of deposition of a metal into the cavity, deposition of a semiconductor material on the semiconductor material, and an anneal process that induces reaction between the semiconductor material and the metal and formation of the metal silicide material. In one embodiment, the metal semiconductor material of the metal silicide layer 784SL can be tungsten silicide. The thickness of the metal silicide layer 784SL can be in a range from 5 nm to 100 nm, such as from 10 nm to 50 nm, although lesser and greater thicknesses can also be employed.

Figure 6C:
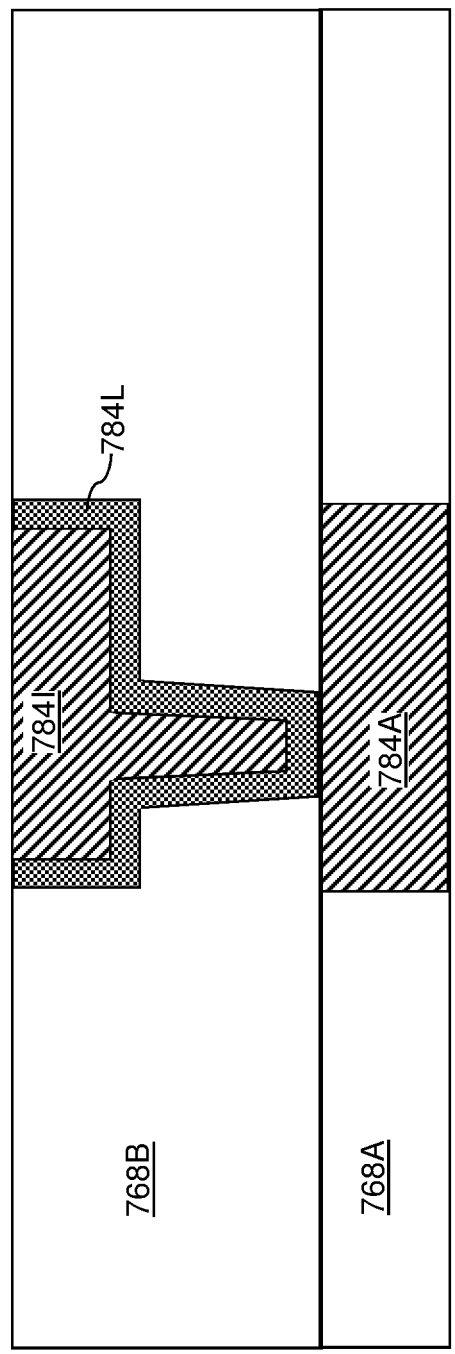

Referring to FIG. 6C, at least one metallic material can be deposited on the metal silicide layer 784SL. The at least one metallic material can include an optional metal nitride liner consisting essentially of a conductive metal nitride and a metal fill material consisting essentially of an elemental metal or an intermetallic alloy. For example, the at least one metallic material can include a TiN liner and W or Cu metal fill. The conductive metal nitride can be deposited by physical vapor deposition or chemical vapor deposition. The metal fill material can be deposited, for example, by physical vapor deposition, chemical vapor deposition, electroplating, or electroless plating.

Portions of the at least one metallic material (such as the combination of the metal fill material and the conductive metal nitride) and the metal silicide layer 784SL located over the top surface of the at least one first dielectric material layer 768B are removed by a planarization process. For example, chemical mechanical planarization (CMP) can be employed for the planarization process. A remaining portion of the metal silicide layer 784SL in the integrated line and via cavity 785 constitutes a metal silicide liner 784L, which is a metal silicide portion in the shape of a liner. A remaining portion of the at least one metallic material constitutes a line and via metal portion 784I, which includes a via portion that extends vertically and a line portion that extends horizontally and connected to a top end of the via portion. The metal silicide liner 784L and the line and via metal portion 784I collectively constitute an integrated line and via structure (784L, 784I). In this case, the metal silicide liner 784L can be formed as a liner that contacts a top surface of the underlying line structure 784A.

The metal silicide liner 784L can include the hydrogen blocking metal silicide material described above. In one embodiment, the metal silicide liner 784L can consist essentially of tungsten silicide.

Referring to FIG. 6D, a silicon nitride layer 768N is deposited on the top surfaces of the at least one first dielectric material layer 768B and the integrated line and via structure (784L, 784I). The silicon nitride layer 768N can be formed as a continuous blanket (unpatterned) material layer without any opening therein after formation of the metal silicide liner 784L. The silicon nitride layer 768N can be deposited by a conformal or non-conformal deposition process. In one embodiment, the silicon nitride layer 768N can be deposited by low pressure chemical vapor deposition (LPCVD) or plasma enhanced chemical vapor deposition (PECVD). The thickness of the silicon nitride layer 768N can be selected to be thick enough to block diffusion of hydrogen atoms therethrough. For example, the thickness of the silicon nitride layer 768N can be in a range from 3 nm to 60 nm, although lesser and greater thicknesses can also be employed.

At least one second dielectric material layer 768C can be deposited over the silicon nitride layer 768N. The at least one second dielectric material layer 768C can be formed as a single dielectric material layer or as multiple dielectric material layers. A via cavity and a line cavity can be formed through the at least one second dielectric material layer 768C, and can be filled with at least one metallic material to form a second via structure 786C and a second line structure 784C. An opening can be formed through the silicon nitride layer 768N during formation of the via cavity through the at least one second dielectric material layer 768C, and the second via structure 786C can be formed directly on the top surface of the metal silicide portion 784S, which is the first line structure. If the at least one second dielectric material layer 768C includes a second via level dielectric material layer and a second line level dielectric material layer, the second via structure 786C can be formed within the second via level dielectric material layer prior to formation of the second line level dielectric material layer, and the second line structure 784C can be formed within the second line level dielectric material layer. If the at least one second dielectric material layer 768C includes a dielectric material layer that vertically extends over the levels of the second via structure 786C and the second line structure 784C, the second via structure 786C and the second line structure 784C can be formed as an integrated line and via structure employing a dual damascene process in which a combination of a via cavity and a line cavity is simultaneously filled and planarized. Subsequently, an optional overlying dielectric material layer 768D and an optional via structure 786D and/or an integrated line and via structure can be formed through the overlying dielectric material layer 768D.

Each of the via structures (786C, 786D) and the via portion of the integrated line and via structure (784L, 784I) can be one of the lower level via structures 786 of the exemplary structure of FIG. 1, and each of the line structures (784A, 784C) and the line portion of the integrated line and via structure (784L, 784I) can be one of the lower level metal lines 784 of the exemplary structure of FIG. 1. Thus, the metal silicide liner 784L can provide a continuous surface without any opening therein and can have a closed periphery that adjoins a bottom surface of the silicon nitride layer 768N. Each of the underlying dielectric material layer 768A, the at least one first dielectric material layer 768B, the silicon nitride layer 768N, the at least one second dielectric material layer 768C, and the overlying dielectric material layer 768D can be a component layer within the at least one lower level interconnect dielectric layer 768 of FIG. 1. The combination of the silicon nitride layer 768N and the metal silicide portion 784S constitutes a fifth exemplary hydrogen diffusion barrier structure that is embedded within the dielectric layer stack 760.

The metal silicide liner 784L is effective for preventing diffusion of hydrogen therethrough. A metal silicide liner 784L can be provided underneath each opening through the silicon nitride layer 768N in the exemplary structure of FIG. 1. The combination of the silicon nitride layer 768N and the metal silicide liner 784L (which is a metal silicide portion in the shape of a liner) constitutes a continuous hydrogen diffusion barrier structure without any opening therein. The combination of the silicon nitride layer 768N and the metal silicide liners 784L can continuously extend to the outermost sidewalls of the exemplary structure of FIG. 1. After formation of additional structures, another hydrogen diffusion blocking layer (such as a continuous silicon nitride layer) can be deposited directly on the outermost sidewalls of the exemplary structure, thereby extending the continuous hydrogen diffusion barrier structure to prevent diffusion of hydrogen through the sidewalls of the exemplary structure.

Figure 6E:
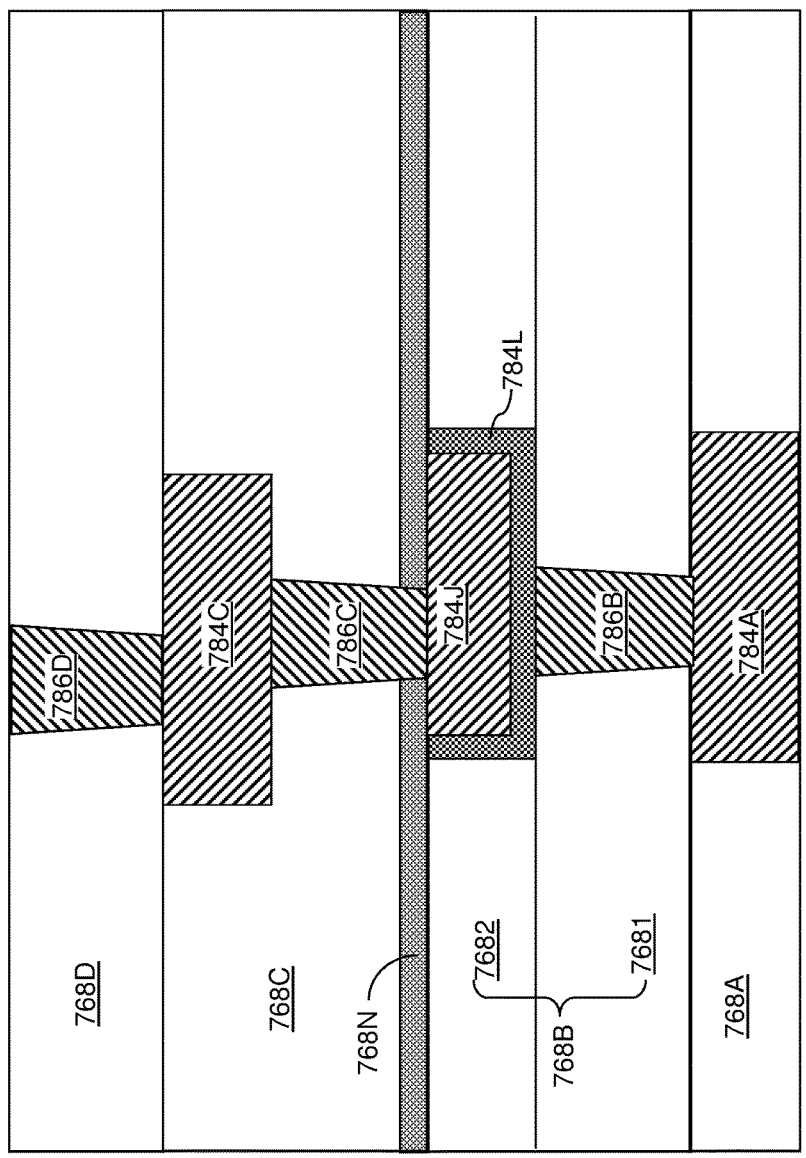
FIG. 6E is a vertical cross-sectional view of a region of the exemplary structure including a first alternative configuration for the fifth exemplary hydrogen diffusion barrier structure according to an embodiment of the present disclosure.

FIG. 6E illustrates a first alternative configuration for the fifth exemplary hydrogen diffusion barrier structure, which can be derived from the structure illustrated in FIG. 2B by performing the processing steps of FIGS. 6B-6D thereupon. A combination of a first via structure 786B and a first line structure (784J, 784L) is formed in lieu of an integrated line and via structure (784L, 784I) of FIG. 6D. The first line structure (784J, 784L) includes a metal silicide liner 784L that is formed at the bottom and at the periphery of the line cavity 783 (illustrated in FIG. 2B), and a metal portion 784J that can have the same material composition as the line and via metal portion 784I.

Each of the via structures (786B, 786C, 786D) can be one of the lower level via structures 786 of the exemplary structure of FIG. 1, and each of the line structures (784A, (784J, 784L), 784C) can be one of the lower level metal lines 784 of the exemplary structure of FIG. 1. A metal silicide liner 784L can be provided underneath each opening through the silicon nitride layer 768N in the exemplary structure of FIG. 1. The combination of the silicon nitride layer 768N and the metal silicide liner 784L (which is a metal silicide portion in the shape of a liner) constitutes a continuous hydrogen diffusion barrier structure without any opening therein. The combination of the silicon nitride layer 768N and the metal silicide liners 784L can continuously extend to the outermost sidewalls of the exemplary structure of FIG. 1. After formation of additional structures, another hydrogen diffusion blocking layer (such as a continuous silicon nitride layer) can be deposited directly on the outermost sidewalls of the exemplary structure, thereby extending the continuous hydrogen diffusion barrier structure to prevent diffusion of hydrogen through the sidewalls of the exemplary structure.

Figure 6F:
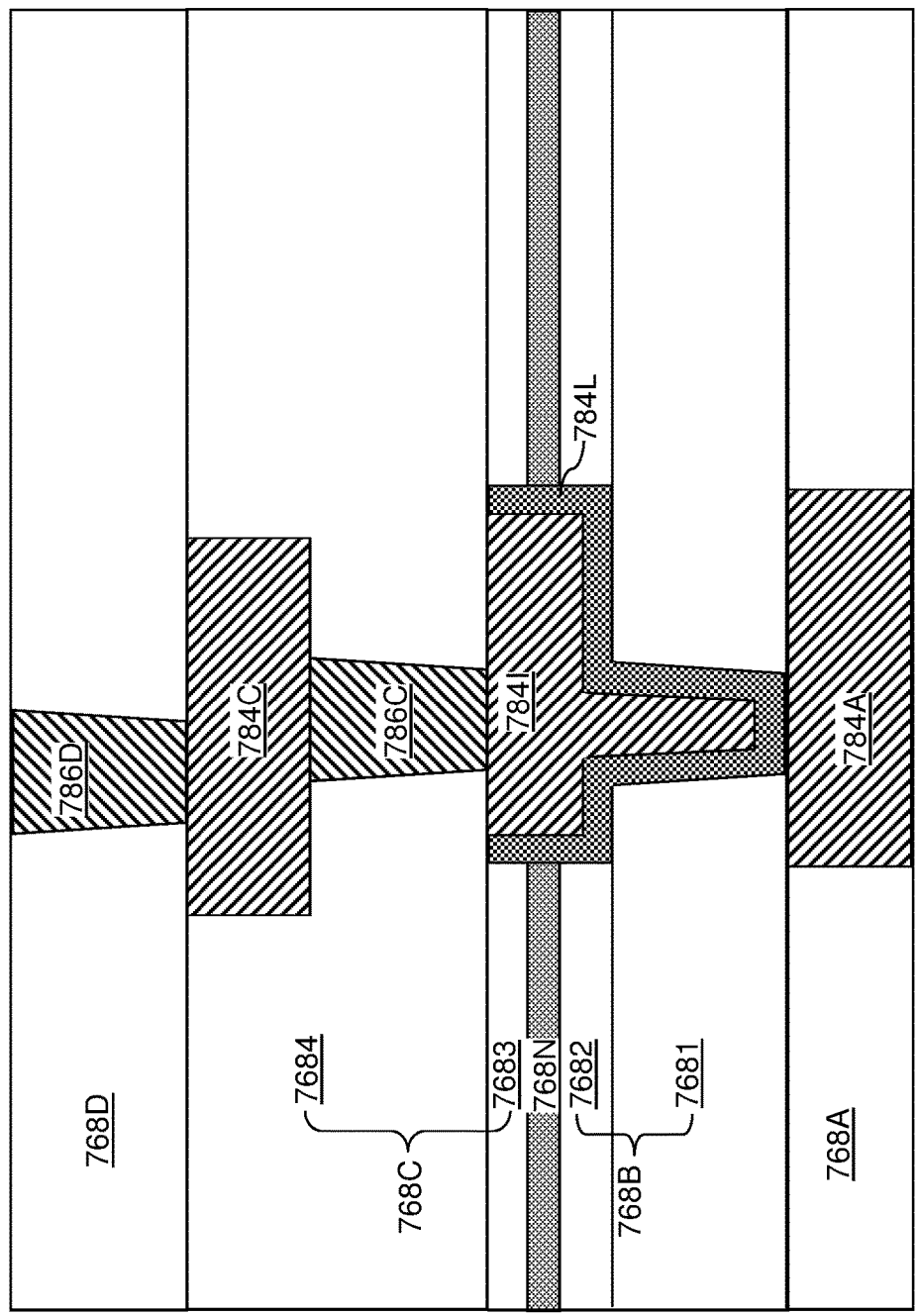
FIG. 6F is a vertical cross-sectional view of a region of the exemplary structure including a second alternative configuration for the fifth exemplary hydrogen diffusion barrier structure according to an embodiment of the present disclosure.

FIG. 6F illustrates a second alternative configuration for the fifth exemplary hydrogen diffusion barrier structure, which can be derived from the fifth exemplary hydrogen diffusion barrier structure by forming an integrated line and via cavity 785 through a vertical stack including, from bottom to top, a first via level dielectric material layer 7681, a first line level dielectric material layer 7682, a silicon nitride layer 768N, and a cap dielectric material layer 7683. The top surface of the cap dielectric material layer 7683 can be employed as a planarization stopping layer during formation of the integrated line and via structure (784I, 784L). After formation of the integrated line and via structure (784I, 784L), the processing steps of FIGS. 5A-5C and 3C can be performed to provide the structure of FIG. 5F.

Each of the via structures (786C, 786D) and the via portion of the integrated line and via structure (784L, 784I) can be one of the lower level via structures 786 of the exemplary structure of FIG. 1, and each of the line structures (784A, 784C) and the line portion of the integrated line and via structure (784L, 784I) can be one of the lower level metal lines 784 of the exemplary structure of FIG. 1. A metal silicide liner 784L can contact the entirety of sidewalls of each opening through the silicon nitride layer 768N in the exemplary structure of FIG. 1. The combination of the silicon nitride layer 768N and the metal silicide liner(s) 784L (which is a metal silicide portion in the shape of a liner) constitutes a continuous hydrogen diffusion barrier structure without any opening therein. The combination of the silicon nitride layer 768N and the metal silicide liner(s) 784L can continuously extend to the outermost sidewalls of the exemplary structure of FIG. 1. After formation of additional structures, another hydrogen diffusion blocking layer (such as a continuous silicon nitride layer) can be deposited directly on the outermost sidewalls of the exemplary structure, thereby extending the continuous hydrogen diffusion barrier structure to prevent diffusion of hydrogen through the sidewalls of the exemplary structure.

Figure 6G:
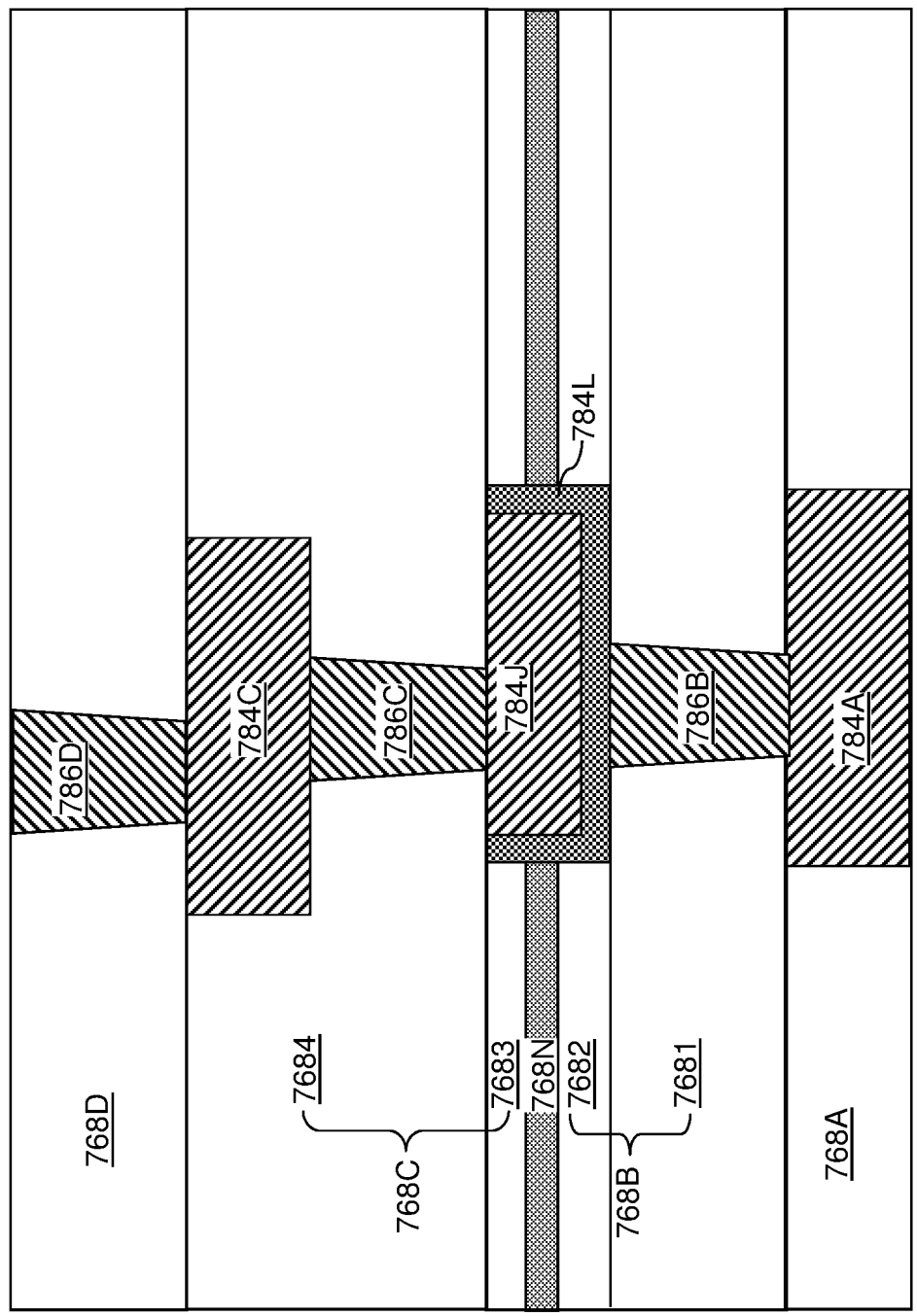
FIG. 6G is a vertical cross-sectional view of a region of the exemplary structure including a third alternative configuration for the fifth exemplary hydrogen diffusion barrier structure according to an embodiment of the present disclosure.

FIG. 6G illustrates a third alternative configuration for the fifth exemplary hydrogen diffusion barrier structure, which can be derived from the structure illustrated in FIG. 3B by performing the processing steps of FIGS. 6B-6D thereupon. A combination of a first via structure 786B and a first line structure (784J, 784L) is formed in lieu of an integrated line and via structure (784L, 784I) of FIG. 6D. The first line structure (784J, 784L) includes a metal silicide liner 784L that is formed at the bottom and at the periphery of the line cavity 783 (illustrated in FIG. 2B), and a metal portion 784J that can have the same material composition as the line and via metal portion 784I.

Each of the via structures (786B, 786C, 786D) can be one of the lower level via structures 786 of the exemplary structure of FIG. 1, and each of the line structures (784A, (784J, 784L), 784C) can be one of the lower level metal lines 784 of the exemplary structure of FIG. 1. A metal silicide liner 784L can be provided in each opening through the silicon nitride layer 768N in the exemplary structure of FIG. 1. The combination of the silicon nitride layer 768N and the metal silicide liner(s) 784L (which is a metal silicide portion in the shape of a liner) constitutes a continuous hydrogen diffusion barrier structure without any opening therein. The combination of the silicon nitride layer 768N and the metal silicide liner(s) 784L can continuously extend to the outermost sidewalls of the exemplary structure of FIG. 1. After formation of additional structures, another hydrogen diffusion blocking layer (such as a continuous silicon nitride layer) can be deposited directly on the outermost sidewalls of the exemplary structure, thereby extending the continuous hydrogen diffusion barrier structure to prevent diffusion of hydrogen through the sidewalls of the exemplary structure.

Figure 7B:
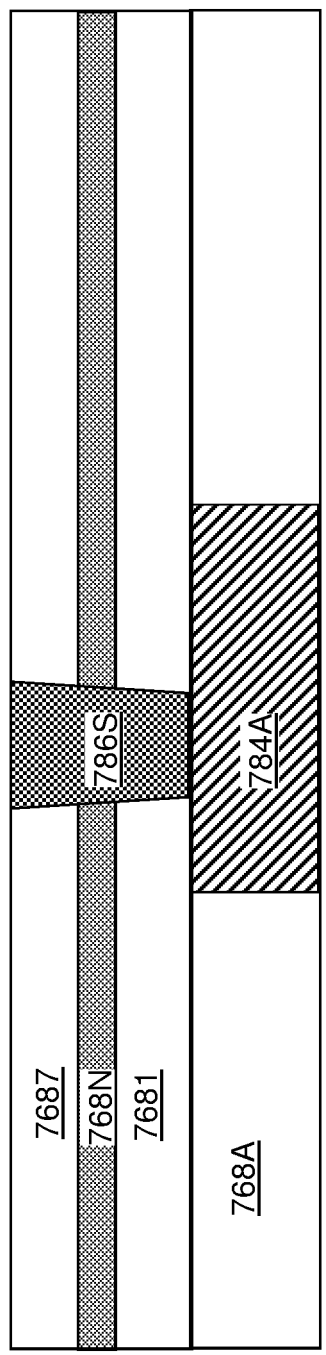
Figure 7C:
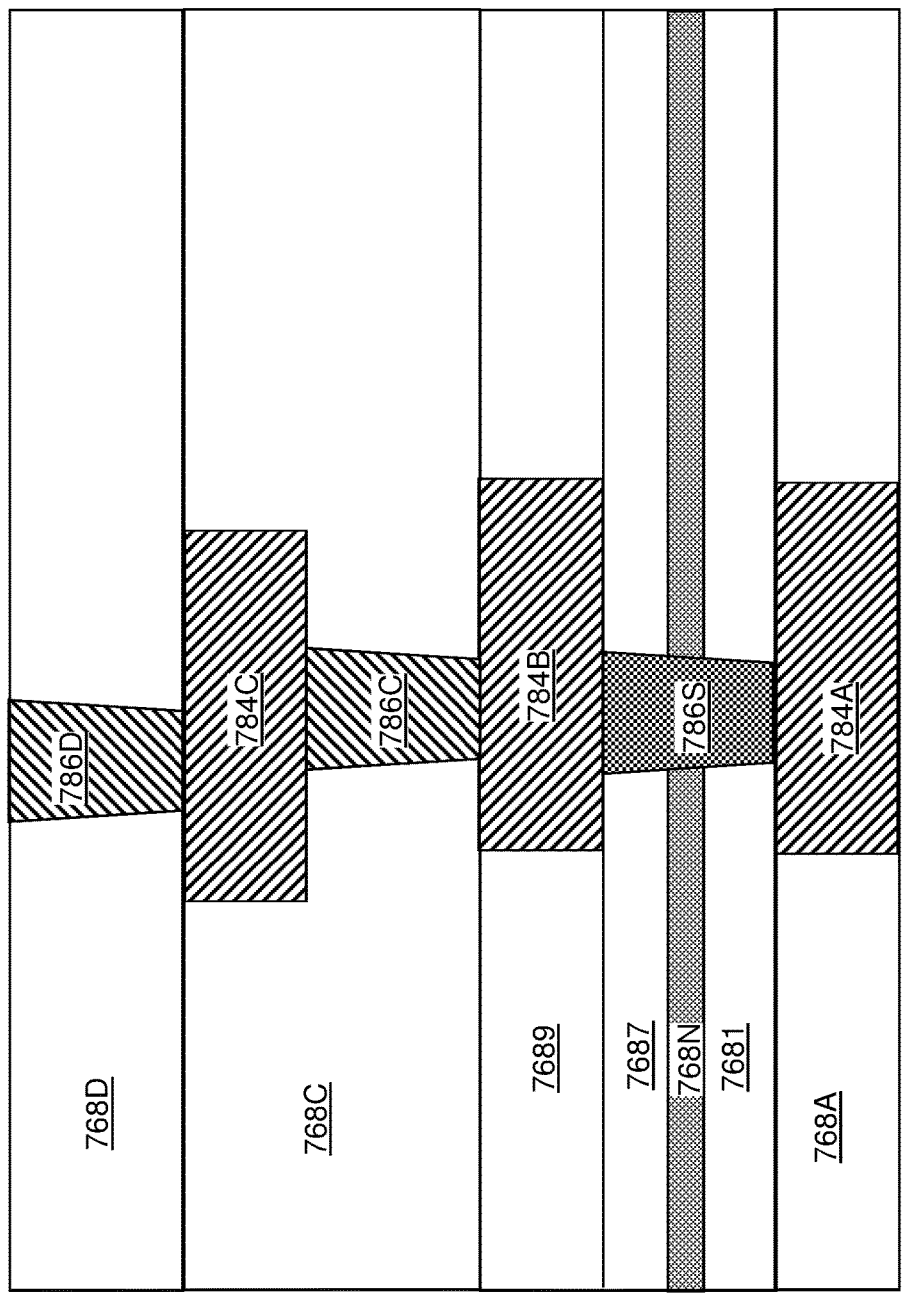

FIGS. 7A-7C illustrate a region of the exemplary structure during formation of a sixth exemplary hydrogen diffusion barrier structure according to an embodiment of the present disclosure in which the via structure comprises a hydrogen blocking silicide material. The illustrated region is a portion of the combination of the dielectric layer stack 760 and the lower level interconnect structures 780 in FIG. 1.

Referring to FIG. 7A, an underlying line structure 784A is formed in an underlying dielectric material layer 768A. A stack of a first via level dielectric material layer 7681, a silicon nitride layer 768N, and a second via level dielectric material layer 7687 can be formed over the underlying dielectric material layer 768A. A via cavity 785 extending to a top surface of the underlying line structure 784A can be formed through the stack of the first via level dielectric material layer 7681, the silicon nitride layer 768N, and the second via level dielectric material layer 7687, for example, by a combination of lithographic patterning and an anisotropic etch.

Referring to FIG. 7B, a metal silicide portion 786S can be formed in the via cavity 785. The metal silicide material can be deposited, for example, by physical vapor deposition, or can be formed by sequential deposition of a first material and a second material that can form a metal silicide material upon an anneal at an elevated temperature. In one embodiment, the first material can be a silicon-containing semiconductor material (such as amorphous silicon, polysilicon, or a silicon-germanium alloy) and the second material can be a metal. In another embodiment, the first material can be a metal and the second material can be a silicon-containing semiconductor material. In one embodiment, the metal semiconductor material in the via cavity 785 can be formed by deposition of the metal silicide material into the via cavity 785. In another embodiment, the metal semiconductor material in the via cavity 785 can be formed by a combination of deposition of a semiconductor material into the cavity, deposition of a metal on the semiconductor material, and an anneal process that induces reaction between the semiconductor material and the metal and formation of the metal silicide material. In yet another embodiment, the metal semiconductor material in the via cavity 785 can be formed by a combination of deposition of a metal into the cavity, deposition of a semiconductor material on the semiconductor material, and an anneal process that induces reaction between the semiconductor material and the metal and formation of the metal silicide material. In one embodiment, the metal semiconductor material can be tungsten silicide.

Subsequently, the metal silicide material is planarized to remove portions of the metal silicide material from the horizontal plane including the top surface of the second via level dielectric material layer 7687. A planarization process such as chemical mechanical planarization (CMP) can be employed. The remaining portion of the metal silicide material in the via cavity 785 constitutes a metal silicide portion 786S, which is a via structure. In this case, the metal silicide portion 786S can be formed as a via structure that contacts a top surface of a line structure, i.e., the underlying line structure 784A.

The metal silicide portion 786S can include the hydrogen blocking metal silicide material described above. In one embodiment, the metal silicide portion 786S can consist essentially of tungsten silicide.

Referring to FIG. 7C, a first line level dielectric material layer 7689 can a first line structure 784B can be formed over the second via level dielectric material layer 7687 and the metal silicide portion 786S, which is the first via structure. Subsequently, the processing steps of FIG. 3C can be formed to form at least one line and via level dielectric material layer 7684, a second via structure 786C, a second line structure 784C, an optional overlying dielectric material layer 768D, and an optional via structure 768D.

Each of the via structures (786S, 786C, 786D) can be one of the lower level via structures 786 of the exemplary structure of FIG. 1, and each of the line structures (784A, 784B, 784C) can be one of the lower level metal lines 784 of the exemplary structure of FIG. 1. Thus, the metal silicide portion 784S can be formed as one of the lower level interconnect structures 780 through the opening in the silicon nitride layer 768N. Each of the underlying dielectric material layer 768A, the at least one first dielectric material layer 768B, the silicon nitride layer 768N, the at least one second dielectric material layer 768C, and the overlying dielectric material layer 768D can be a component layer within the at least one lower level interconnect dielectric layer 768 of FIG. 1. The combination of the silicon nitride layer 768N and the metal silicide portion 784S constitutes a sixth exemplary hydrogen diffusion barrier structure that is embedded within the dielectric layer stack 760.

The metal silicide portion 784S is effective for preventing diffusion of hydrogen therethrough. A metal silicide portion 784S can be provided within each opening through the silicon nitride layer 768N in the exemplary structure of FIG. 1. The combination of the silicon nitride layer 768N and the metal silicide portions 784S constitutes a continuous hydrogen diffusion barrier structure without any opening therein. The combination of the silicon nitride layer 768N and the metal silicide portions 784S can continuously extend to the outermost sidewalls of the exemplary structure of FIG. 1. After formation of additional structures, another hydrogen diffusion blocking layer (such as a continuous silicon nitride layer) can be deposited directly on the outermost sidewalls of the exemplary structure, thereby extending the continuous hydrogen diffusion barrier structure to prevent diffusion of hydrogen through the sidewalls of the exemplary structure.

Figure 7D:
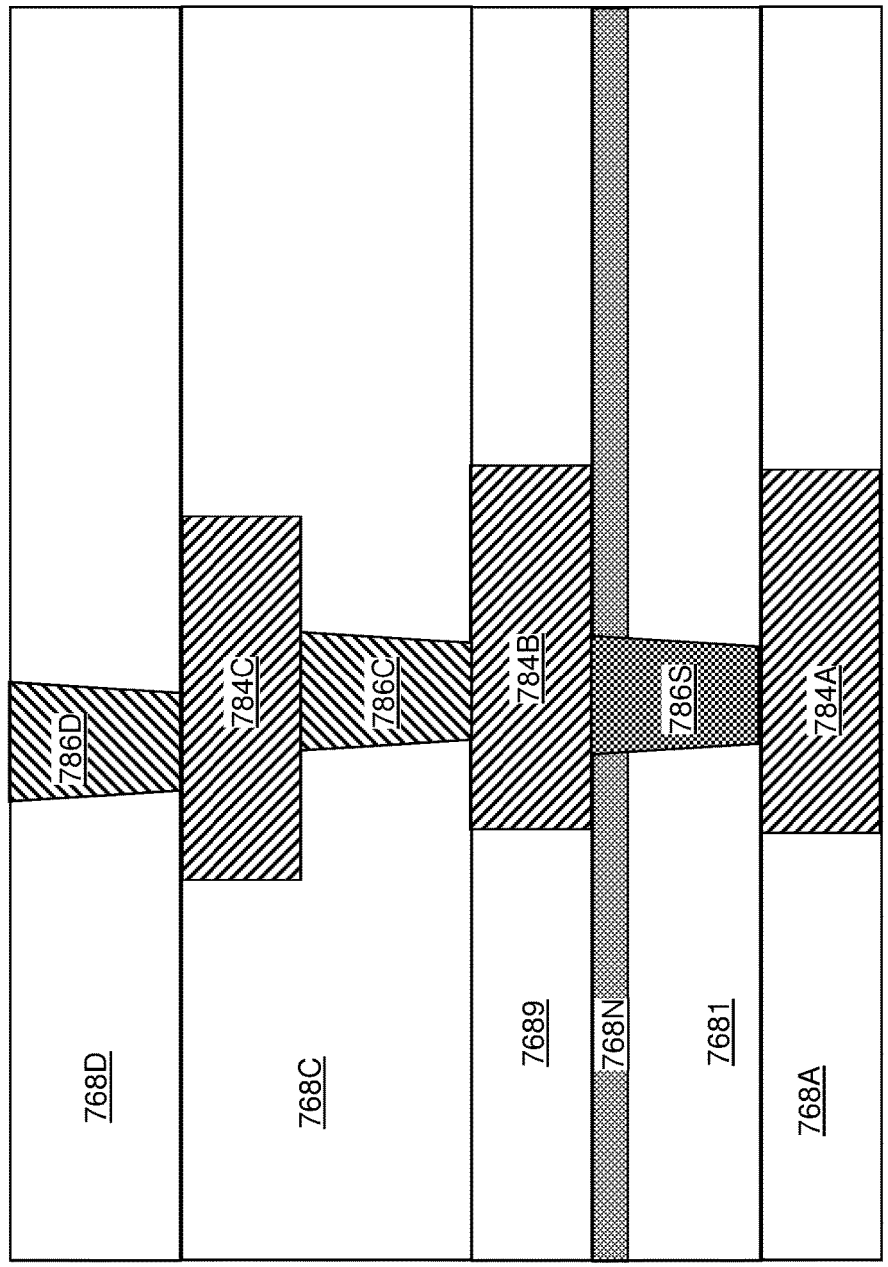
FIG. 7D is a vertical cross-sectional view of a region of the exemplary structure including an alternative configuration for the sixth exemplary hydrogen diffusion barrier structure according to an embodiment of the present disclosure.

FIG. 7D illustrates an alternative configuration for the sixth exemplary hydrogen diffusion barrier structure, which can be derived from the structure illustrated in FIG. 7C by omitting the second via level dielectric material layer 7687. In this case, the silicon nitride layer 768N can contact an upper periphery of each metal silicide portion 786S and a bottom surface of the first line structure 784B.

Figure 8:
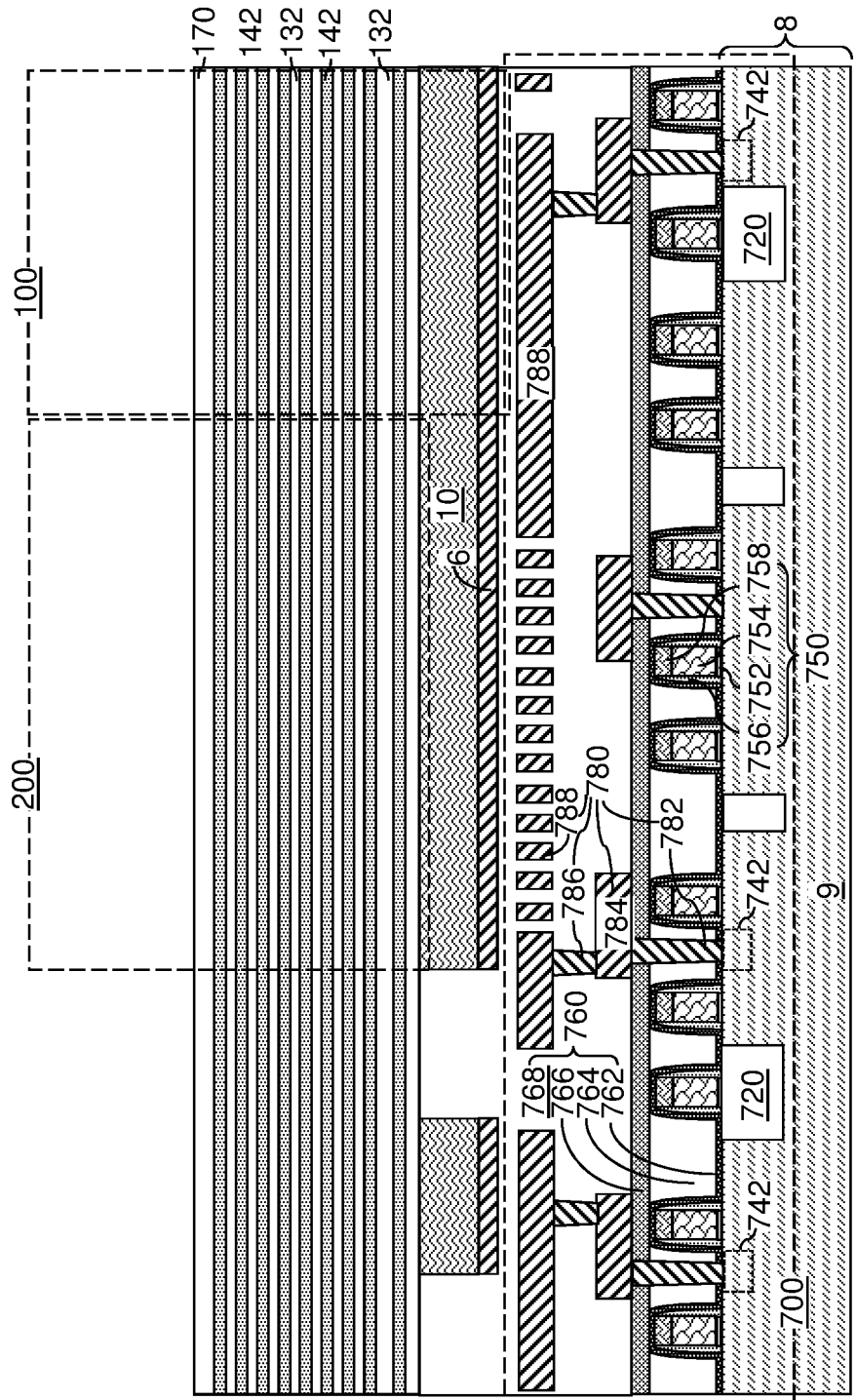
FIG. 8 is a vertical cross-sectional view of the exemplary structure after formation of a planar semiconductor material layer and a first-tier alternating stack of first insulting layers and first spacer material layers according to an embodiment of the present disclosure.

Referring to FIG. 8, an optional planar conductive material layer 6 and a planar semiconductor material layer 10 can be formed over the underlying peripheral device region 700. The optional planar conductive material layer 6 includes a conductive material such as a metal or a heavily doped semiconductor material. The optional planar conductive material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar conductive material layer 6. Layer 6 may function as a special source line in the completed device. Alternatively, layer 6 may comprise an etch stop layer and may comprise any suitable conductive, semiconductor or insulating layer.

The planar semiconductor material layer 10 can be formed over the at least one lower level dielectric layer 760. The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a polycrystalline semiconductor material (such as polysilicon), or an amorphous semiconductor material (such as amorphous silicon) that is converted into a polycrystalline semiconductor material in a subsequent processing step (such as an anneal step). The planar semiconductor material layer 10 can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 9). In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type. A dielectric pad layer 52 can be formed on the top surface of the planar semiconductor material layer 10.

An alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 9:
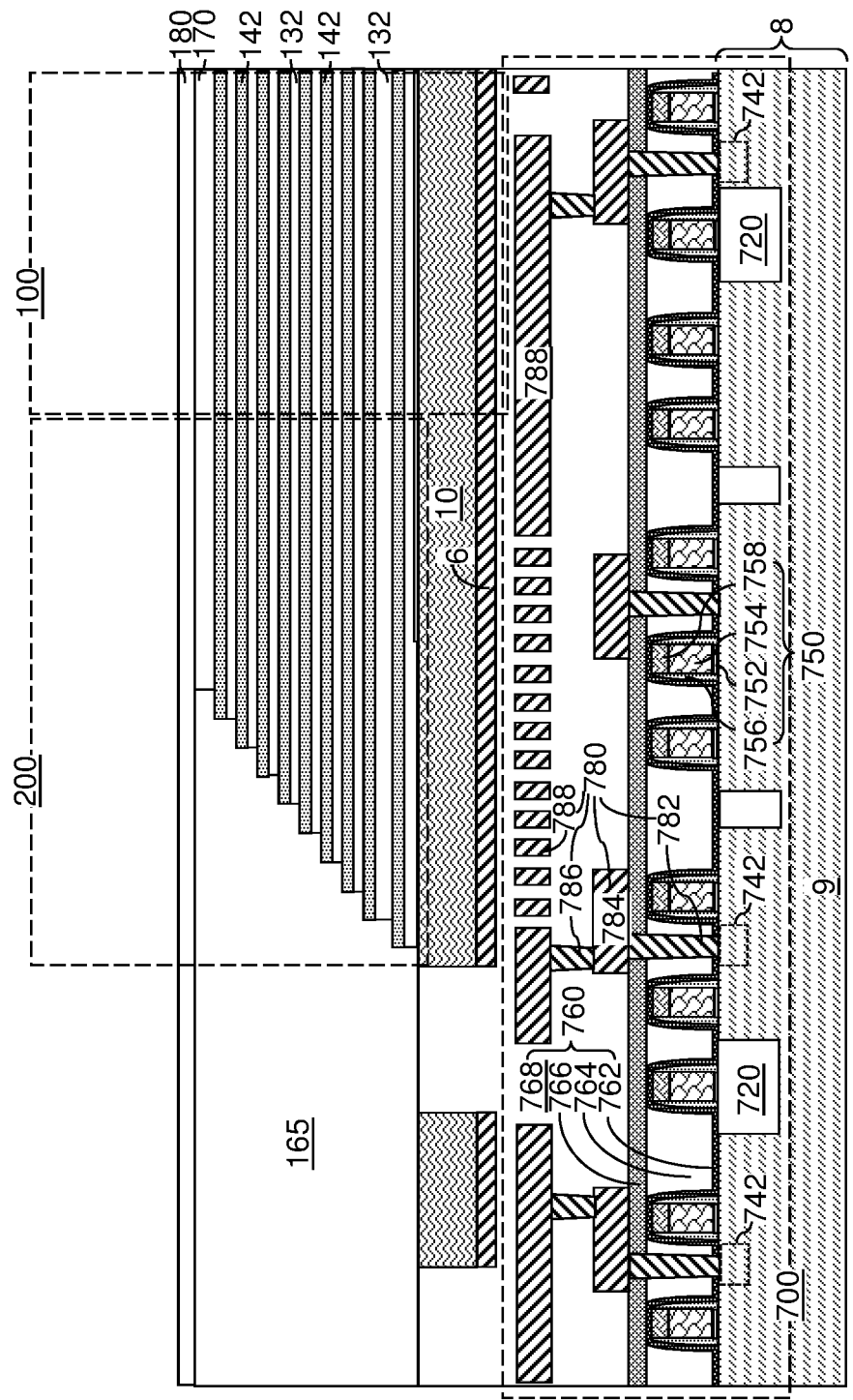
FIG. 9 is a vertical cross-sectional view of the exemplary structure after patterning first-tier staircase regions on the first-tier alternating stack and forming a first-tier retro-stepped dielectric material portion according to an embodiment of the present disclosure.

Referring to FIG. 9, the first insulating cap layer 170 and the first-tier alternating stack (132, 142) can be patterned to form first stepped surfaces in the word line contact via region 200. The word line contact via region 200 can include a respective first stepped area in which the first stepped surfaces are formed, and a second stepped area in which additional stepped surfaces are to be subsequently formed in a second tier structure (to be subsequently formed over a first tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. A dielectric material can be deposited to fill the first stepped cavity to form a first-tier retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first-tier retro-stepped dielectric material portion 165 collectively constitute a first tier structure, which is an in-process structure that is subsequently modified.

Figure 10A:
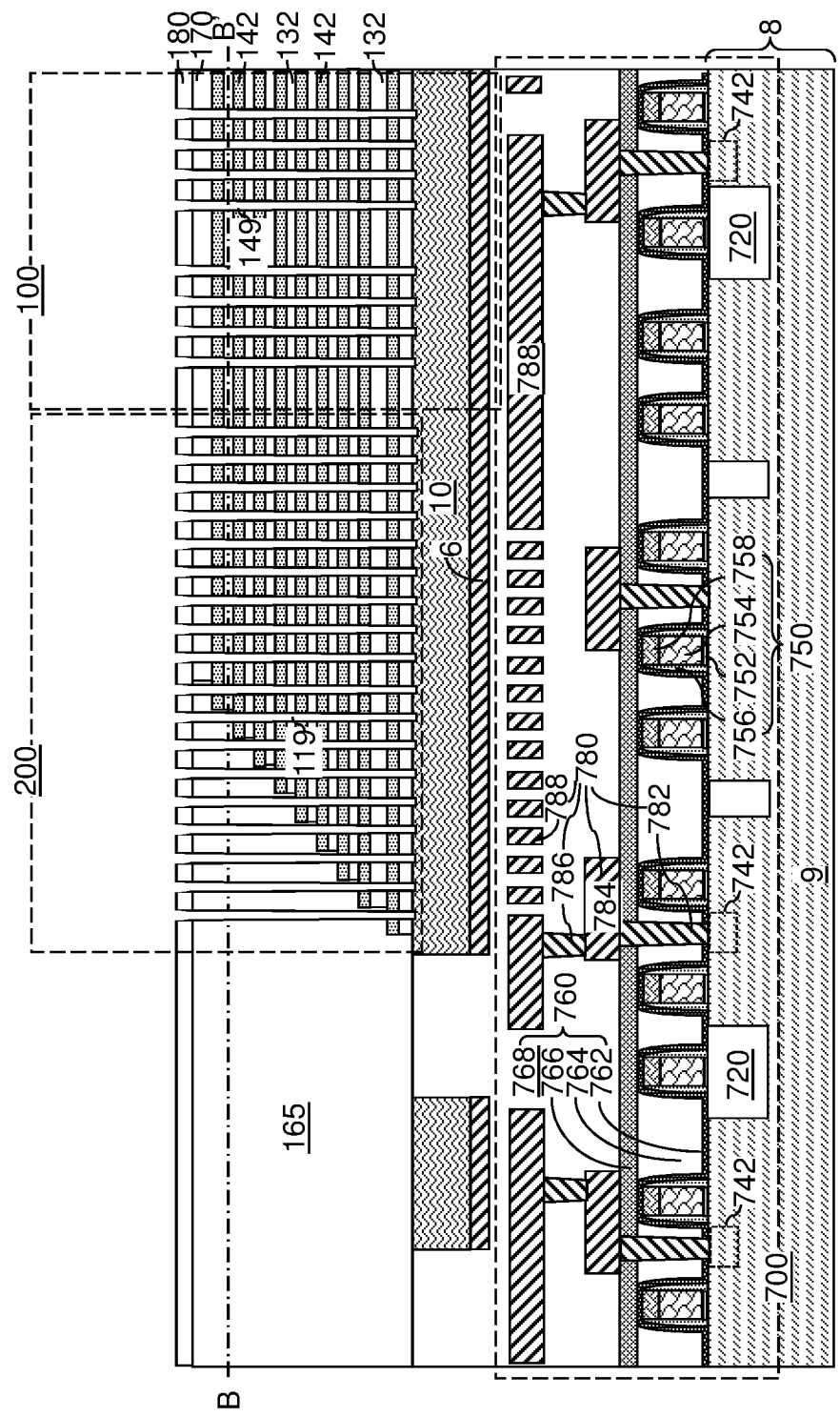
FIG. 10A is a vertical cross-sectional view of the exemplary structure after formation of first-tier memory openings and first tier support openings according to an embodiment of the present disclosure.
Figure 10B:
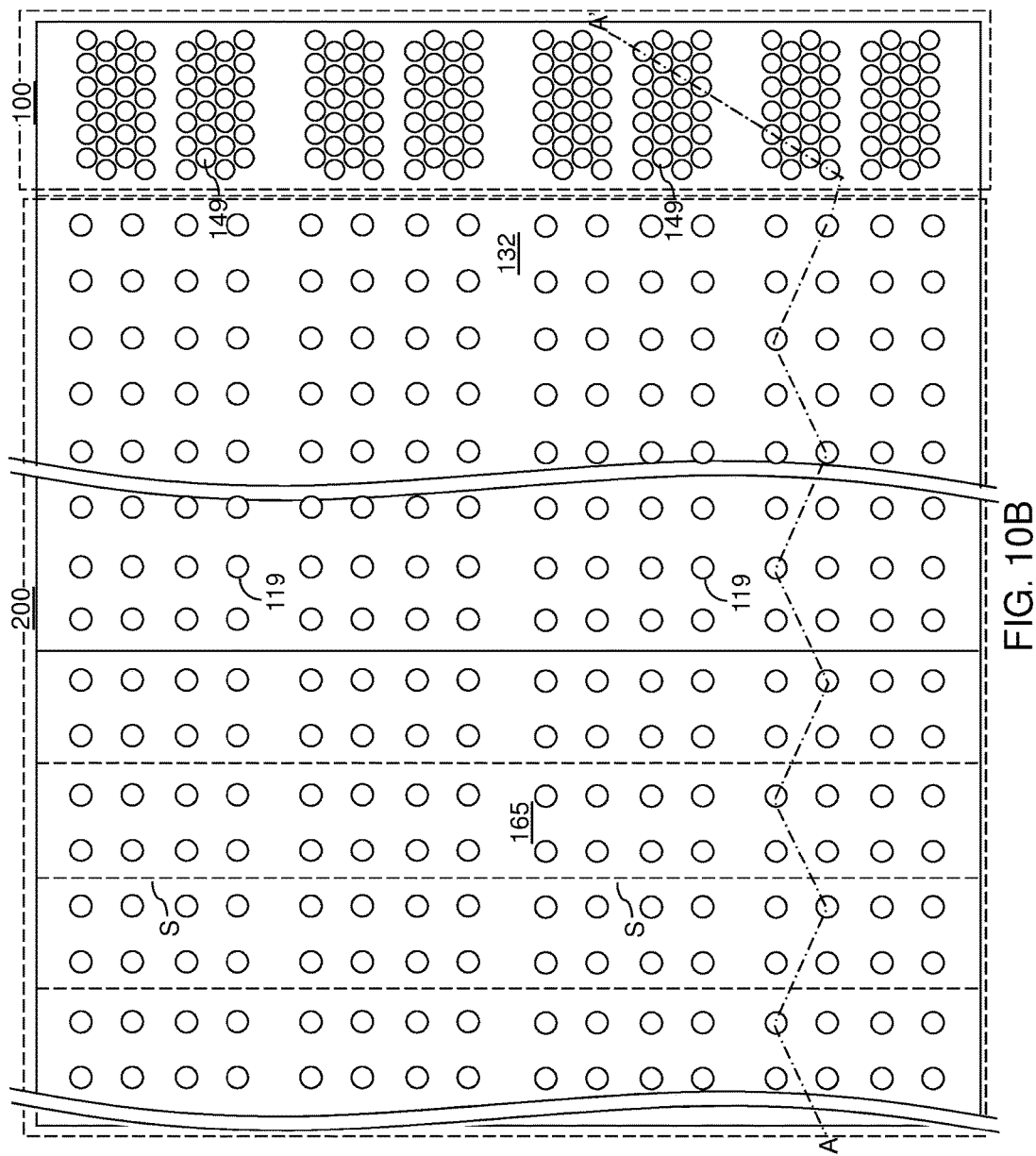
FIG. 10B is a horizontal cross-sectional view of the exemplary structure along the horizontal plane B-B' in FIG. 10A. The zig-zag vertical plane A-A' corresponds to the plane of the vertical cross-sectional view of FIG. 10A.

Referring to FIGS. 10A and 10B, an inter-tier dielectric layer 180 may be optionally deposited over the first tier structure (132, 142, 165, 170). The inter-tier dielectric layer 180 includes a dielectric material such as silicon oxide. The thickness of the inter-tier dielectric layer 180 can be in a range from 30 nm to 300 nm, although lesser and greater thicknesses can also be employed. Locations of steps S in the first-tier alternating stack (132, 142) are illustrated as dotted lines.

First-tier memory openings 149 and first tier support openings 119 can be formed. The first-tier memory openings 149 and the first-tier support openings 119 extend through the first-tier alternating stack (132, 142) at least to a top surface of the planar semiconductor material layer 10. The first-tier memory openings 149 can be formed in the memory array region 100 at locations at which memory stack structures including vertical stacks of memory elements are to be subsequently formed. The first-tier support openings 119 can be formed in the word line contact via region 200. For example, a lithographic material stack (not shown) including at least a photoresist layer can be formed over the first insulating cap layer 170 (and the optional inter-tier dielectric layer 180, if present), and can be lithographically patterned to form openings within the lithographic material stack. The pattern in the lithographic material stack can be transferred through the first insulating cap layer 170 (and the optional inter-tier dielectric layer 180), and through the entirety of the first-tier alternating stack (132, 142) by at least one anisotropic etch that employs the patterned lithographic material stack as an etch mask. Portions of the first insulating cap layer 170 (and the optional inter-tier dielectric layer 180), and the first-tier alternating stack (132, 142) underlying the openings in the patterned lithographic material stack are etched to form the first-tier memory openings 149 and the first-tier support openings 119. In other words, the transfer of the pattern in the patterned lithographic material stack through the first insulating cap layer 170 and the first-tier alternating stack (132, 142) forms the first-tier memory openings 149 and the first-tier support openings 119.

In one embodiment, the chemistry of the anisotropic etch process employed to etch through the materials of the first-tier alternating stack (132, 142) can alternate to optimize etching of the first and second materials in the first-tier alternating stack (132, 142). The anisotropic etch can be, for example, a series of reactive ion etches or a single etch (e.g., $CF_4/O_2/Ar$ etch). The sidewalls of the first-tier memory openings 149 and the support openings 119 can be substantially vertical, or can be tapered. Subsequently, the patterned lithographic material stack can be subsequently removed, for example, by ashing.

Optionally, the portions of the first-tier memory openings 149 and the first-tier support openings 119 at the level of the inter-tier dielectric layer 180 can be laterally expanded by an isotropic etch. For example, if the inter-tier dielectric layer 180 comprises a dielectric material (such as borosilicate glass) having a greater etch rate than the first insulating layers 132 (that can include undoped silicate glass), an isotropic etch (such as a wet etch employing HF) can be employed to expand the lateral dimensions of the first-tier memory openings at the level of the inter-tier dielectric layer 180. The portions of the first-tier memory openings 149 (and the first-tier support openings 119) located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 11:
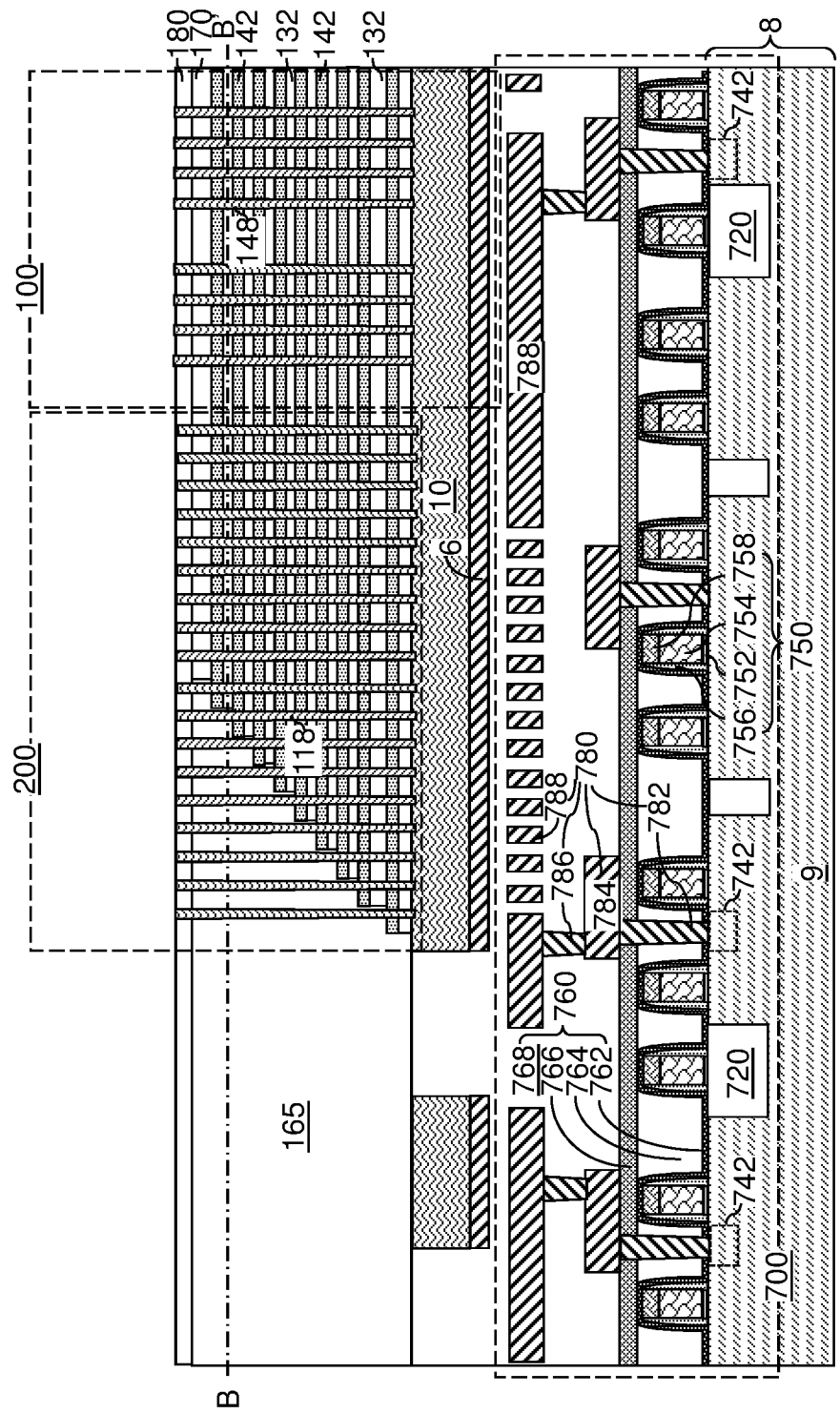
FIG. 11 is a vertical cross-sectional view of the exemplary structure after formation of sacrificial memory opening fill portions and sacrificial support opening fill portions according to an embodiment of the present disclosure.

Referring to FIG. 11, sacrificial memory opening fill portions 148 can be formed in the first-tier memory openings 149, and sacrificial support opening fill portions 118 can be formed in the first-tier support openings 119. For example, a sacrificial fill material layer is deposited in the first-tier memory openings 149 and the first-tier support openings 119. The sacrificial fill material layer includes a sacrificial material which can be subsequently removed selective to the materials of the first insulator layers 132 and the first sacrificial material layers 142. In one embodiment, the sacrificial fill material layer can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer having a thickness in a range from 1 nm to 3 nm) may be employed prior to depositing the sacrificial fill material layer. The sacrificial fill material layer may be formed by a non-conformal deposition or a conformal deposition method. In another embodiment, the sacrificial fill material layer can include amorphous silicon or a carbon-containing material (such as amorphous carbon or diamond-like carbon) that can be subsequently removed by ashing.

Portions of the deposited sacrificial material can be removed from above the first insulating cap layer 170 (and the optional inter-tier dielectric layer 180, if present). For example, the sacrificial fill material layer can be recessed to a top surface of the first insulating cap layer 170 (and the optional inter-tier dielectric layer 180) employing a planarization process. The planarization process can include a recess etch, chemical mechanical planarization (CMP), or a combination thereof. The top surface of the first insulating layer 170 (and optionally layer 180 if present) can be employed as an etch stop layer or a planarization stop layer. Each remaining portion of the sacrificial material in a first-tier memory opening 149 constitutes a sacrificial memory opening fill portion 148. Each remaining portion of the sacrificial material in a first-tier support opening 119 constitutes a sacrificial support opening fill portion 118. The top surfaces of the sacrificial memory opening fill portions 148 and the sacrificial support opening fill portions 118 can be coplanar with the top surface of the inter-tier dielectric layer 180 (or the first insulating cap layer 170 if the inter-tier dielectric layer 180 is not present). The sacrificial memory opening fill portion 148 and the sacrificial support opening fill portions 118 may, or may not, include cavities therein.

Figure 12:
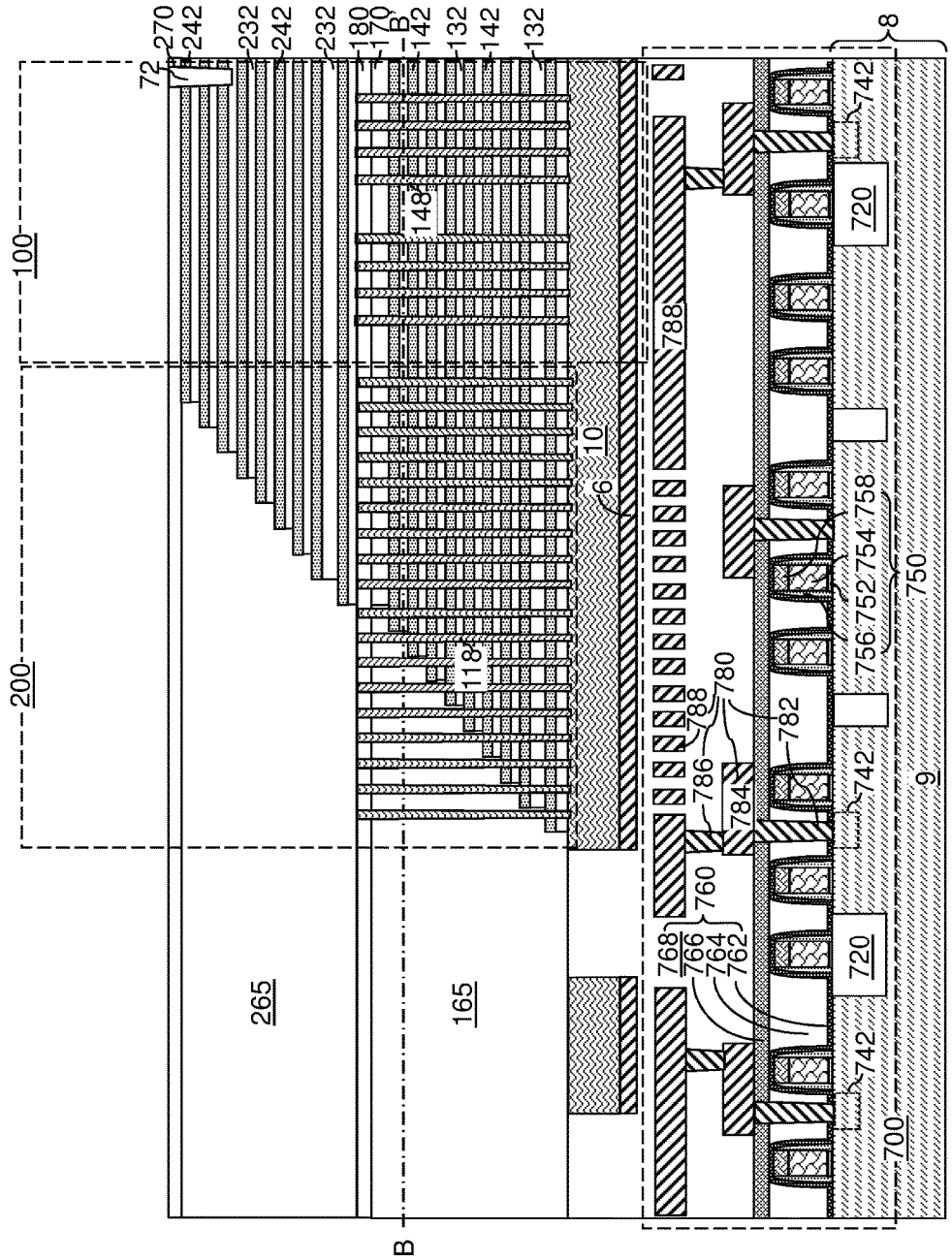
FIG. 12 is a vertical cross-sectional view of the exemplary structure after formation of a second-tier alternating stack of second insulating layers and second spacer material layers, a second-tier retro-stepped dielectric material portion, and a second insulating cap layer according to an embodiment of the present disclosure.

Referring to FIG. 12, a second tier structure can be formed over the first tier structure (132, 142, 170, 148, 118). The second tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces in the second stepped area can be formed in the word line contact via region 200 employing a same set of processing steps as the processing steps employed to form the first stepped surfaces in the first stepped area with suitable adjustment to the pattern of at least one masking layer. A second-tier retro-stepped dielectric material portion 265 can be formed over the second stepped surfaces in the word line contact via region 200.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the planar semiconductor material layer 10, and at least one retro-stepped dielectric material portion (165, 265) can be formed over the staircase regions on the at least one alternating stack (132, 142, 232, 242).

Optionally, drain-select-level shallow trench isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level shallow trench isolation structures 72 include a dielectric material such as silicon oxide.

Figure 13A:
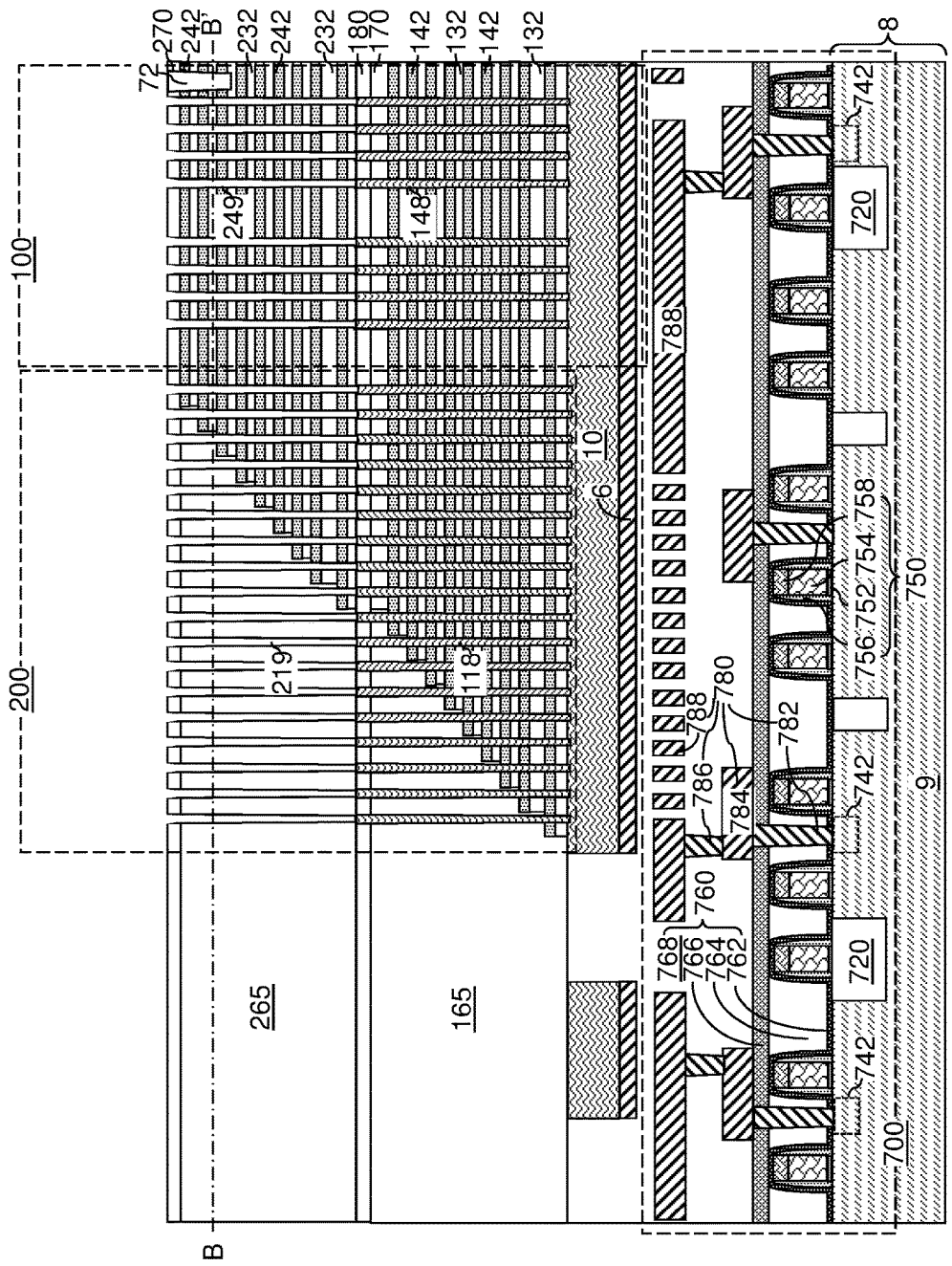
FIG. 13A is a vertical cross-sectional view of the exemplary structure after formation of inter-tier memory openings and inter-tier support openings according to an embodiment of the present disclosure.
Figure 13B:
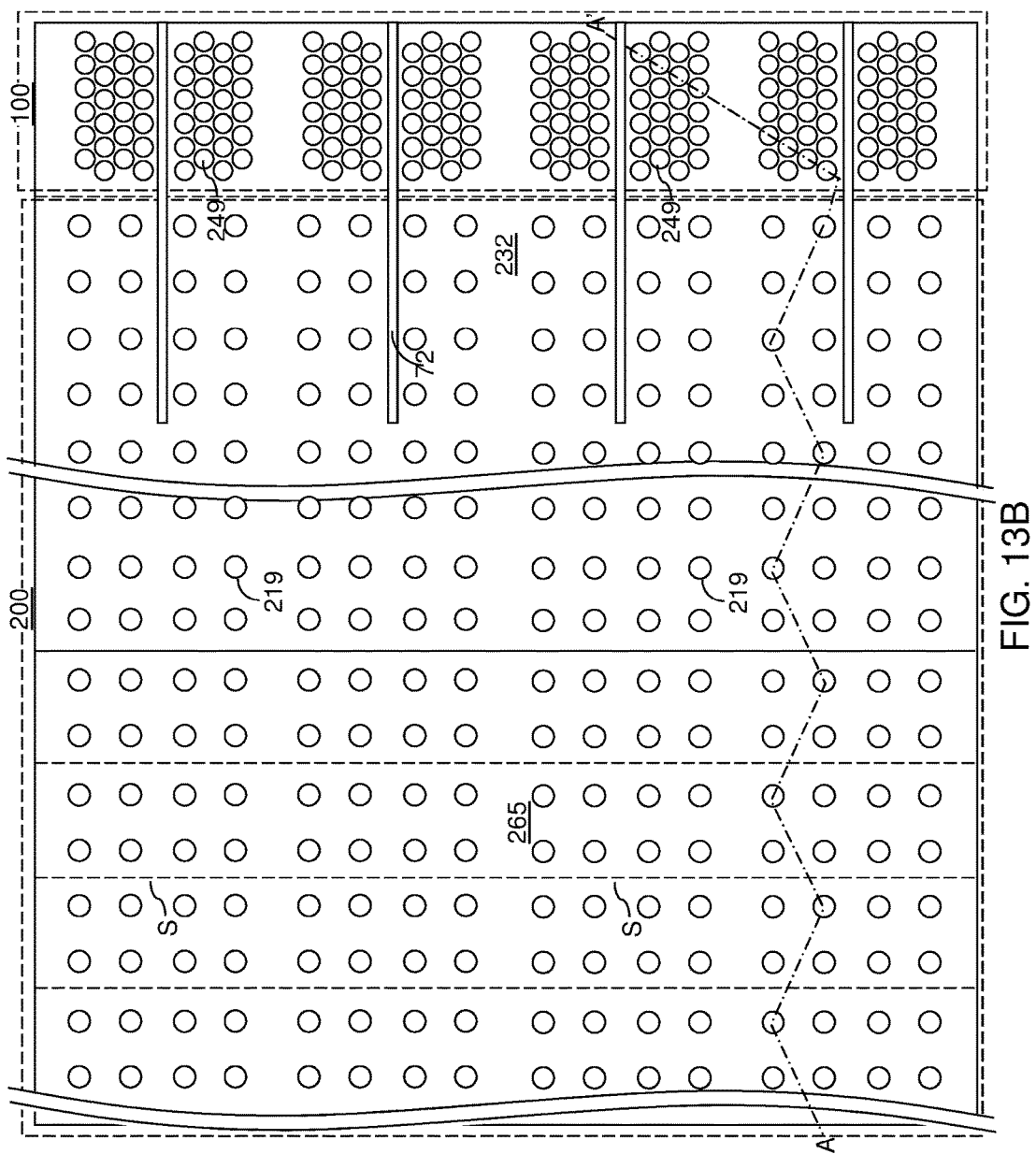
FIG. 13B is a horizontal cross-sectional view of the exemplary structure along the horizontal plane B-B' in FIG. 13A. The zig-zag vertical plane A-A' corresponds to the plane of the vertical cross-sectional view of FIG. 13A.

Referring to FIGS. 13A and 13B, second-tier memory openings 249 and second tier support openings 219 extending through the second tier structure (232, 242, 270, 265) are formed in areas overlying the sacrificial memory opening fill portions 148. A photoresist layer can be applied over the second tier structure (232, 242, 270, 265), and can be lithographically patterned to form a same pattern as the pattern of the sacrificial memory opening fill portions 148 and the sacrificial support opening fill portions 118, i.e., the pattern of the first-tier memory openings 149 and the first-tier support openings 119. Thus, the lithographic mask employed to pattern the first-tier memory openings 149 and the first-tier support openings 119 can be employed to pattern the second-tier memory openings 249 and the second-tier support openings 219. An anisotropic etch can be performed to transfer the pattern of the lithographically patterned photoresist layer through the second tier structure (232, 242, 270, 265). In one embodiment, the chemistry of the anisotropic etch process employed to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process.

A top surface of an underlying sacrificial memory opening fill portion 148 can be physically exposed at the bottom of each second-tier memory opening 249. A top surface of an underlying sacrificial support opening fill portion 118 can be physically exposed at the bottom of each second-tier support opening 219. After the top surfaces of the sacrificial memory opening fill portions 148 and the sacrificial support opening fill portions 118 are physically exposed, an etch process can be performed, which removes the sacrificial material of the sacrificial memory opening fill portions 148 and the sacrificial support opening fill portions 118 selective to the materials of the second-tier alternating stack (232, 242) and the first-tier alternating stack (132, 142) (e.g., $C_4F_8/O_2$/Ar etch).

Upon removal of the sacrificial memory opening fill portions 148, each vertically adjoining pair of a second-tier memory opening 249 and a first-tier memory opening 149 forms a continuous cavity that extends through the first-tier alternating stack (132, 142) and the second-tier alternating stack (232, 242). Likewise, upon removal of the sacrificial support opening fill portions 118, each vertically adjoining pair of a second-tier support opening 219 and a first-tier support opening 119 forms a continuous cavity that extends through the first-tier alternating stack (132, 142) and the second-tier alternating stack (232, 242). The continuous cavities are herein referred to as memory openings (or inter-tier memory openings) and support openings (or inter-tier support openings), respectively. A top surface of the planar semiconductor material layer 10 can be physically exposed at the bottom of each memory opening and at the bottom of each support openings. Locations of steps S in the first-tier alternating stack (132, 142) and the second-tier alternating stack (232, 242) are illustrated as dotted lines.

Figure 14:
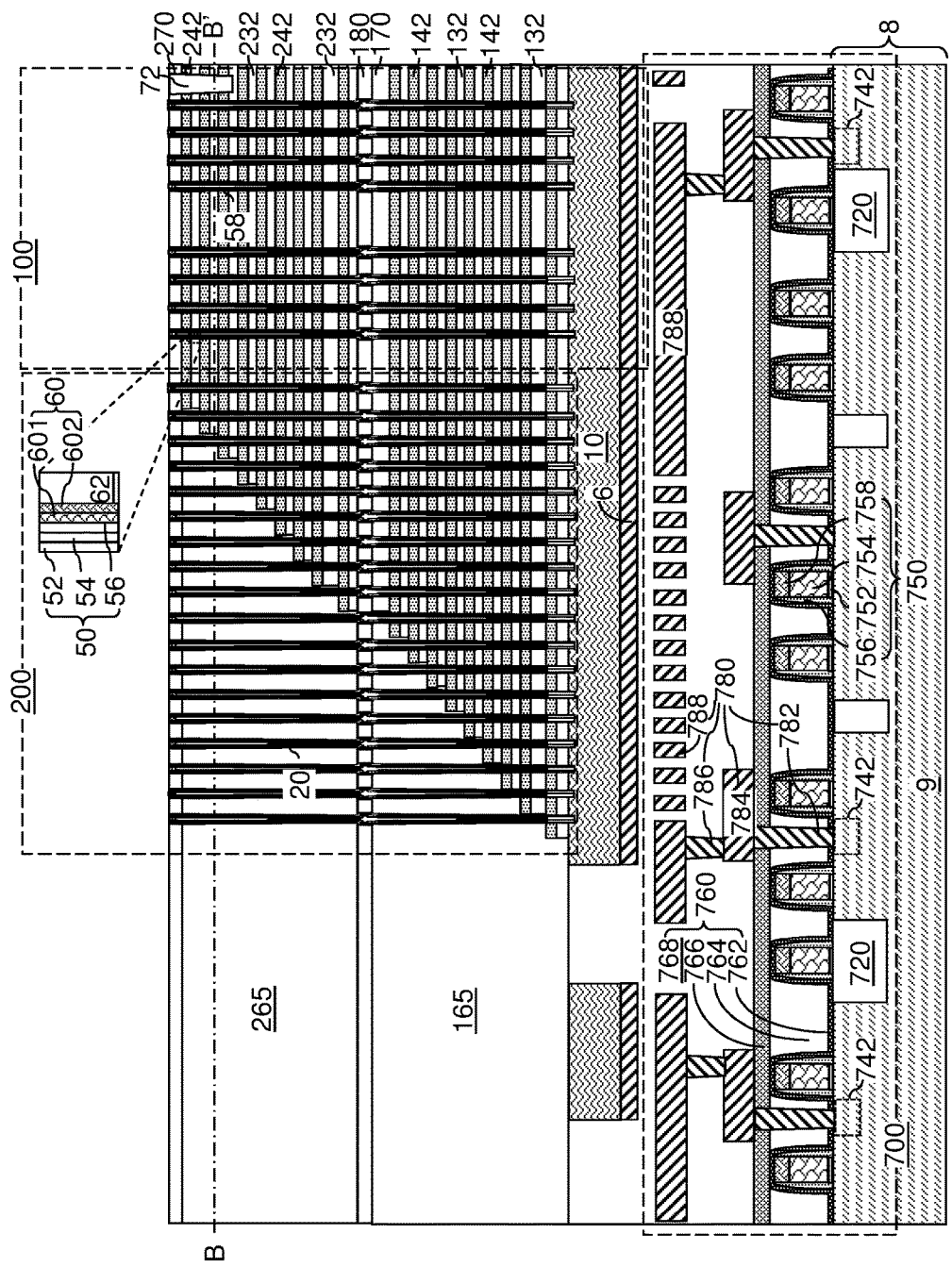
FIG. 14 is a vertical cross-sectional view of the exemplary structure after formation of memory stack structures according to an embodiment of the present disclosure.

Referring to FIG. 14, memory opening fill structures 58 are formed within each memory opening, and support pillar structures 20 are formed within each support opening. The memory opening fill structures 58 and the support pillar structures 20 can include a same set of components, and can be formed simultaneously.

FIGS. 15A-15H provide sequential cross-sectional views of a memory opening 49 or a support opening (119, 219) during formation of a memory opening fill structure 58 or a support pillar structure 20. While a structural change in a memory opening 49 is illustrated in FIGS. 15A-15H, it is understood that the same structural change occurs in each memory openings 49 and in each of the support openings (119, 219) during the same set of processing steps.

Referring to FIG. 15A, a memory opening 49 in the exemplary device structure of FIG. 14 is illustrated. The memory opening 49 extends through the first tier structure and the second tier structure. Likewise, each support opening (119, 219) extends through the first tier structure and the second tier structure.

Referring to FIG. 15B, an optional pedestal channel portion (e.g., an epitaxial pedestal) 11 can be formed at the bottom portion of each memory opening 49 and each support openings (119, 219), for example, by a selective semiconductor deposition process. In one embodiment, the pedestal channel portion 11 can be doped with electrical dopants of the same conductivity type as the planar semiconductor material layer 10. In one embodiment, at least one source select gate electrode can be subsequently formed by replacing each sacrificial material layer 42 located below the horizontal plane including the top surfaces of the pedestal channel portions 11 with a respective conductive material layer. A cavity 49' is present in the unfilled portion of the memory opening 49 (or of the support opening) above the pedestal channel portion 11. In one embodiment, the pedestal channel portion 11 can comprise single crystalline silicon. In one embodiment, the pedestal channel portion 11 can have a doping of the same as the conductivity type of the planar semiconductor material layer 10.

Referring to FIG. 15C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 15D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the second insulating cap layer 270 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers (142, 242) constitutes a charge storage region.

A surface of the pedestal channel portion 11 (or a surface of the planar semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 15F:
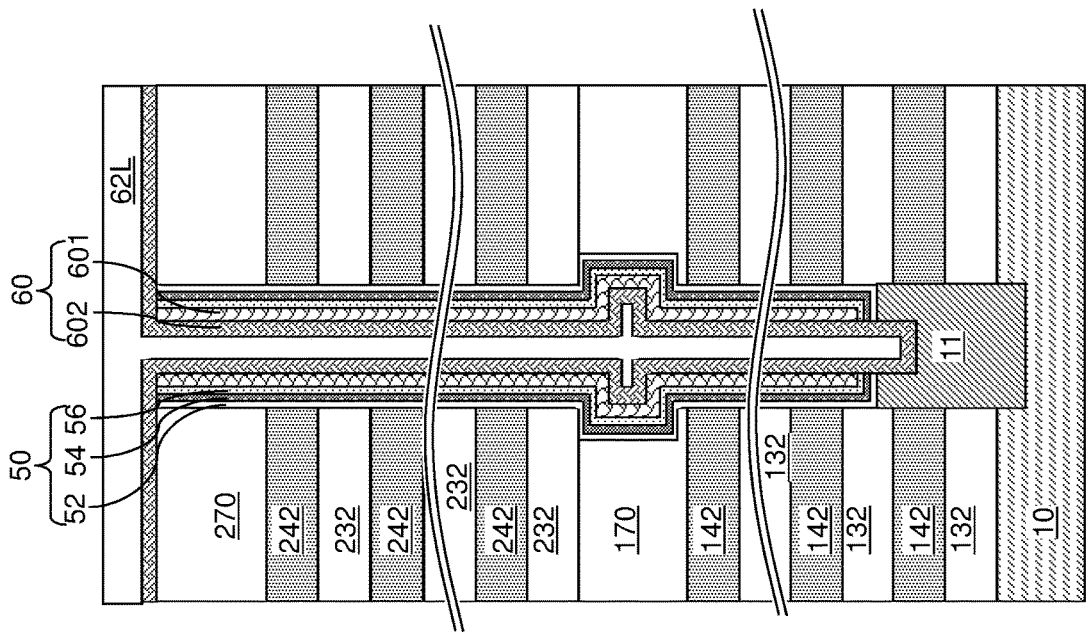
Figure 15E:
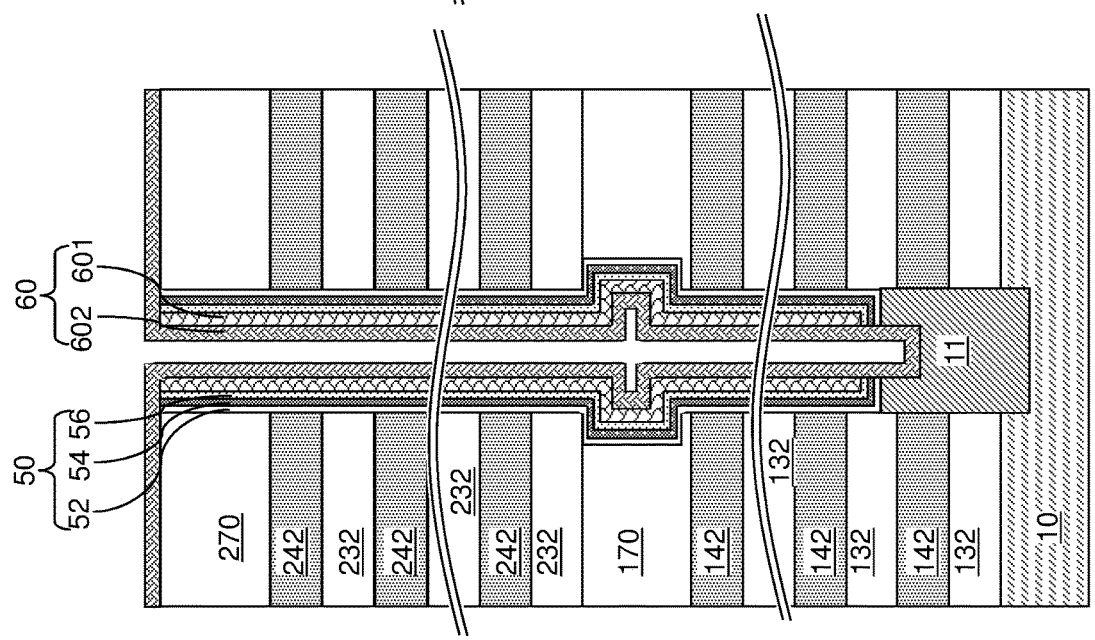

Referring to FIG. 15E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 15F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 15H:
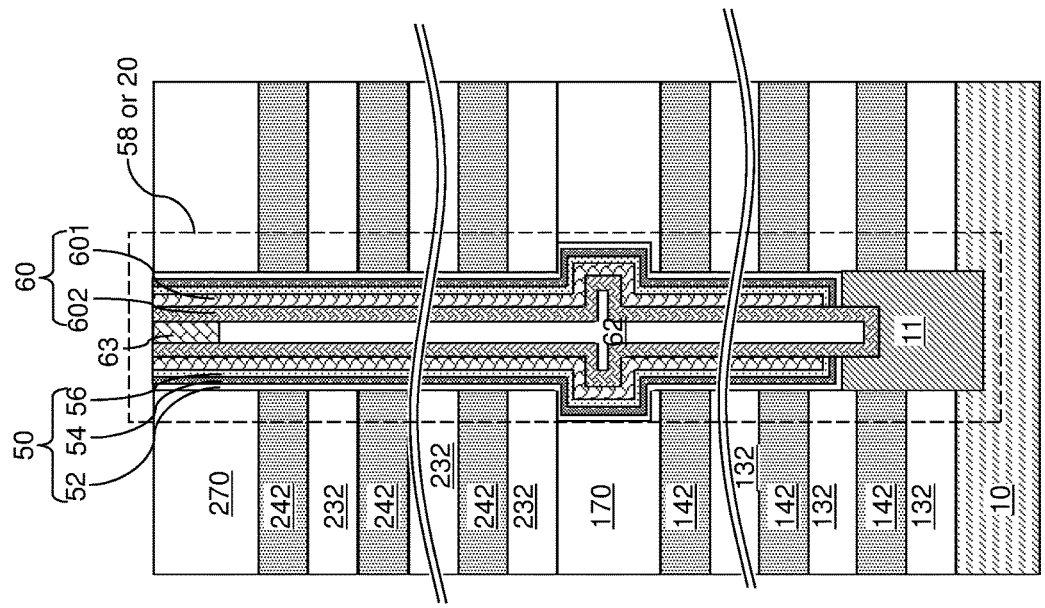
Figure 15G:
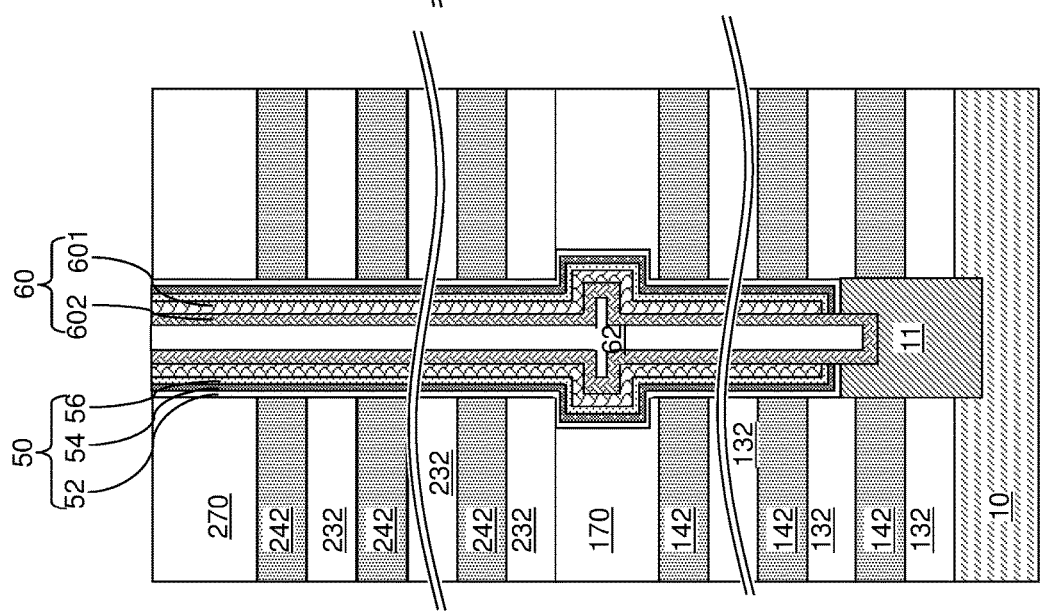

Referring to FIG. 15G, the horizontal portion of the dielectric core layer 62L can be removed, for example, by a recess etch from above the top surface of the second insulating cap layer 270. Each remaining portion of the dielectric core layer 62L constitutes a dielectric core 62. Further, the horizontal portion of the second semiconductor channel layer 602 located above the top surface of the second insulating cap layer 270 can be removed by a planarization process, which can employ a recess etch or chemical mechanical planarization (CMP). Each remaining portion of the second semiconductor channel layer 602 can be located entirety within a memory opening 49 or entirely within a support opening (119, 219).

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 15H, the top surface of each dielectric core 62 can be further recessed within each memory opening, for example, by a recess etch to a depth that is located between the top surface of the second insulating cap layer 270 and the bottom surface of the second insulating cap layer 270. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 constitutes a memory opening fill structure 58. Each combination of a pedestal channel portion 11 (if present), a memory film 50, a vertical semiconductor channel 60, a dielectric core 62, and a drain region 63 within each support opening (119, 219) fills the respective support openings (119, 219), and constitutes a support pillar structure 20.

The first tier structure (132, 142, 170, 165), the second tier structure (232, 242, 270, 265), the inter-tier dielectric layer 180, the memory opening fill structures 58, and the support pillar structures 20 collectively constitute a memory-level assembly. The memory-level assembly is formed over the planar semiconductor material layer 10 such that the planar semiconductor material layer 10 includes horizontal semiconductor channels electrically connected to vertical semiconductor channels 60 within the memory stack structures 55.

Figure 16A:
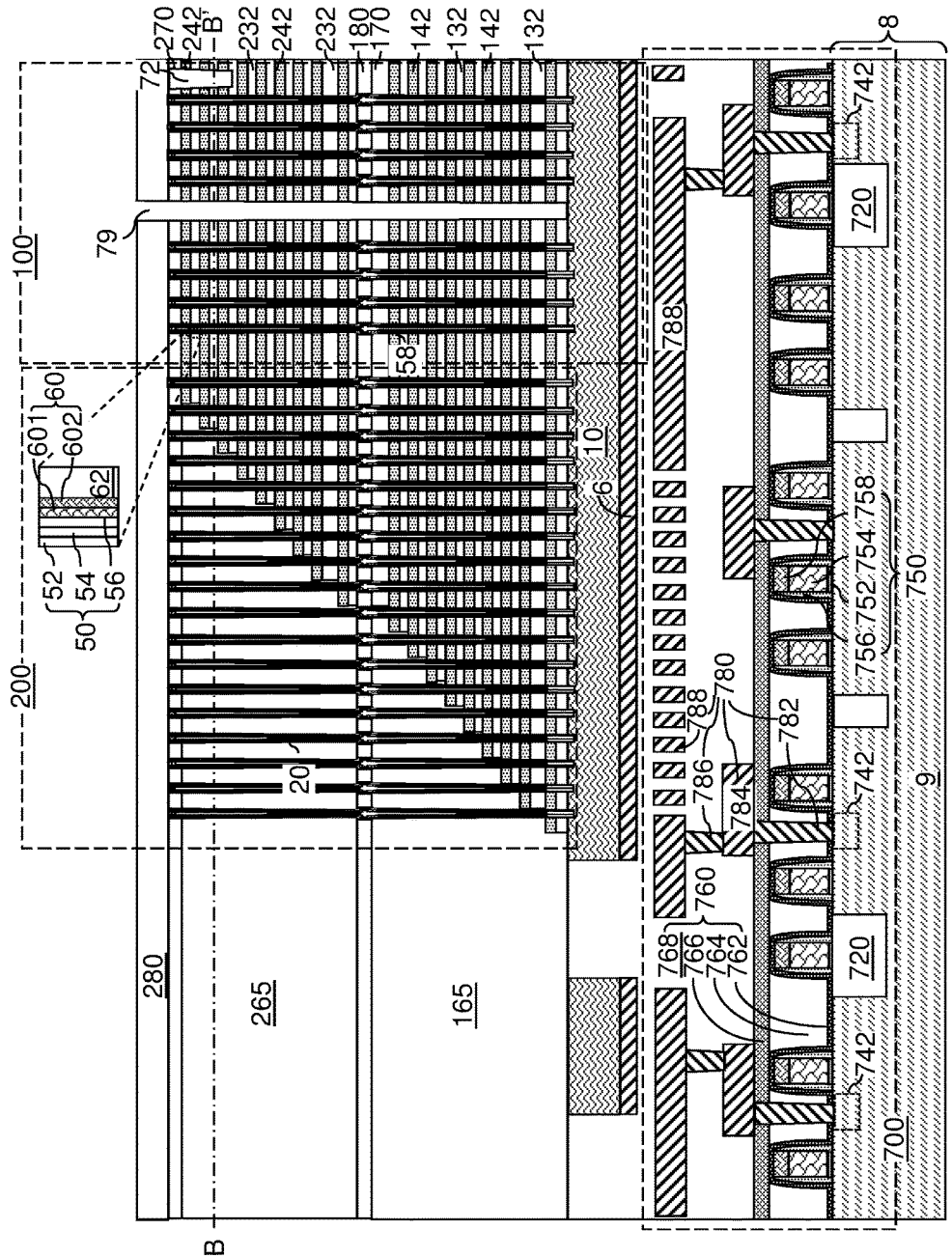
FIG. 16A is a vertical cross-sectional view of the exemplary structure after formation of a contact level dielectric layer backside contact trenches according to an embodiment of the present disclosure.
Figure 16B:
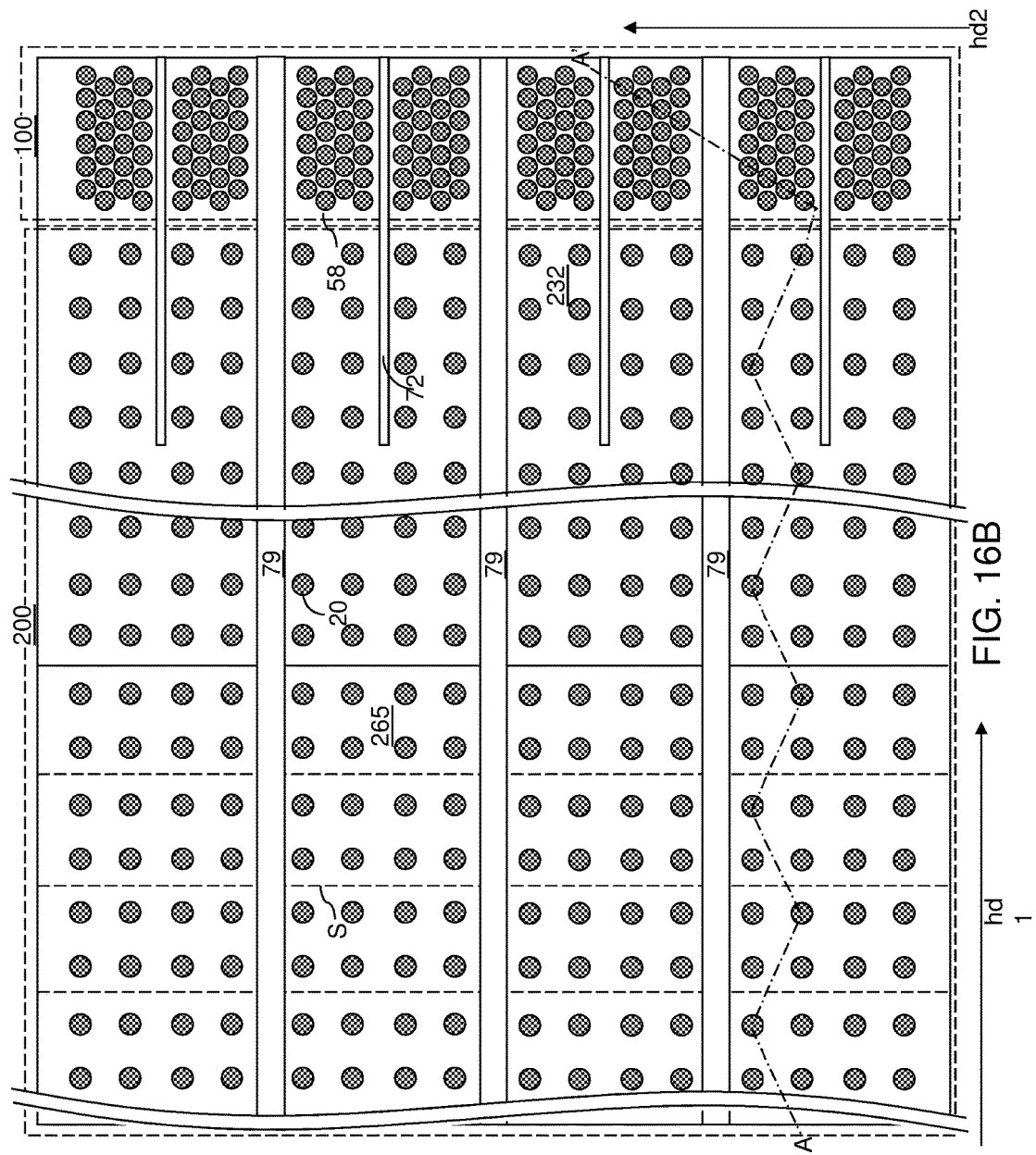
FIG. 16B is a horizontal cross-sectional view of the exemplary structure along the horizontal plane B-B' in FIG. 16A. The zig-zag vertical plane A-A' corresponds to the plane of the vertical cross-sectional view of FIG. 16A.

Referring to FIGS. 16A and 16B, a first contact level dielectric layer 280 can be formed over the memory-level assembly. The first contact level dielectric layer 280 is formed at a contact level through which various contact via structures are subsequently formed to the drain regions 63 and the various electrically conductive layers that replaces the sacrificial material layers (142, 242) in subsequent processing steps.

Backside contact trenches 79 are subsequently formed through the first contact level dielectric layer 280 and the memory-level assembly. For example, a photoresist layer can be applied and lithographically patterned over the first contact level dielectric layer 280 to form elongated openings that extend along a first horizontal direction hd1. An anisotropic etch is performed to transfer the pattern in the patterned photoresist layer through the first contact level dielectric layer 280 and the memory-level assembly to a top surface of the planar semiconductor material layer 10. The photoresist layer can be subsequently removed, for example, by ashing.

The backside contact trenches 79 extend along the first horizontal direction hd1, and thus, are elongated along the first horizontal direction hd1. The backside contact trenches 79 can be laterally spaced among one another along a second horizontal direction hd2, which can be perpendicular to the first horizontal direction hd1. The backside contact trenches 79 can extend through the memory array region 100 and the word line contact via region 200. The first subset of the backside contact trenches 79 laterally divides the memory-level assembly.

Figure 17:
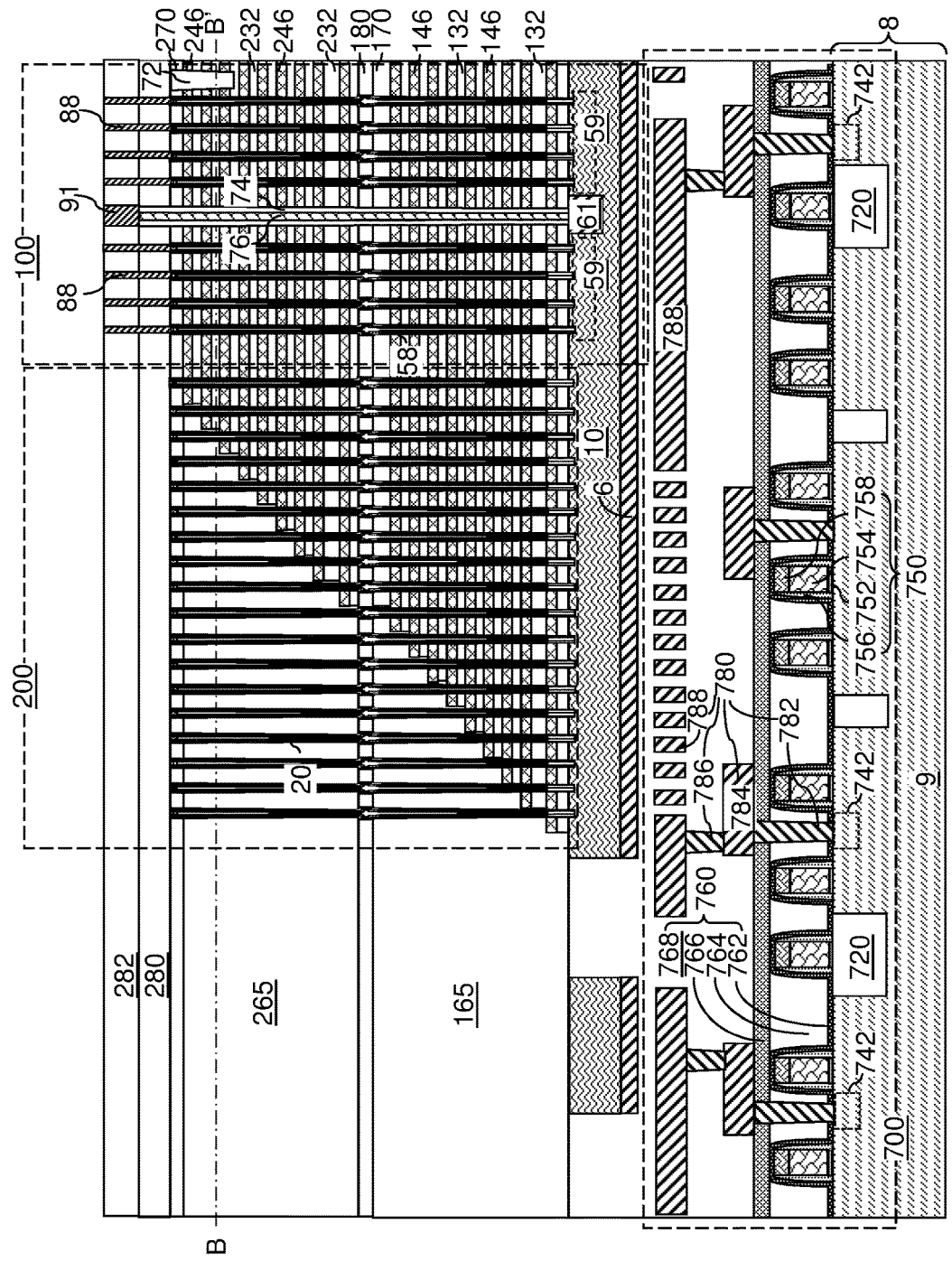
FIG. 17 is a vertical cross-sectional view of the exemplary structure after replacement of sacrificial material layers with electrically conductive layers and formation of insulating spacers, backside contact via structures, drain contact via structures, and source bias line structures according to an embodiment of the present disclosure.

Referring to FIG. 17, an etchant that selectively etches the materials of the first and second sacrificial material layers (142, 242) with respect to the materials of the first and second insulating layers (132, 232), the first and second insulating cap layers (170, 270), and the material of the outermost layer of the memory films 50 can be introduced into the backside contact trenches 79, for example, employing an isotropic etch process. First backside recesses are formed in volumes from which the first sacrificial material layers 142 are removed. Second backside recesses are formed in volumes from which the second sacrificial material rial layers 242 are removed. In one embodiment, the first and second sacrificial material layers (142, 242) can include silicon nitride, and the materials of the first and second insulating layers (132, 232), can be silicon oxide. In another embodiment, the first and second sacrificial material layers (142, 242) can include a semiconductor material such as germanium or a silicon-germanium alloy, and the materials of the first and second insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the backside contact trench 79. For example, if the first and second sacrificial material layers (142, 242) include silicon nitride, the etch process can be a wet etch process in which the exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second backside recesses can be a laterally extending cavity having a lateral dimension that is greater than the vertical extent of the cavity. In other words, the lateral dimension of each of the first and second backside recesses can be greater than the height of the respective backside recess. A plurality of first backside recesses can be formed in the volumes from which the material of the first sacrificial material layers 142 is removed. A plurality of second backside recesses can be formed in the volumes from which the material of the second sacrificial material layers 242 is removed. Each of the first and second backside recesses can extend substantially parallel to the top surface of the substrate 9. A backside recess can be vertically bounded by a top surface of an underlying insulating layer (132 or 232) and a bottom surface of an overlying insulating layer (132 or 232). In one embodiment, each of the first and second backside recesses can have a uniform height throughout.

In one embodiment, a sidewall surface of each pedestal channel portion 11 can be physically exposed at each bottommost first backside recess after removal of the first and second sacrificial material layers (142, 242). Further, a top surface of the planar semiconductor material layer 10 can be physically exposed at the bottom of each backside contact trench 79. An annular dielectric spacer (not shown) can be formed around each pedestal channel portion 11 by oxidation of a physically exposed peripheral portion of the pedestal channel portions 11. Further, a semiconductor oxide portion (not shown) can be formed from each physically exposed surface portion of the planar semiconductor material layer 10 concurrently with formation of the annular dielectric spacers.

A backside blocking dielectric layer (not shown) can be optionally deposited in the backside recesses and the backside contact trenches 79 and over the first contact level dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses, on the sidewalls of the backside contact trench 79, and over the first contact level dielectric layer 280. The at least one conductive material can include at least one metallic material, i.e., an electrically conductive material that includes at least one metallic element.

A plurality of first electrically conductive layers 146 can be formed in the plurality of first backside recesses, a plurality of second electrically conductive layers 246 can be formed in the plurality of second backside recesses, and a continuous metallic material layer (not shown) can be formed on the sidewalls of each backside contact trench 79 and over the first contact level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside contact trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside contact trenches 79. Specifically, the deposited metallic material of the continuous metallic material layer can be etched back from the sidewalls of each backside contact trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level shallow trench isolation structures 72 constitutes drain select gate electrodes. A subset of the first electrically conductive layers 146 located at each level of the annular dielectric spacers (not shown) constitutes source select gate electrodes. A subset of the electrically conductive layer (146, 246) located between the drain select gate electrodes and the source select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Dopants of a second conductivity type, which is the opposite of the first conductivity type of the planar semiconductor material layer 10, can be implanted into a surface portion of the substrate semiconductor layer 10 to form a source region 61 underneath the bottom surface of each backside contact trench 79. An insulating spacer 74 including a dielectric material can be formed at the periphery of each backside contact trench 79, for example, by deposition of a conformal insulating material (such as silicon oxide) and a subsequent anisotropic etch. The first contact level dielectric layer 280 may be thinned due to a collateral etch during the anisotropic etch that removes the vertical portions of horizontal portions of the deposited conformal insulating material.

A conformal insulating material layer can be deposited in the backside contact trenches 79, and can be anisotropically etched to form insulating spacers 74. The insulating spacers 74 include an insulating material such as silicon oxide, silicon nitride, and/or a dielectric metal oxide. A cavity laterally extending along the first horizontal direction hd1 is present within each insulating spacer 74.

A backside contact via structure can be formed in the remaining volume of each backside contact trench 79, for example, by deposition of at least one conductive material and removal of excess portions of the deposited at least one conductive material from above a horizontal plane including the top surface of the first contact level dielectric layer 280 by a planarization process such as chemical mechanical planarization or a recess etch. The backside contact via structures are electrically insulated in all lateral directions, and is laterally elongated along the first horizontal direction hd1. As such, the backside contact via structures are herein referred to as laterally-elongated contact via structures 76. As used herein, a structure is "laterally elongated" if the maximum lateral dimension of the structure along a first horizontal direction is greater than the maximum lateral dimension of the structure along a second horizontal direction that is perpendicular to the first horizontal direction at least by a factor of 5.

Optionally, each laterally-elongated contact via structure 76 may include multiple backside contact via portions such as a lower backside contact via portion and an upper backside contact via portion. In an illustrative example, the lower backside contact via portion can include a doped semiconductor material (such as doped polysilicon), and can be formed by depositing the doped semiconductor material layer to fill the backside contact trenches 79 and removing the deposited doped semiconductor material from upper portions of the backside contact trenches 79. The upper backside contact via portion can include at least one metallic material (such as a combination of a TiN liner and a W fill material), and can be formed by depositing the at least one metallic material above the lower backside contact via portions, and removing an excess portion of the at least one metallic material from above the horizontal plane including the top surface of the first contact level dielectric layer 280. The first contact level dielectric layer 280 can be thinned and removed during a latter part of the planarization process, which may employ chemical mechanical planarization (CMP), a recess etch, or a combination thereof. Each laterally-elongated contact via structure 76 can be formed through the memory-level assembly and on a respective source region 61. The top surface of each laterally-elongated contact via structure 76 can located above a horizontal plane including the top surfaces of the memory stack structures 55.

A second contact level dielectric layer 282 can be optionally formed over the first contact level dielectric layer 280. The second contact level dielectric layer 282 includes a dielectric material such as silicon oxide or silicon nitride. The thickness of the second contact level dielectric layer 282 can be in a range from 30 nm to 300 nm, although lesser and greater thicknesses can also be employed.

Drain contact via structures 88 contacting the drain regions 63 can extend through the contact level dielectric layers (280, 282) and the second insulating cap layer 270 in the device region 100. A source connection via structure 91 can extend through the contact level dielectric layers (280, 282) to provide electrical connection to the laterally-elongated contact via structures 76.

Figure 18A:
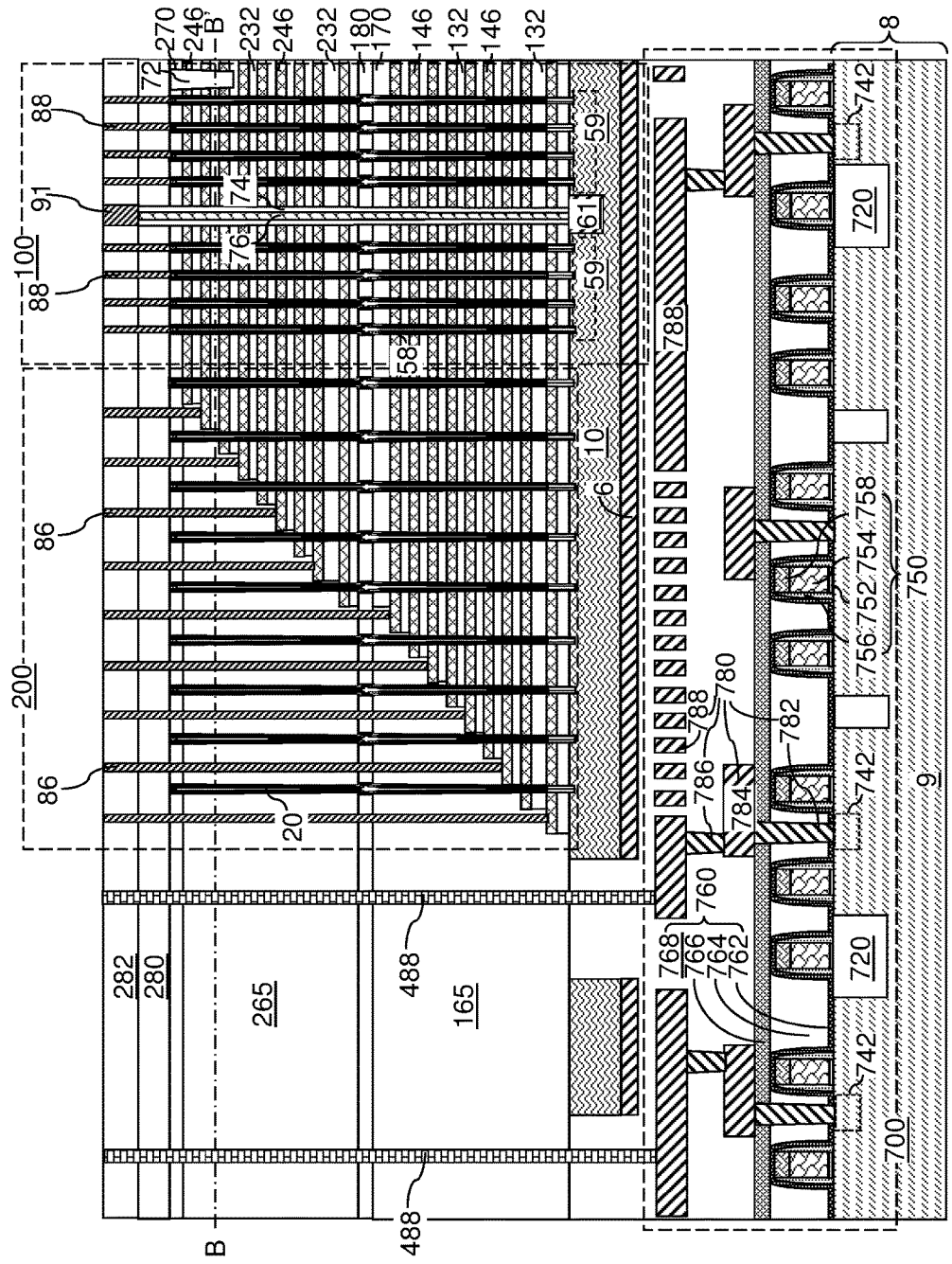
FIG. 18A is a vertical cross-sectional view of the exemplary structure after formation of through-memory-level via structures and word line contact via structures according to an embodiment of the present disclosure.
Figure 18B:
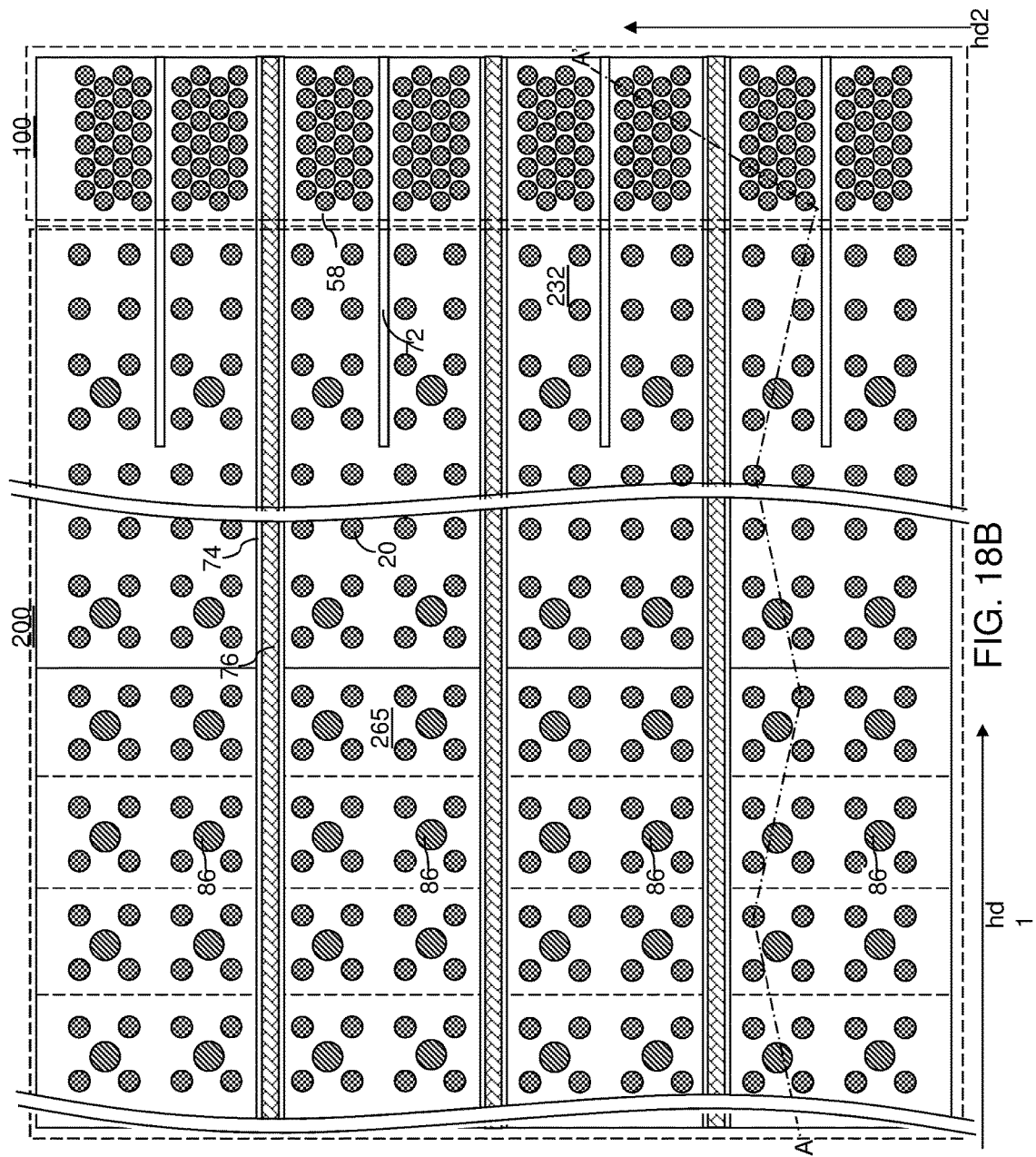
FIG. 18B is a horizontal cross-sectional view of the exemplary structure along the horizontal plane B-B' in FIG. 18A. The zig-zag vertical plane A-A' corresponds to the plane of the vertical cross-sectional view of FIG. 18A.

Referring to FIGS. 18A and 18B, various contact via structures can be formed through the contact level dielectric layers (280, 282) and the retro-stepped dielectric material portions (165, 265). For example, word line contact via structures 86 can be formed in the word line contact region 200. A subset of the word line contact via structures 86 contacting the second electrically conductive layers 246 extends through the second-tier retro-stepped dielectric material portion 265 in the word line contact region 200, and does not extend through the first-tier retro-stepped dielectric material portion 165. Another subset of the word line contact via structures 86 contacting the first electrically conductive layers 146 extends through the second-tier retro-stepped dielectric material portion 265 and through the first-tier retro-stepped dielectric material portion 165 in the word line contact region 200.

Further, through-memory-level via cavities can be formed through the memory-level assembly outside the areas of the memory array region 100 and the word line contact region 200. In this case, the through-memory-level via cavities can be formed through the contact level dielectric layers (280, 282) and the retro-stepped dielectric material portions (165, 265), and into the at least one lower level dielectric layer 760. A top surface of a respective one of the lower level interconnect structures 780 can be physically exposed at the bottom of each through-memory-level via cavities. The through-memory-level openings can be formed, for example, by applying a photoresist layer (not shown) over the first contact level dielectric layer 280, lithographically patterning the photoresist layer to form openings, and transferring the pattern in the photoresist layer through the contact level dielectric layers (280, 282) and the retro-stepped dielectric material portions (165, 265), and into the at least one lower level dielectric layer 760 by an anisotropic etch. The photoresist layer can be removed, for example, by ashing. At least one conductive material can be deposited in the through-memory-level via cavities to form through-memory-level via structures 488. The through-memory-level via structures 488 can provide vertical electrical connection through the memory level structures.

Figure 19:
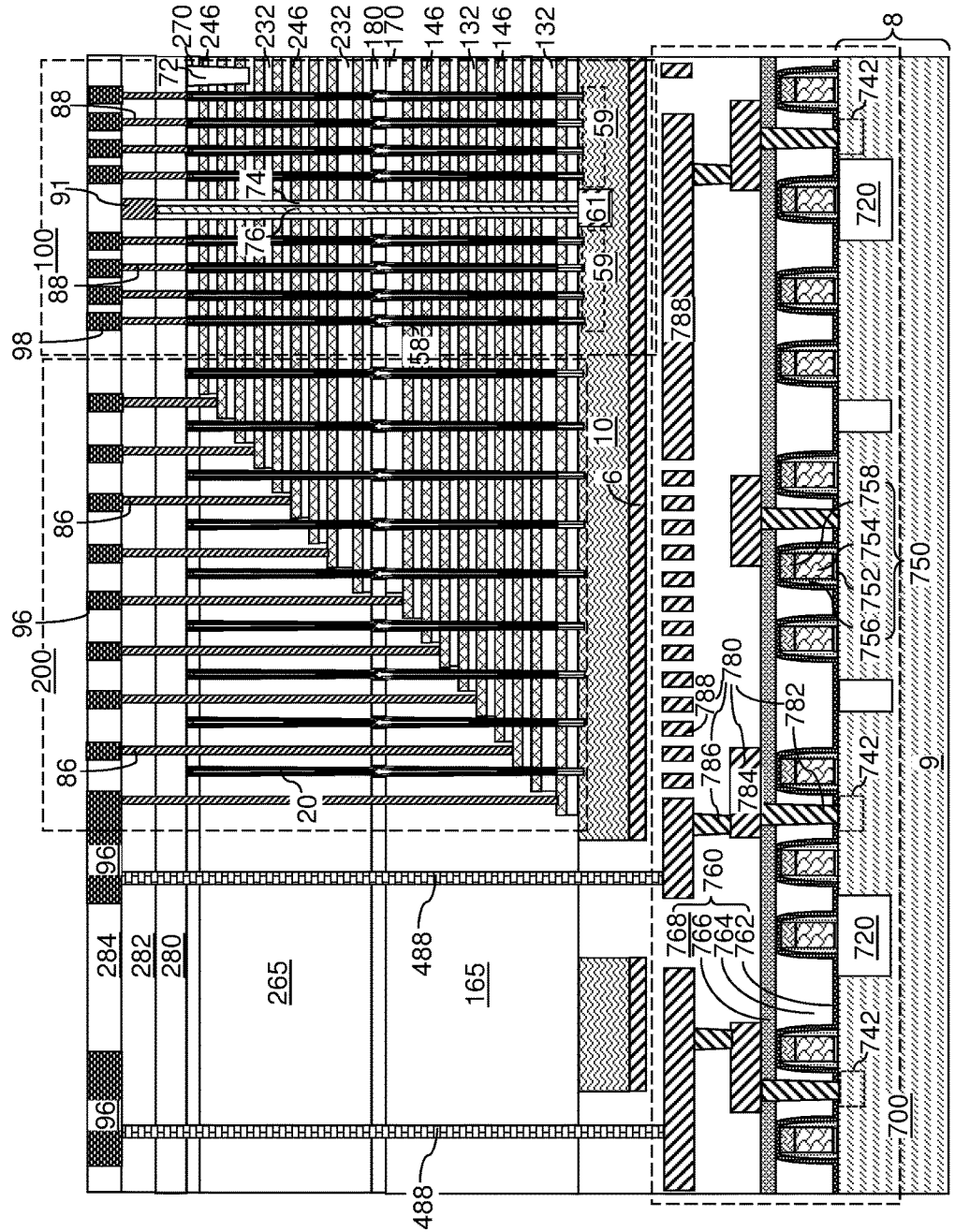
FIG. 19 is a vertical cross-sectional view of the exemplary structure after formation of upper level line structures according to an embodiment of the present disclosure.

Referring to FIG. 19, a line level dielectric layer 284 can be formed over the contact level dielectric layers (280, 282). Various line level metal interconnect structures (96, 98) can be formed in the line level dielectric layer 284. The line level metal interconnect structures (96, 98) can include upper level metal interconnect structures 96 that are electrically coupled to (e.g., formed on or in physical contact with) respective pairs of a word line contact via structure 86 and a through-memory-level via structure 488, and bit lines 98 that extend along the second horizontal direction hd2 and perpendicular to the first horizontal direction hd1. Additional line level metal interconnect structures that are not expressly illustrated can include source connection line structures that contact the source connection via structures 91 to provide electrically conductive paths for biasing the source regions 61 through the laterally-elongated contact via structures 76, and drain side select gate electrode contact via structures are located in the word line contact regions 200. The through-memory-level via structures 488 can be conductive structures that provide electrically conductive paths between the device contact via structure 782 and metal lines (such as the upper level metal interconnect structures 96) that are located above a horizontal plane including a top surface of the three-dimensional memory array.

The exemplary structure of the present disclosure includes a semiconductor structure. The semiconductor structure can include a semiconductor device 710 located over a substrate 8, such as on a top surface of a substrate semiconductor layer 9 in a substrate 8; a dielectric layer stack 760 of at least one first dielectric material layer (768B or 7681), a silicon nitride layer 768N, and at least one second dielectric material layer (768C, 7683, 7687, 7689) overlying the semiconductor device; and interconnect structures 780 comprising metallic lines 784 and metallic vias 786 and embedded within the dielectric layer stack 760, wherein the interconnect structures 780 comprise a metal silicide portion (784S, 784L, 786S) that directly contacts the silicon nitride layer 768N, and a combination of the silicon nitride layer 768N and the metal silicide portion (784S, 784L, 786S) provides a continuous hydrogen barrier structure that is vertically spaced from the top surface of the semiconductor device 710.

In one embodiment, each opening within the silicon nitride layer 768N includes a closed periphery such that an entirety of the closed periphery directly contacts a respective metal silicide portion (784S, 784L, 786S) that does not include any opening therethrough. In one embodiment, the metal silicide portion (784S, 784L, 786S) directly contacts an underlying metal interconnect structure (786B, 784B, 784A) embedded within the at least one first dielectric material layer (768B or 7681), and an overlying metal interconnect structure (786C, 784I, 784J, 784B) embedded within the at least one second dielectric material layer (768C, 7683, 7687, 7689).

In some embodiments, the silicon nitride layer 768N contacts a top surface of the metal silicide portion (784S, 784L, 786S) as illustrated in FIGS. 2D, 4D, 5D, 5E, 6D, and 6E. In some embodiments, the metal silicide portion 784S is a line structure that contacts a top surface of an underlying via structure 786B and a bottom surface of overlying via structure 786C. In some embodiment, the metal silicide portion 784S is an upper portion of a line structure (784S, 784B) that includes a metal line portion 784B that underlies the metal silicide portion 784S, and the metal silicide portion 784S contacts an overlying via structure 786C. In some embodiments, the metal silicide portion 784L is a metal silicide liner underlying a metal portion (784I, 784J), wherein the metal portion (784I, 784J) contacts an overlying via structure 786C.

In some embodiments, the silicon nitride layer 768N contacts sidewalls of the metal silicide portion (784S, 784L, 786S) as illustrated in FIGS. 3C, 4E, 5E, 5F, 6F, 6G, 7C, and 7D. The sidewalls include a continuous closed periphery. In some embodiments, the metal silicide portion 784S is a line structure that contacts a top surface of an underlying via structure 786B and a top surface of an overlying via structure 786C. In some embodiment, the metal silicide portion 784S is an upper portion of a line structure (784S, 784B) that includes a metal line portion 784B that underlies the metal silicide portion 784S, and the metal silicide portion 784S contacts an overlying via structure 786C. In some embodiments, the metal silicide portion 786S is a via structure that contacts an underlying line structure 784A and an overlying line structure 784B. In some embodiments, the metal silicide portion 784L is a metal silicide liner underlying a metal portion (784I, 784J), wherein the metal portion (784I, 784J) contacts an overlying via structure 786C.

In one embodiment, the metal silicide portion (784S, 784L, 786S) comprises tungsten silicide, and the semiconductor device 710 comprises a field effect transistor, such as driver circuit transistor of a three-dimensional memory structure.

The exemplary three-dimensional memory structure can include memory stack structures 55 which comprise memory elements of a vertical NAND device. The electrically conductive layers (146, 246) can comprise, or can be electrically connected to, a respective word line of the vertical NAND device. The substrate 8 can comprises a silicon substrate. The vertical NAND device can comprise an array of monolithic three-dimensional NAND strings over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising the word line driver circuit and a bit line driver circuit for the memory device. The array of monolithic three-dimensional NAND strings can comprise a plurality of semiconductor channels, wherein at least one end portion (such as a vertical semiconductor channel 60) of each of the plurality of semiconductor channels (59, 11, 60) extends substantially perpendicular to a top surface of the semiconductor substrate 8, a plurality of charge storage elements (as embodied as portions of the memory material layer 54 located at each word line level), each charge storage element located adjacent to a respective one of the plurality of semiconductor channels (59, 11, 60), and a plurality of control gate electrodes (as embodied as a subset of the electrically conductive layers (146, 246) having a strip shape extending substantially parallel to the top surface of the substrate 8 (e.g., along the first horizontal direction hd1), the plurality of control gate electrodes comprise at least a first control gate electrode located in the first device level and a second control gate electrode located in the second device level.

Various electrical dopants in the source region 61 and the drain regions 63 are activated by an activation anneal, which is typically conducted at a temperature greater than 950 degrees Celsius. Hydrogen diffusion from the various materials at the level of the three-dimensional memory device (such as from the alternating stack (132, 142) and/or from a TEOS oxide in the retro-stepped dielectric material portions (165, 265)) to the semiconductor devices 710 may adversely impact the performance of the semiconductor devices. The various hydrogen barrier structures including the silicon nitride layer 768N and metal silicide portions (784S, 784L, 786S) located at each opening in the silicon nitride layer 768N block diffusion of hydrogen to reduce or prevent degradation of performance of the various semiconductor devices during high temperature anneal processes.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
a semiconductor device located over a substrate;
a dielectric layer stack of at least one first dielectric material layer, a silicon nitride layer, and at least one second dielectric material layer overlying the semiconductor device;
interconnect structures comprising metallic lines and metallic vias and embedded within the dielectric layer stack, wherein the interconnect structures comprise a metal silicide portion that directly contacts the silicon nitride layer, and a combination of the silicon nitride layer and the metal silicide portion provides a continuous hydrogen barrier structure that is vertically spaced from the top surface of the semiconductor device; and
a three-dimensional memory device overlying the dielectric layer stack,
wherein:
the semiconductor device comprises a driver circuit transistor for the three-dimensional memory device;
the three-dimensional memory device comprises:
an alternating stack of insulating layers and electrically conductive word lines; and
memory stack structures comprising a vertical channel and a memory film vertically extending through the alternating stack;
the silicon nitride layer contacts a top surface of the metal silicide portion; and
the metal silicide portion is a line structure that contacts a top surface of an underlying via structure and a bottom surface of an overlying via structure.

2. A semiconductor structure, comprising:
a semiconductor device located over a substrate;
a dielectric layer stack of at least one first dielectric material layer, a silicon nitride layer, and at least one second dielectric material layer overlying the semiconductor device;
interconnect structures comprising metallic lines and metallic vias and embedded within the dielectric layer stack, wherein the interconnect structures comprise a metal silicide portion that directly contacts the silicon nitride layer, and a combination of the silicon nitride layer and the metal silicide portion provides a continuous hydrogen barrier structure that is vertically spaced from the top surface of the semiconductor device; and
a three-dimensional memory device overlying the dielectric layer stack,
wherein:
the semiconductor device comprises a driver circuit transistor for the three-dimensional memory device;
the three-dimensional memory device comprises:
an alternating stack of insulating layers and electrically conductive word lines; and
memory stack structures comprising a vertical channel and a memory film vertically extending through the alternating stack;
the silicon nitride layer contacts sidewalls of the metal silicide portion, wherein the sidewalls include a continuous closed periphery; and
the metal silicide portion is an upper portion of a line structure that includes a metal line portion that underlies the metal silicide portion, and the metal silicide portion contacts an overlying via structure.

* * * * *